US010769546B1

(12) United States Patent
Rigetti et al.

(10) Patent No.: US 10,769,546 B1
(45) Date of Patent: Sep. 8, 2020

(54) MICROWAVE INTEGRATED QUANTUM CIRCUITS WITH CAP WAFER AND METHODS FOR MAKING THE SAME

(71) Applicant: Rigetti & Co, Inc., Berkeley, CA (US)

(72) Inventors: Chad Tyler Rigetti, Emeryville, CA (US); Dane Christoffer Thompson, Granite Bay, CA (US); Alexei N. Marchenkov, Walnut Creek, CA (US); Mehrnoosh Vahidpour, El Cerrito, CA (US); Eyob A. Sete, Walnut Creek, CA (US); Jean-Luc Francois-Xavier Orgiazzi, Emeryville, CA (US)

(73) Assignee: Rigetti & Co, Inc., Berkeley, CA (US)

( * ) Notice: Subject to any disclaimer, the term of this patent is extended or adjusted under 35 U.S.C. 154(b) by 0 days.

(21) Appl. No.: 16/113,382

(22) Filed: Aug. 27, 2018

Related U.S. Application Data

(63) Continuation of application No. 15/140,273, filed on Apr. 27, 2016, now Pat. No. 10,068,181.

(Continued)

(51) Int. Cl.
*H01L 39/22* (2006.01)
*H01L 27/18* (2006.01)
(Continued)

(52) U.S. Cl.
CPC ....... *G06N 10/00* (2019.01); *H01L 21/76877* (2013.01); *H01L 21/76891* (2013.01);
(Continued)

(58) Field of Classification Search
CPC ....... G06F 19/00; G06N 10/00; H01P 11/008; H02H 9/023; H03K 19/1952;
(Continued)

(56) References Cited

U.S. PATENT DOCUMENTS 3,343,256 A 9/1967 Smith et al.
3,863,181 A 1/1975 Glance et al.
(Continued)

FOREIGN PATENT DOCUMENTS

WO 2014092819 6/2014
WO 2014163728 10/2014
(Continued)

OTHER PUBLICATIONS

USPTO, Non-Final Office Action dated Jul. 3, 2019, in U.S. Appl. No. 15/969,263, 29 pgs.
(Continued)

*Primary Examiner* — Sophia T Nguyen
(74) *Attorney, Agent, or Firm* — Henry Patent Law Firm PLLC

(57) ABSTRACT

A quantum computing system that includes a quantum circuit device having at least one operating frequency; a first substrate having a first surface on which the quantum circuit device is disposed; a second substrate having a first surface that defines a recess of the second substrate, the first and second substrates being arranged such that the recess of the second substrate forms an enclosure that houses the quantum circuit device; and an electrically conducting layer that covers at least a portion of the recess of the second substrate.

38 Claims, 39 Drawing Sheets

Related U.S. Application Data

(60) Provisional application No. 62/153,057, filed on Apr. 27, 2015, provisional application No. 62/277,362, filed on Jan. 11, 2016.

(51) Int. Cl.
*H01L 39/04* (2006.01)
*G06N 10/00* (2019.01)
*H01L 21/768* (2006.01)
*B82Y 10/00* (2011.01)

(52) U.S. Cl.
CPC ........ *H01L 21/76898* (2013.01); *H01L 27/18* (2013.01); *H01L 39/045* (2013.01); *H01L 39/223* (2013.01); *B82Y 10/00* (2013.01); *H01L 2225/06541* (2013.01); *H01L 2225/1041* (2013.01); *Y10S 977/933* (2013.01)

(58) Field of Classification Search
CPC ........ H03K 19/195; H03K 17/92; H03K 3/38; H03F 19/00; H01L 25/117; H01L 25/50; H01L 25/162; H01L 25/074; H01L 25/071; H01L 39/04; H01L 39/045; H01L 39/223; H01L 29/66977; H01L 2224/0226; H01L 2224/02255; H01L 2224/02235; H01L 2225/1058; H01L 2225/1088; H01L 27/18; H01L 39/02; H01L 39/24; H01L 39/2406

See application file for complete search history.

(56) References Cited

U.S. PATENT DOCUMENTS

| | | | |
|---|---|---|---|
| 4,660,061 A * | 4/1987 | Sweeny | H01L 39/04 257/32 |
| 5,013,526 A * | 5/1991 | Kobayashi | H01L 23/53285 204/192.24 |
| 5,075,655 A * | 12/1991 | Pond | H01P 3/081 333/238 |
| 5,401,530 A * | 3/1995 | Tamura | H01L 39/025 257/34 |
| 5,430,614 A | 7/1995 | Difrancesco | |
| 5,502,289 A | 3/1996 | Takiar et al. | |
| 5,611,008 A | 3/1997 | Yap | |
| 5,700,715 A | 12/1997 | Pasch | |
| 5,796,714 A | 8/1998 | Chino et al. | |
| 5,814,889 A | 9/1998 | Gaul | |
| 5,919,606 A * | 7/1999 | Kazlas | G02F 1/13394 349/153 |
| 5,926,029 A | 7/1999 | Ference et al. | |
| 5,929,728 A | 7/1999 | Barnett et al. | |
| 5,944,537 A | 8/1999 | Smith et al. | |
| 5,990,768 A | 11/1999 | Takahashi | |
| 6,130,483 A | 10/2000 | Shizuki et al. | |
| 6,139,905 A | 10/2000 | Chen et al. | |
| 6,235,554 B1 * | 5/2001 | Akram | H01L 23/13 257/E23.004 |
| 6,324,755 B1 | 12/2001 | Borkowski et al. | |
| 6,434,312 B1 | 8/2002 | Knighten | |
| 6,441,315 B1 | 8/2002 | Eldridge et al. | |
| 6,477,034 B1 | 11/2002 | Chakravorty et al. | |
| 6,532,143 B2 | 3/2003 | Figueroa et al. | |
| 6,545,226 B2 | 4/2003 | Brodsky et al. | |
| 6,559,484 B1 | 5/2003 | Li et al. | |
| 6,559,530 B2 | 5/2003 | Hinzel et al. | |
| 6,581,387 B1 * | 6/2003 | Ullom | F25B 21/00 136/203 |
| 6,611,419 B1 | 8/2003 | Chakravorty | |
| 6,614,106 B2 | 9/2003 | Matsuo et al. | |
| 6,630,725 B1 | 10/2003 | Kuo et al. | |
| 6,636,416 B2 | 10/2003 | Li et al. | |
| 6,683,369 B2 * | 1/2004 | Iwamoto | H01L 21/563 257/676 |
| 6,710,334 B1 * | 3/2004 | Twerenbold | H01J 49/025 250/286 |
| 6,775,150 B1 | 8/2004 | Chakravorty et al. | |
| 6,788,171 B2 | 9/2004 | Ammar et al. | |
| 6,806,557 B2 * | 10/2004 | Ding | B81B 7/0038 257/659 |
| 6,852,926 B2 * | 2/2005 | Ma | B81B 7/0006 174/539 |
| 6,970,362 B1 | 11/2005 | Chakravorty | |
| 6,979,836 B2 | 12/2005 | Zagoskin et al. | |
| 7,218,184 B2 | 5/2007 | Yamanaka et al. | |
| 7,298,234 B2 | 11/2007 | Dutta | |
| 7,327,554 B2 | 2/2008 | Otsuka et al. | |
| 7,409,762 B2 | 8/2008 | Kirby | |
| 7,411,304 B2 | 8/2008 | Kirby et al. | |
| 7,427,803 B2 | 9/2008 | Chao et al. | |
| 7,456,497 B2 | 11/2008 | Higashi | |
| 7,554,193 B2 | 6/2009 | Osone et al. | |
| 7,589,390 B2 | 9/2009 | Yao | |
| 7,592,697 B2 | 9/2009 | Arana et al. | |
| 7,624,088 B2 | 11/2009 | Johnson et al. | |
| 7,767,483 B1 * | 8/2010 | Waters | G01P 15/0802 257/E29.234 |
| 7,802,715 B2 | 9/2010 | Silverbrook et al. | |
| 7,889,509 B2 | 2/2011 | Urashima et al. | |
| 7,923,290 B2 | 4/2011 | Ko et al. | |
| 7,928,375 B1 | 4/2011 | Mangan et al. | |
| 7,932,515 B2 | 4/2011 | Bunyk | |
| 8,003,410 B2 | 8/2011 | Kerner et al. | |
| 8,030,208 B2 | 10/2011 | Leung et al. | |
| 8,062,968 B1 | 11/2011 | Conn | |
| 8,089,299 B1 | 1/2012 | Rahman et al. | |
| 8,125,058 B2 | 2/2012 | Mueller et al. | |
| 8,159,825 B1 | 4/2012 | Dotsenko | |
| 8,169,059 B2 | 5/2012 | Barth et al. | |
| 8,395,902 B2 | 3/2013 | Knickerbocker | |
| 8,479,386 B2 | 7/2013 | Shioga et al. | |
| 8,487,444 B2 | 7/2013 | Law et al. | |
| 8,492,911 B2 | 7/2013 | Bachman et al. | |
| 8,501,614 B1 * | 8/2013 | Shih | H01L 23/49811 257/737 |
| 8,518,823 B2 | 8/2013 | Huang et al. | |
| 8,519,543 B1 | 8/2013 | Song et al. | |
| 8,642,998 B2 | 2/2014 | Gambetta et al. | |
| 8,717,774 B2 | 5/2014 | Randall et al. | |
| 8,736,068 B2 | 5/2014 | Bartley et al. | |
| 8,796,140 B1 | 8/2014 | Gu et al. | |
| 8,809,116 B2 | 8/2014 | Tabrizi | |
| 8,916,471 B1 | 12/2014 | Yang et al. | |
| 8,928,128 B2 | 1/2015 | Karikalan et al. | |
| 8,937,255 B1 | 1/2015 | Dotsenko | |
| 8,955,215 B2 | 2/2015 | Rathburn | |
| 9,035,457 B2 | 5/2015 | Lin et al. | |
| 9,054,094 B2 | 6/2015 | Anthony et al. | |
| 9,231,181 B2 | 1/2016 | Thom et al. | |
| 9,287,228 B2 | 3/2016 | Kraus et al. | |
| 9,337,137 B1 * | 5/2016 | Mills | H01L 23/552 |
| 9,350,093 B2 | 5/2016 | Rathburn | |
| 9,356,009 B2 | 5/2016 | Chandolu | |
| 9,397,283 B2 | 7/2016 | Abraham et al. | |
| 9,400,127 B2 * | 7/2016 | Gervais | H01L 23/34 |
| 9,422,156 B2 | 8/2016 | Smeys | |
| 9,437,561 B2 | 9/2016 | Black et al. | |
| 9,508,680 B1 | 11/2016 | Ayotte et al. | |
| 9,515,017 B2 | 12/2016 | Qian et al. | |
| 9,520,180 B1 | 12/2016 | Mukhanov et al. | |
| 9,520,547 B2 | 12/2016 | Abraham et al. | |
| 9,588,191 B1 | 3/2017 | Kornev et al. | |
| 9,589,908 B1 * | 3/2017 | Parmon | H01L 23/552 |
| 9,601,459 B2 * | 3/2017 | Dubey | H01L 24/05 |
| 9,642,261 B2 | 5/2017 | Hurwitz et al. | |
| 9,666,559 B2 | 5/2017 | Wang et al. | |
| 9,689,897 B2 | 6/2017 | Rathburn | |
| 9,691,746 B2 | 6/2017 | Vadhvkar et al. | |
| 9,711,262 B2 * | 7/2017 | Sugimoto | H01L 39/14 |
| 9,780,075 B2 | 10/2017 | Das et al. | |
| 9,836,699 B1 | 12/2017 | Rigetti et al. | |
| 9,853,645 B1 | 12/2017 | Mukhanov et al. | |
| 9,858,531 B1 | 1/2018 | Monroe et al. | |

(56) References Cited

U.S. PATENT DOCUMENTS

| | | | |
|---|---|---|---|
| 9,871,543 B2 | 1/2018 | Analui et al. | |
| 9,892,365 B2* | 2/2018 | Rigetti | G06F 13/36 |
| 9,893,155 B2* | 2/2018 | Shah | H01L 29/267 |
| 9,905,535 B2 | 2/2018 | Lee | |
| 9,913,414 B2* | 3/2018 | Sadleir | H05K 9/0077 |
| 9,971,970 B1 | 5/2018 | Rigetti et al. | |
| 10,068,181 B1 | 9/2018 | Rigetti et al. | |
| 10,134,972 B2* | 11/2018 | Oliver | H01L 25/0657 |
| 10,157,842 B1* | 12/2018 | Abraham | H01L 21/76898 |
| 10,248,491 B1 | 4/2019 | Zeng et al. | |
| 10,256,392 B1 | 4/2019 | Brink et al. | |
| 10,305,015 B1 | 5/2019 | Brink et al. | |
| 10,319,896 B2* | 6/2019 | Falcon | H01L 39/223 |
| 10,325,841 B2 | 6/2019 | Nakagawa et al. | |
| 10,381,541 B2* | 8/2019 | Das | H01L 25/50 |
| 10,424,711 B2 | 9/2019 | Schoelkopf et al. | |
| 10,468,740 B2* | 11/2019 | Minev | H01P 7/065 |
| 10,535,809 B1 | 1/2020 | Vodrahalli | |
| 2002/0079459 A1* | 6/2002 | Dorscheid | G01T 1/2018 |
| | | | 250/370.11 |
| 2003/0116417 A1 | 6/2003 | DeReus | |
| 2003/0121028 A1* | 6/2003 | Coury | G06N 10/00 |
| | | | 717/138 |
| 2003/0128155 A1* | 7/2003 | Sasada | H01P 7/10 |
| | | | 342/175 |
| 2003/0229986 A1* | 12/2003 | Su | H01L 24/11 |
| | | | 29/843 |
| 2004/0000666 A1 | 1/2004 | Lidar | |
| 2004/0036171 A1 | 2/2004 | Farnworth et al. | |
| 2004/0113275 A1* | 6/2004 | Karnezos | H01L 21/563 |
| | | | 257/758 |
| 2004/0124538 A1 | 7/2004 | Reif et al. | |
| 2004/0173891 A1 | 9/2004 | Imai et al. | |
| 2004/0222478 A1 | 11/2004 | Zhang et al. | |
| 2004/0223380 A1 | 11/2004 | Hato | |
| 2004/0259325 A1 | 12/2004 | Gan | |
| 2005/0023145 A1 | 2/2005 | Cohen et al. | |
| 2005/0054133 A1 | 3/2005 | Felton et al. | |
| 2005/0057327 A1 | 3/2005 | Kwon et al. | |
| 2005/0195051 A1 | 9/2005 | McKinzie, III | |
| 2006/0043585 A1* | 3/2006 | Sukegawa | H01L 23/48 |
| | | | 257/737 |
| 2006/0081396 A1 | 4/2006 | Hsu | |
| 2006/0092079 A1 | 5/2006 | De Rochemont | |
| 2006/0151775 A1* | 7/2006 | Hollenberg | B82Y 10/00 |
| | | | 257/14 |
| 2006/0170556 A1 | 8/2006 | Fang | |
| 2006/0179940 A1 | 8/2006 | Liu et al. | |
| 2006/0192295 A1* | 8/2006 | Lee | H01L 23/16 |
| | | | 257/778 |
| 2006/0211233 A1 | 9/2006 | Gan et al. | |
| 2006/0255876 A1 | 11/2006 | Kushta et al. | |
| 2006/0258053 A1 | 11/2006 | Lee et al. | |
| 2007/0017693 A1 | 1/2007 | Bois et al. | |
| 2007/0031697 A1* | 2/2007 | Test | B32B 15/20 |
| | | | 428/675 |
| 2007/0152771 A1 | 7/2007 | Shan et al. | |
| 2007/0161266 A1* | 7/2007 | Nishizawa | H01L 24/97 |
| | | | 439/69 |
| 2008/0061808 A1 | 3/2008 | Mok et al. | |
| 2008/0079134 A1* | 4/2008 | Lin | H01L 24/10 |
| | | | 257/690 |
| 2008/0150579 A1 | 6/2008 | Madurawe | |
| 2008/0155820 A1* | 7/2008 | Arai | H01L 21/565 |
| | | | 29/830 |
| 2008/0159679 A1 | 7/2008 | Sigalas et al. | |
| 2008/0171172 A1 | 7/2008 | Bae et al. | |
| 2008/0174978 A1* | 7/2008 | Inoue | H01L 21/4857 |
| | | | 361/784 |
| 2008/0258848 A1 | 10/2008 | Quan et al. | |
| 2008/0284047 A1* | 11/2008 | Tosaya | H01L 23/16 |
| | | | 257/787 |
| 2008/0316714 A1 | 12/2008 | Eichelberger et al. | |
| 2009/0039523 A1* | 2/2009 | Jiang | H01L 21/561 |
| | | | 257/777 |
| 2009/0057848 A1 | 3/2009 | Johnson | |
| 2009/0071710 A1* | 3/2009 | Stelzl | H01L 23/3164 |
| | | | 174/520 |
| 2009/0080172 A1 | 3/2009 | Arslan et al. | |
| 2009/0099025 A1 | 4/2009 | Uchaykin | |
| 2009/0122508 A1 | 5/2009 | Uchaykin et al. | |
| 2009/0173936 A1* | 7/2009 | Bunyk | B82Y 10/00 |
| | | | 257/31 |
| 2009/0200659 A1* | 8/2009 | Tosaya | H01L 23/16 |
| | | | 257/704 |
| 2009/0212407 A1* | 8/2009 | Foster | B81B 7/0006 |
| | | | 257/686 |
| 2009/0291573 A1 | 11/2009 | Eldridge et al. | |
| 2009/0294954 A1 | 12/2009 | Bakir et al. | |
| 2010/0045536 A1 | 2/2010 | Fukui et al. | |
| 2010/0066393 A1 | 3/2010 | Bottoms et al. | |
| 2010/0134370 A1 | 6/2010 | Oh et al. | |
| 2010/0142259 A1 | 6/2010 | Drndic | |
| 2010/0187670 A1 | 7/2010 | Lin et al. | |
| 2010/0201003 A1 | 8/2010 | Thompson et al. | |
| 2010/0225436 A1 | 9/2010 | Papavasiliou et al. | |
| 2010/0283148 A1* | 11/2010 | Tsai | H01L 24/13 |
| | | | 257/737 |
| 2010/0308925 A1* | 12/2010 | Song | H01P 1/208 |
| | | | 331/96 |
| 2010/0308941 A1 | 12/2010 | Fujii et al. | |
| 2011/0032048 A1 | 2/2011 | Wu et al. | |
| 2011/0049684 A1 | 3/2011 | Lee et al. | |
| 2011/0065585 A1 | 3/2011 | Lanting et al. | |
| 2011/0079889 A1* | 4/2011 | Baillin | B81B 7/0038 |
| | | | 257/682 |
| 2011/0089405 A1 | 4/2011 | Ladizinsky et al. | |
| 2011/0128713 A1* | 6/2011 | Kawano | H01L 23/66 |
| 2011/0148441 A1 | 6/2011 | Yamamoto et al. | |
| 2011/0175061 A1 | 7/2011 | Berkley et al. | |
| 2011/0198751 A1* | 8/2011 | Mathew | H01L 24/03 |
| | | | 257/738 |
| 2011/0204505 A1 | 8/2011 | Pagaila et al. | |
| 2011/0223778 A1 | 9/2011 | Chow et al. | |
| 2011/0228440 A1* | 9/2011 | Kato | B81B 7/0048 |
| | | | 361/277 |
| 2011/0230043 A1* | 9/2011 | Wang | H01L 21/6836 |
| | | | 438/613 |
| 2011/0248396 A1 | 10/2011 | Liu et al. | |
| 2011/0278741 A1* | 11/2011 | Chua | H01L 21/561 |
| | | | 257/777 |
| 2012/0007199 A1* | 1/2012 | Li | H01L 27/14618 |
| | | | 257/432 |
| 2012/0074585 A1 | 3/2012 | Koo et al. | |
| 2012/0098123 A1* | 4/2012 | Yu | H01L 21/563 |
| | | | 257/737 |
| 2012/0146881 A1 | 6/2012 | Mckinzie, III | |
| 2012/0153458 A1* | 6/2012 | Howard | H01L 24/13 |
| | | | 257/737 |
| 2012/0208381 A1 | 8/2012 | Garcia et al. | |
| 2012/0211878 A1* | 8/2012 | Popovic | H01L 24/05 |
| | | | 257/690 |
| 2012/0217642 A1* | 8/2012 | Sun | H01L 25/16 |
| | | | 257/773 |
| 2012/0228011 A1 | 9/2012 | Chang et al. | |
| 2012/0231621 A1 | 9/2012 | Chang et al. | |
| 2012/0313236 A1* | 12/2012 | Wakiyama | H01L 23/544 |
| | | | 257/734 |
| 2012/0325544 A1 | 12/2012 | Toyao et al. | |
| 2013/0029848 A1 | 1/2013 | Gonzalez et al. | |
| 2013/0057362 A1 | 3/2013 | Wu et al. | |
| 2013/0082890 A1 | 4/2013 | Wang et al. | |
| 2013/0087766 A1 | 4/2013 | Schenkel et al. | |
| 2013/0099235 A1 | 4/2013 | Han | |
| 2013/0196855 A1* | 8/2013 | Poletto | H01L 39/04 |
| | | | 505/170 |
| 2013/0199831 A1* | 8/2013 | Morris | H01L 24/95 |
| | | | 174/260 |
| 2013/0200511 A1 | 8/2013 | Banijamali | |
| 2013/0246990 A1 | 9/2013 | Yen et al. | |

(56) References Cited

U.S. PATENT DOCUMENTS

| | | | |
|---|---|---|---|
| 2013/0264708 A1* | 10/2013 | Hiwatashi | H01L 23/49816 257/738 |
| 2013/0293323 A1 | 11/2013 | Nakase | |
| 2013/0306363 A1 | 11/2013 | Yukimasa | |
| 2014/0033489 A1* | 2/2014 | Kawashima | H03B 5/36 29/25.35 |
| 2014/0035072 A1* | 2/2014 | Shu | B81B 3/001 257/417 |
| 2014/0043768 A1* | 2/2014 | Hardikar | H05K 7/1007 361/718 |
| 2014/0091827 A1 | 4/2014 | Hung | |
| 2014/0167836 A1 | 6/2014 | Gambetta et al. | |
| 2014/0197541 A1* | 7/2014 | Stephens | H01L 24/05 257/772 |
| 2014/0246763 A1 | 9/2014 | Bunyk | |
| 2014/0254307 A1 | 9/2014 | Zhao et al. | |
| 2014/0264286 A1 | 9/2014 | Chang et al. | |
| 2014/0264287 A1 | 9/2014 | Abraham et al. | |
| 2014/0264741 A1* | 9/2014 | Daubenspeck | H01L 28/40 257/532 |
| 2014/0264890 A1* | 9/2014 | Breuer | H01L 24/11 257/773 |
| 2014/0274725 A1 | 9/2014 | Abraham et al. | |
| 2014/0314419 A1 | 10/2014 | Paik | |
| 2015/0069634 A1* | 3/2015 | Oyama | H01L 23/562 257/777 |
| 2015/0119253 A1 | 4/2015 | Yohannes et al. | |
| 2015/0145116 A1 | 5/2015 | Uzoh et al. | |
| 2015/0156880 A1* | 6/2015 | Daizo | H05K 1/183 174/251 |
| 2015/0179557 A1* | 6/2015 | Goodnow | H01L 24/14 257/737 |
| 2015/0179913 A1 | 6/2015 | Pramanik et al. | |
| 2015/0214631 A1 | 7/2015 | Yukimasa | |
| 2015/0270622 A1 | 9/2015 | Takasaki et al. | |
| 2015/0357550 A1 | 12/2015 | Schoelkopf, III et al. | |
| 2015/0372217 A1 | 12/2015 | Schoelkopf, III et al. | |
| 2016/0005714 A1* | 1/2016 | Lee | H01L 25/0652 257/777 |
| 2016/0013123 A1* | 1/2016 | Pai | H01L 25/50 257/774 |
| 2016/0056100 A1* | 2/2016 | Yeh | H01L 24/81 257/676 |
| 2016/0087598 A1 | 3/2016 | Thom et al. | |
| 2016/0125311 A1 | 5/2016 | Fuechsle et al. | |
| 2016/0149900 A1 | 5/2016 | Justin et al. | |
| 2016/0157338 A1 | 6/2016 | Toyota et al. | |
| 2016/0219713 A1 | 7/2016 | Kim et al. | |
| 2016/0254434 A1* | 9/2016 | McDermott, III | H01L 39/045 505/170 |
| 2016/0267032 A1 | 9/2016 | Rigetti et al. | |
| 2016/0276067 A1* | 9/2016 | Wulff | H01L 39/248 |
| 2016/0284656 A1* | 9/2016 | Rinck | H01L 24/13 |
| 2016/0292586 A1 | 10/2016 | Rigetti et al. | |
| 2016/0292587 A1 | 10/2016 | Rigetti et al. | |
| 2016/0308502 A1 | 10/2016 | Abdo et al. | |
| 2016/0314231 A1 | 10/2016 | Tsang et al. | |
| 2016/0345429 A1 | 11/2016 | Ishiwata et al. | |
| 2016/0364653 A1 | 12/2016 | Chow et al. | |
| 2017/0040296 A1 | 2/2017 | Das et al. | |
| 2017/0057222 A1* | 3/2017 | Nanba | B41J 2/1623 |
| 2017/0125385 A1 | 5/2017 | Liu | |
| 2017/0133336 A1 | 5/2017 | Oliver et al. | |
| 2017/0162507 A1* | 6/2017 | Das | H01L 21/486 |
| 2017/0179041 A1* | 6/2017 | Dias | H01L 23/552 |
| 2017/0345786 A1* | 11/2017 | Chen | H01L 25/105 |
| 2018/0012932 A1* | 1/2018 | Oliver | H01L 39/02 |
| 2018/0013052 A1 | 1/2018 | Oliver et al. | |
| 2018/0040935 A1 | 2/2018 | Sliwa et al. | |
| 2018/0069288 A1 | 3/2018 | Minev et al. | |
| 2018/0102470 A1 | 4/2018 | Das et al. | |
| 2018/0138987 A1 | 5/2018 | Sliwa et al. | |
| 2018/0247974 A1 | 8/2018 | Oliver et al. | |
| 2018/0366466 A1* | 12/2018 | Zerbe | H01L 25/18 |
| 2018/0368295 A1* | 12/2018 | Balz | H05K 1/0216 |
| 2019/0027800 A1 | 1/2019 | El Bouayadi et al. | |
| 2019/0042964 A1 | 2/2019 | Elsherbini et al. | |
| 2019/0044047 A1* | 2/2019 | Elsherbini | H01L 39/223 |
| 2019/0152773 A1* | 5/2019 | Herbsommer | B81C 1/00047 |
| 2019/0165241 A1* | 5/2019 | Rosenblatt | H01L 39/045 |
| 2019/0207075 A1* | 7/2019 | Megrant | F17C 3/085 |
| 2019/0267692 A1 | 8/2019 | Roberts et al. | |
| 2019/0273197 A1 | 9/2019 | Roberts et al. | |
| 2019/0305038 A1 | 10/2019 | Michalak et al. | |
| 2020/0012961 A1* | 1/2020 | Kelly | H01L 39/14 |
| 2020/0152540 A1* | 5/2020 | Nah | H01L 21/6835 |

FOREIGN PATENT DOCUMENTS

| | | |
|---|---|---|
| WO | 2015057839 | 4/2015 |
| WO | 2015178990 A2 | 11/2015 |
| WO | 2015178991 A2 | 11/2015 |
| WO | 2015178992 A2 | 11/2015 |

OTHER PUBLICATIONS

USPTO; Notice of Allowance dated Jan. 24, 2018, in U.S. Appl. No. 15/140,232.

USPTO, Notice of Allowance dated May 23, 2018, in U.S. Appl. No. 15/140,273, 16 pgs.

USPTO, Non-Final Office Action dated Dec. 31, 2018, in U.S. Appl. No. 15/829,057, 26 pgs.

USPTO, Office Action issued in U.S. Appl. No. 15/140,273 dated Jul. 27, 2017, 37 pages.

USPTO, Office Action issued in U.S. Appl. No. 15/140,232 dated Jun. 28, 2017, 40 pages.

USPTO, Office Action issued in U.S. Appl. No. 15/140,232 dated Mar. 31, 2017, dated Mar. 31, 2017, 6 pages.

"USPTO", Notice of Allowance in U.S. Appl. No. 15/140,261, dated Apr. 17, 2017, 26 pages.

Brecht, T., et al., "Multilayer microwave integrated quantum circuits for scalable quantum computing", arXiv:1509.01127v1 [quant-ph], Sep. 3, 2015, 5 pages.

Bruno, A., et al., "Reducing intrinsic loss in superconducting resonators by surface treatment and deep etching of silicon substrates", arXiv:1502.04082v1 [cond-mat.supr-con], Appl. Phys. Lett. 106, 182601, Feb. 13, 2015, 11 pages.

Cho, J., et al., "Through Silicon Via (TSV) Shielding Structures", Prof. IEEE Conference on Electrical Performance of Electronic Packaging and Systems (EPEPS), Oct. 25, 2010, pp. 269-272.

Clariant AG, "AZ® 9200 Photoresist, High-Resolution Thick Resist, Product Data Sheet", dated Jul. 1997, 8 pages.

Copsey, et al., "Toward a Scalable, Silicon-Based Quantum Computing Architecture", IEEE Journal of Selected Topics in Quantum Electronics, vol. 9, No. 6,, Nov. 2003, 18 pages.

Custom Interconnects, "Thinnerposer® Board to Board Connector, Ultra Low Profile Interposer", online at http://custominterconnects.com/files/Thinnerposer_Product_Slick.pdf as of Jan. 8, 2016, 1 page.

Gambino, Jeffrey P., et al., "An overview of through-silicon-via technology and manufacturing challenges", Microelectronic Engineering 135, Jan. 8, 2015, pp. 73-106.

Geerlings, Kurtis Lee, "Improving Coherence of Superconducting Qubits and Resonators", Dissertation—Yale University, Aug. 19, 2013, 256 pages.

Koch, Jens, et al., "Charge-insensitive qubit design derived from the Cooper pair box", Physical Review A 76, 042319, Oct. 12, 2007, 19 pages.

Megrant, Anthony, et al., "High Quality Factor MBE-grown Aluminum on Silicon Planar Resonators", APS March Meeting 2015, Nov. 14, 2014, 3 pages.

Micro Chem, "SU-8 2000 Permanent Epoxy Negative Photoresist", online at http://www.microchem.com/pdf/SU-82000DataSheet2100and2150Ver5.pdf as of Apr. 15, 2015, 5 pages.

Microwaves and RF, "What is LTCC?", http://mwrf.com/components/what-ltcc, Jun. 16, 2006, 2 pages.

(56) References Cited

OTHER PUBLICATIONS

Paik, Hanhee, et al., "Observation of High Coherence in Josephson Junction Qubits Measured in a Three-Dimensional Circuit QED Architecture", Physical Review Letters 107, 240501, Dec. 5, 2011, 5 pages.
Powell, O., et al., "Anisotropic etching of {100} and {110} planes in (110) silicon", J. Micromech. Microeng. 11, 2001, pp. 217-220.
Rigetti, Chad, et al., "Superconducting qubit in a waveguide cavity with a coherence time approaching 0.1 ms", Physical Review B 86, 100506(R), Sep. 24, 2012, 5 pages.
Shipley, "Microposit S1800 Series Photo Resists", online at http://www.microchem.com/PDFs_Dow/S1800.pdf as of Apr. 15, 2016, 6 pages.
Wenner, J., et al., "Surface loss simulations of superconducting coplanar waveguide resonators", Applied Physics Letters 99, 113513, Sep. 15, 2011, 3 pages.
Wong, Alice, "Via Fill in Small Trenches Using Hot Alumnium Process", online at http://microlab.berkeley.edu/text/AliceWong.pdf as of Apr. 15, 2015, 34 pages.
USPTO, Non-Final Office Action dated Jan. 17, 2020, in U.S. Appl. No. 16/012,708, 27 pgs.
USPTO, Final Office Action dated Jan. 24, 2020, in U.S. Appl. No. 15/969,263, 29 pgs.
USPTO, Non-Final Office Action dated Mar. 30, 2020, in U.S. Appl. No. 15/829,057, 36 pgs.
Chapter B: Flip-Chip Technology, https://web.archive.org/web/20131102045829/http://extra.ivf.se/ngl/b-flip-chip/ChapterB1.htm, 6 pgs.
USPTO, Notice of Allowance dated Dec. 11, 2019, in U.S. Appl. No. 15/829,057, 9 pgs.
"Fuzz Button Interposers", https://web.archive.org/web/20150105223016/http://www.custominterconnects.com/files/Interposer_Datasheet2.pdf, 2 pgs.
"Fuzz Button Interposers / Connectors", https://web.archive.org/web/20141231003925/http://www.custominterconnects.com/interposers.html, 2 pgs.
"Fuzz Button Interposers datasheet", https://web.archive.org/web/20150105223016/http://www.custominterconnects.com/files/Interposer_Datasheet2.pdf, 2015, 2 pgs.
"Stack-Up Configurations", https://web.archive.org/web/20150105203348/https://www.custominterconnects.com/files/Stack-Up_Configurations2.pdf, 2 pgs.
Abdo, et al., "Josephson Directional Amplifier for Quantum Measurement of Superconducting Circuits", PRL 112, 167701, Apr. 2014, 5 pgs.
Anderson, "A Physicist's Desk Reference", The Second Edition of Physics Vade Mecum, AIP, 1989, 7 pgs.
Anderson, et al., "High Temperature Superconducting Multilayer Multichip Module: Fabrication and High Speed Characterization", IEEE Transactions on Applied Superconductivity, vol. 9, No. 2, Jun. 1999, 4 pgs.
Brecht, et al., "Multilayer microwave integrated quantum circuits for scalable quantum computing", 3rXiv:1509.01127v2 [quant-ph], Sep. 11, 2015, 5 pgs.
Bronn, et al., "High coherence plane breaking packaging for superconducting qubits", Quantum Sci. Technol. 3, 324007, 2018, 7 pgs.

Colless, et al., "Cryogenic high-frequency readout and control platform for spin qubits", Rev. Sci. Instrum. 83, 323902, Feb. 13, 2012, 8 pgs.
Colless, "Modular cryogenic interconnects for multi-qubit devices", Rev. Sci. Instrum. 85, 114706, Nov. 17, 2014, 6 pgs.
Das, et al., "3D-Interconnect Approach for High End Electronics", IEEE, 2012, 7 pgs.
Das, et al., "Cryogenic Qubit Integration for Quantum Computing", IEEE 68th Electronic Components and Technology aont, 2018, 11 pgs.
Dubejsky, "Fabrication and Dc Characterization of Single Electron Transistors at Low Temperature", Thesis submitted to the Dept of Physics, Engineering Physics and Astronomy, Queen's University, Kingston, Ontario, Ca, Aug. 2007, 148 pgs.
Ekin, "Experimental Techniques for Low-Temperature Measurements, Cryostat Design, Material Properties, and Superconductor Critical-Current Testing", National Institute of Standards and Technology, Boulder, Co; Oxford University Press, 2006, 34 pgs.
Farrington, et al., "Design of a Non-Contact Vertical Transition for a 3D Mm-Wave Multi-Chip Module Based on Shielded Membrane Supported Interconnects", Progress in Electromagnetics Research B, Vol. 32, 2011, 19 pgs.
Fretz, "Flip Chip Bonding Technologies for Hybrid Integration", University de Neuchatel, Sep. 24, 2009, 167 pgs.
Frunzio, et al., "Fabrication and Characterization of Superconducting Circuit Qed Devices for Quantum computation", IEEE Transactions on Applied Superconductivity, Vol. 15, No. 2, Jun. 2005, 4 pgs.
Hoffmann, et al., "A superconducting 180° hybrid ring coupler for circuit quantum electrodynamics", Appl. Phys. Lett. 97, 222508, Dec. 3, 2010, 4 pgs.
Hong, et al., "Improvements in TiWN barrier technology for devices using Au metallisation", Microelectronic Engineenng 64, 2002, 6 pgs.
Johnson, "Optimization of superconducting flux qubit readout using near-quantum-limited amplifiers", UC Berkeley Electronic Theses and Dissertations, 2012, 145 pgs.
Lienhard, et al., "Microwave Packaging for Superconducting Qubits", IEEE/MTT-S Int'l Microwave Symposium, 2019, 4 pgs.
Mangroli, et al., "Optimizing thermal and mechanical performance in PCBs", Global SMT & Packaging magazine; https://web.archive.org/web/20080520015546/http://www.globalsmt.net/content/view/3311/115/ dated Jan. 4, 2008, 4 pgs.
Marty, et al., "Advanced etching of silicon based on deep reactive ion etching for silicon high aspect ratio microstructures and three-dimensional micro- and nanostructures", Microelectronics Journal 36, 7, 2005, 5 pgs.
Schmitt, "Design, fabrication and test of a four superconducting quantum-bit processor", bearing submission date Oct. 12, 2015, 192 pgs.
Schmitt, et al., "Multiplexed readout of transmon qubits with Josephson bifurcation amplifiers", Phys. Rev. A 90, 062333, Dec. 22, 2014, 5 pgs.
Yorozu, et al., "Sub-Kelvin single flux quantum control circuits and multi-chip packaging for supporting superconducting qubit", J. Phys.: Conf. Ser. 43 1417, 2006, 5 pgs.

\* cited by examiner

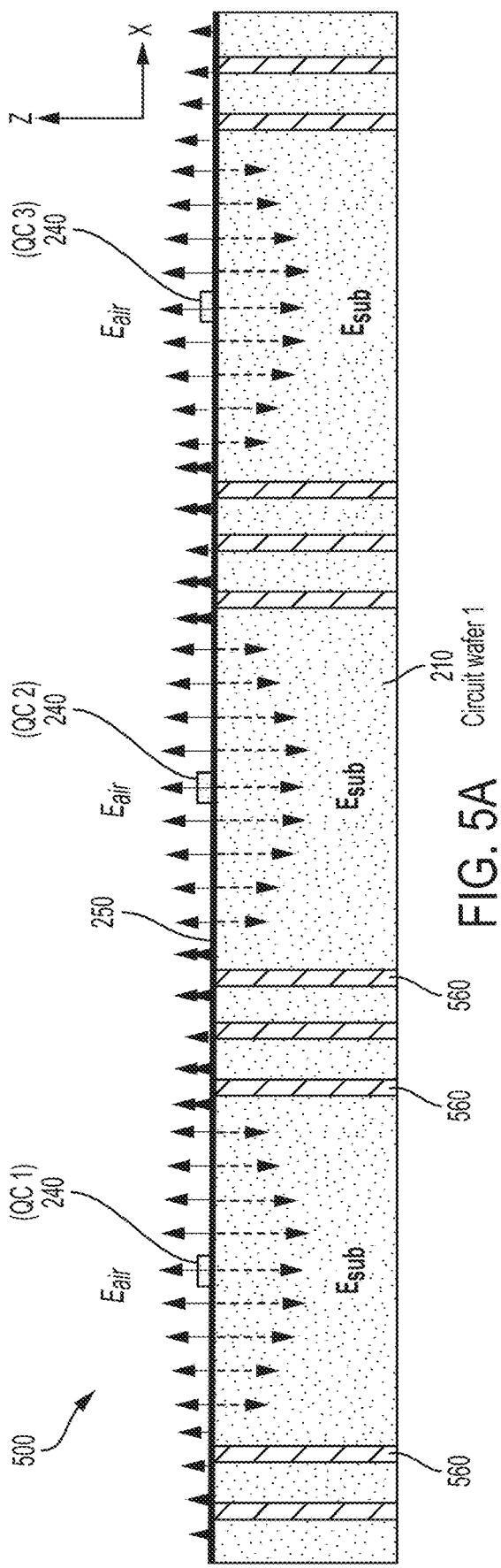
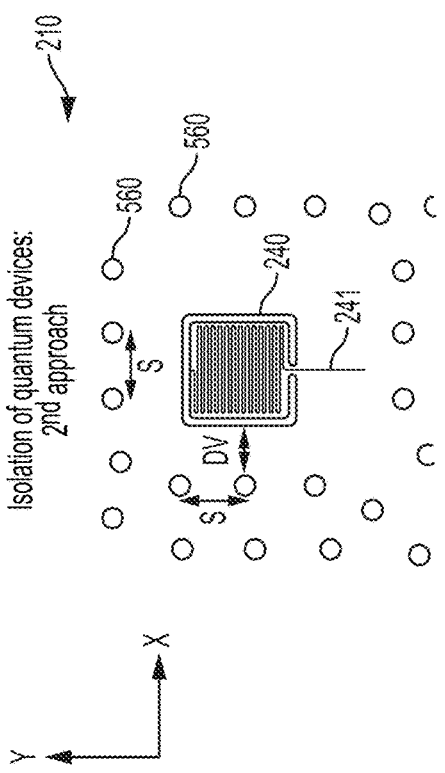

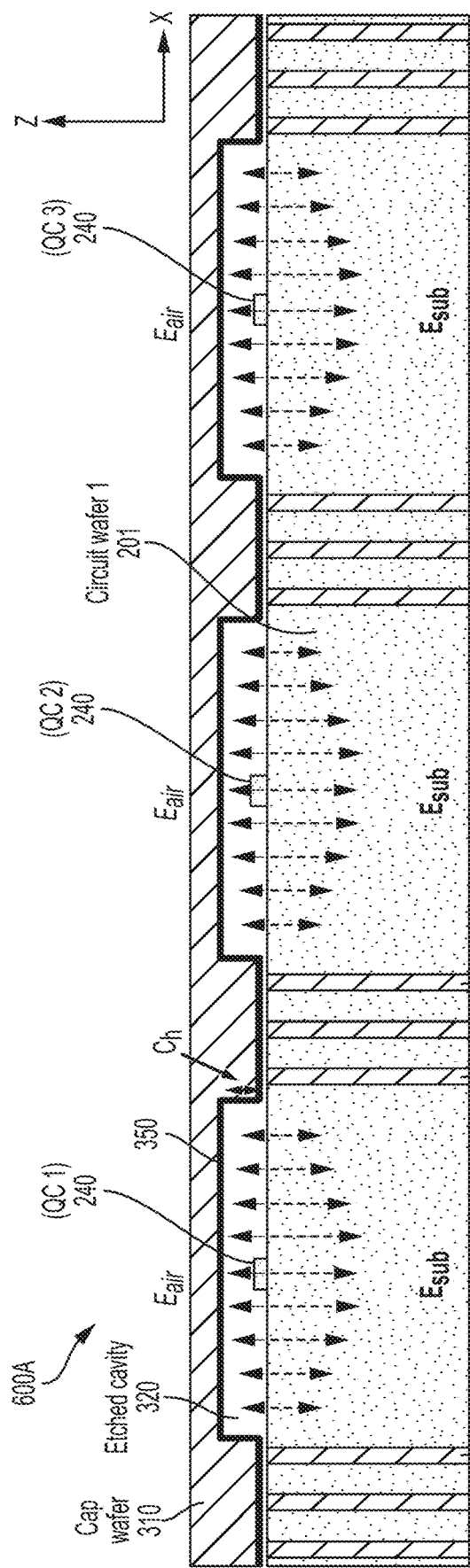
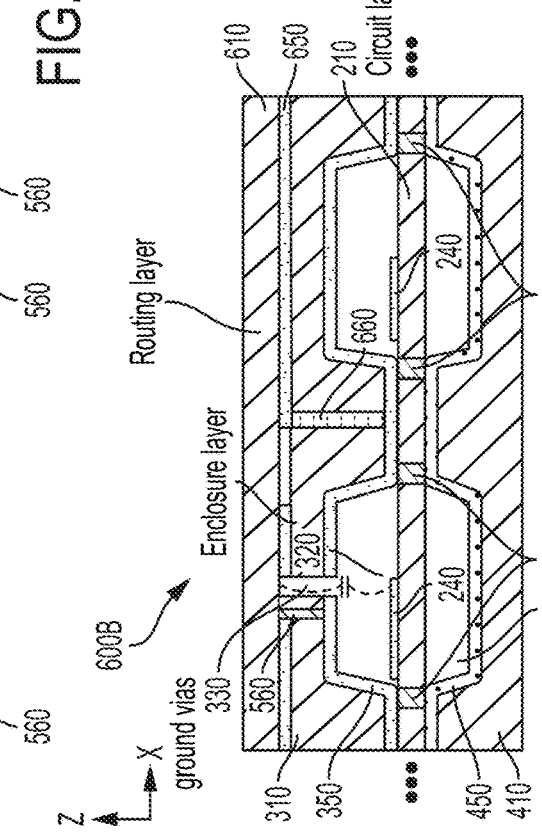
FIG. 6A
FIG. 6B
FIG. 6C

US 10,769,546 B1

MICROWAVE INTEGRATED QUANTUM CIRCUITS WITH CAP WAFER AND METHODS FOR MAKING THE SAME

CROSS REFERENCE TO RELATED APPLICATIONS

This application is a continuation of U.S. patent application Ser. No. 15/140,273, filed Apr. 27, 2016, entitled "Microwave Integrated Quantum Circuits with Cap Wafer and Methods for Making the Same," which is incorporated herein by reference and which claims priority to U.S. Provisional Application Ser. No. 62/153,057, filed Apr. 27, 2015, and to U.S. Provisional Application Ser. No. 62/277,362, filed Jan. 11, 2016, the disclosures of which are incorporated herein by reference.

FIELD OF THE DISCLOSURE

The following description relates generally to microwave integrated quantum circuits, methods of constructing the microwave integrated quantum circuits, and their packaging, and more specifically to microwave integrated quantum circuits with cap wafer.

BACKGROUND

Quantum computers can perform computational tasks by executing quantum algorithms. In some quantum computing architectures, quantum algorithms are executed on superconducting qubits that are subject to noise. The superconducting qubits can be implemented, for example, using circuits that include Josephson-junctions.

SUMMARY

Quantum computing device architectures and packages are disclosed that may provide, among other advantages, improved qubit device performance, controlled coupling between qubit devices, reduced unwanted cross-coupling between qubit devices, improved thermal isolation, low microwave loss, and/or substrate mode suppression. For example, cap wafer architectures for microwave integrated quantum circuits are disclosed that may improve qubit device performance by improving the coherence time of a wafer device. The disclosed cap wafers may also shield electromagnetic field leakage. The disclosed cap wafers can provide for controlled coupling between qubit devices and can reduce (e.g., avoid) unwanted coupling between devices. The cap wafer architectures are scalable to multi-qubit two dimensional and three dimensional integrated quantum circuits. Moreover, the cap wafer architectures can solve the cross-coupling problem in a large scale quantum processor in which more than one identical qubits are present.

In addition to cap wafers, at least some of the disclosed device architectures feature via designs that can provide numerous benefits. For instance, the disclosed vias can provide excellent thermal isolation of quantum circuits by operating as heat sinks. By way of example, vias containing normally-conducting metals (e.g., copper) may operate as excellent heat sinks for for superconducting signal lines. Introducing these features through shielded vias allows the designer to integrate these features without also introducing enhanced signal dissipation from the normally conducting metal. Via architectures for other functions are also disclosed, such as for isolating and shielding a quantum circuit from microwaves, for RF signal delivery, for coupling between quantum circuits in different layers, and/or for suppressing substrate modes.

Further to cap wafer and via architectures, interposers for quantum computing apparatuses are also described. Interposer embodiments that are scalable to large quantum integrated circuits, mechanically robust, and having fast iteration cycles are disclosed.

Various aspects of the invention are summarized below.

In general, in one aspect, the invention features a quantum computing system that includes a substrate having a first and second surface, a quantum circuit device having at least one operating frequency disposed on a portion of the first surface of the substrate, electrically conducting vias extending through the substrate from the first surface to the second surface, and an electrically conducting circuit disposed on the second surface of the substrate.

In general, in a further aspect, the invention features a quantum computing system that includes a first substrate having a first and second surface, a quantum circuit device having at least one operating frequency disposed on the first surface the first substrate, a second substrate having first surface with a recess formed in a first surface of the second substrate, the recess being disposed above at least a portion of the quantum circuit device, electrically conducting vias extending through a the first substrate from its first surface to its second surface, and an electrically conducting circuit disposed on the second surface of the first substrate.

Implementations of the quantum computing systems may include one or more of the following features and/or features of other aspects. For example, the vias may include a material that is superconducting during operation of the quantum computing system. The electrical circuit may include one or more elements that are superconducting during operation of the quantum computing system.

The quantum circuit device can include one or more of the following elements: a qubit; a resonator; a parametric frequency converter; a transmon; a fluxonium; and a parametric amplifier.

The vias can be arranged to form a transmission line structure through the substrate. Alternatively, or additionally, the vias can be arranged to suppress electromagnetic radiation for frequencies below a cutoff frequency, the cutoff frequency being larger than the operating frequency. In some implementations, the vias are arranged to form a transmission line structure.

In general, in a further aspect, the invention features a quantum circuit device having at least one operating frequency; a first substrate having a first surface on which the quantum processing device is disposed; and electrically conducting vias each extending through the first substrate outside of a footprint of the quantum circuit device. The vias are arranged to suppress propagation of electromagnetic waves that have frequencies below a cutoff frequency, the cutoff frequency being larger than the operating frequency.

Implementations of the quantum computing systems may include one or more of the following features and/or features of other aspects. In some implementations, a separation between adjacent vias can be smaller than a maximum separation corresponding to the cutoff frequency.

In some implementations, the quantum computing systems may include a second substrate having a first surface that defines a recess of the second substrate, the first and second substrates being arranged such that the recess of the second substrate forms an enclosure that houses the quantum processing device; and an electrically conducting layer that covers at least a portion of the recess of the second substrate.

Here, the recess of the second substrate is configured to suppress inside the recess propagation of the electromagnetic waves that have frequencies below the cutoff frequency. In some cases, a lateral dimension of the recess can be smaller than a maximum distance corresponding to the cutoff frequency.

In some cases, the quantum computing systems may include another quantum circuit device having at least one other operating frequency, the other quantum circuit device being disposed on the first surface of the first substrate and spaced apart from the quantum circuit device. Here, the quantum computing systems may include other electrically conductive vias each extending through the first substrate outside of a footprint of the other quantum circuit device. The other vias can be arranged to suppress propagation of electromagnetic waves that have frequencies below another cutoff frequency, the other cutoff frequency being larger than the other operating frequency. Further here, the quantum computing systems may include a coupling line that includes an electrical conductor extending along the first surface of the first substrate. The other quantum circuit device can be electromagnetically coupled with the quantum circuit device through the coupling line, through a capacitive coupling, or through an inductive coupling. Moreover, the first surface of the second substrate can define another recess of the second substrate, the first and second substrates being further arranged such that the other recess of the second substrate forms another enclosure that houses the other quantum processing device, the electrically conducting layer further may cover at least a portion of the other recess of the second substrate, and the other recess of the second substrate is configured to suppress inside the other recess propagation of the electromagnetic waves that have frequencies below the other cutoff frequency.

In some cases, the quantum computing systems may include another quantum circuit device having at least one other operating frequency; a third substrate having a first surface onto which the other quantum circuit device is disposed; and other electrically conductive vias each extending through the third substrate outside of a footprint of the other quantum circuit device, the other vias being arranged to suppress, across a volume of the third substrate that is adjacent to the footprint of the other quantum circuit device, propagation of electromagnetic waves that have frequencies below another cutoff frequency, the other cutoff frequency being larger than the other operating frequency. Here, the first substrate (i) has a second surface opposing the first surface that defines a recess of the first substrate, and (ii) is sandwiched between the second substrate and the third substrate, the first and third substrates being arranged such that the recess of the first substrate forms another enclosure that houses the other quantum processing device. Further, the quantum computing systems may include another electrically conducting layer that covers at least a portion of the recess of the first substrate, the recess of the first substrate being configured to suppress inside the recess propagation of the electromagnetic waves that have frequencies below the other cutoff frequency; and a coupling line that includes an electrically conductive via extending through the first substrate, the other quantum circuit device being electromagnetically coupled with the quantum circuit device through the coupling line.

In some implementations, the quantum computing systems may include a set of three or more other electrically conducting vias each extending through the first substrate outside of a footprint of the quantum circuit device, wherein the other electrically conductive vias form respective vertices of a polygon; and a signal line that includes a first via that extends through the first substrate and is inscribed in the polygon, wherein the signal line is electromagnetically coupled with the quantum circuit device to carry, during operation of the quantum computing system, a control signal to, or a readout signal from, the quantum circuit device. In some implementations, the quantum computing systems may include a DC pad disposed on the first surface of the first substrate and electromagnetically coupled with the quantum circuit device; and a DC line that includes one or more vias that extend through the first substrate and contact the DC pad, wherein the DC line carries, during operation of the quantum computing system, a DC signal to and from the quantum circuit device.

In some implementations, at least some of the electrically conductive vias can be grounded during operation of the quantum computing system. In some cases, the electrically conducting layer also can be grounded during operation of the quantum computing system.

In some implementations, the electrically conducting layer can be a superconducting layer during operation of the quantum computing system. In some implementations, the electrically conducting vias can include a material that is a superconducting material during operation of the quantum computing system.

In general, in a further aspect, the invention features a quantum computing system that includes a quantum circuit device; a substrate having a first surface on which the quantum processing device is disposed; and one or more vias each extending through the substrate. The vias include a material that is a superconducting material during operation of the quantum computing system.

Implementations of the quantum computing systems may include one or more of the following features and/or features of other aspects. In some implementations, the one or more vias can be disposed outside of a footprint of the quantum circuit device.

In some implementations, each via comprises a pair of end caps of the superconducting material, the end caps disposed adjacent to the first surface and an opposing surface of the first substrate. In some cases, each via further can include a tube of the superconducting material in contact with walls of a through hole of the first substrate that houses the via, the tube of the superconducting material extending between the pair of end caps of the superconducting material. In some cases, the via can be filled with a filler material between the pair of end caps of the superconducting material. For example, the filler material can be a polymer. As another example, the filler material can be a normal conducting metal. As yet another example, the filler material can be a superconducting material.

In some implementations, a separation between adjacent vias can be between 0.1 μm and 1 mm. In some implementations, vias fabricated in one or more substrates can form networks of structure that provide large scale quantum integrated circuits. In some implementations, vias can provide thermalization by serving as a heat sink and reduce loss experienced by quantum circuits on the first surface of the substrate during operation of the quantum computing system. In some implementations, vias can isolate quantum circuits of the quantum computing system from interacting with spurious modes of the substrate improving coherence times of the quantum circuits during operation of the quantum computing system.

In some implementations, the thickness of the substrate can be between 1 μm to 1 mm. In some implementations, the substrate can include one or more materials selected from the group consisting of silicon, sapphire, silicon oxide, and silicon nitride.

In some implementations, the quantum circuit device can be one of qubit, a tunable quantum coupler, a readout circuit including one or more linear resonators or one or more non-linear resonators, a filter, a quantum amplifier, or a circulator.

In general, in a further aspect, the invention features a method of fabricating a quantum computing system. Here, the method includes forming via openings in a substrate, the via openings extending from a first end adjacent to a first surface of the substrate to a second end inside the substrate; and forming a wall of electrically conducting vias by depositing a layer of electrically conducting material that conforms on walls of the formed via openings. The electrically conducting material is a superconducting material at an operational temperature of the quantum computing system. The method further includes forming a first cap of the vias at the first end of the wall of the vias by depositing a layer of the electrically conducting material on the first surface of the substrate and in contact with the wall of the vias; thinning the substrate to reveal, at a second surface of the substrate opposing the first surface, the second end of the wall of the vias; and forming a second cap at the second end of the wall of the vias by depositing a layer of the electrically conducting material on the second surface of the substrate in contact with the wall of the vias.

Implementations of the method of fabricating a quantum computing system may include one or more of the following features and/or features of other aspects. In some implementations, via openings in the substrate can be etched using a Deep Reactive Ion Etch or laser drilling processes. In some implementations, the electrically conducting material can be deposited on the wall of the via openings using sputtering, e-beam evaporation, ALD or MOCVD.

In some implementations, the method can include filling a volume inside the walls of the vias with a filler using one of e-beam evaporation, sputtering or electroplating. In some implementations, the method can include forming a quantum circuit device on the first surface of the substrate.

In general, in a further aspect, the invention features a quantum computing system that includes a quantum circuit device having at least one operating frequency; a first substrate having a first surface on which the quantum circuit device is disposed; a second substrate having a first surface that defines a recess of the second substrate, the first and second substrates being arranged such that the recess of the second substrate forms an enclosure that houses the quantum circuit device; and an electrically conducting layer that covers at least a portion of the recess of the second substrate.

Implementations of the quantum computing systems may include one or more of the following features and/or features of other aspects. In some implementations, the recess of the second substrate is configured to suppress propagation inside the recess of electromagnetic waves that have frequencies below a cutoff frequency, the cutoff frequency being larger than the operating frequency. In some implementations, a lateral dimension of the recess can be smaller than a maximum distance corresponding to the cutoff frequency. In some cases, the recess of the second substrate can be between 20 µm and 2 mm wide.

In some implementations, the quantum computing systems may include a third substrate having a first surface that defines a first recess of the third substrate, the first substrate being sandwiched between the second substrate and the third substrate. Here, the first and third substrates are arranged such that the first recess of the third substrate forms a first enclosure that registers with the enclosure that houses the quantum circuit device. Additionally, the quantum computing systems includes another electrically conducting layer that covers at least a portion of the first recess of the third substrate. The first recess of the third substrate can be configured to suppress, inside the first recess and across a volume of the first substrate that is sandwiched between the first recess of the third substrate and the recess of the second substrate, propagation of the electromagnetic waves that have frequencies below the cutoff frequency. Also, the quantum computing systems may include another quantum circuit device having at least one other operating frequency, the other quantum circuit device being disposed on the first surface of the first substrate and spaced apart from the quantum circuit device.

In some cases, the quantum computing systems may include an electrical conductor extending along the first surface of the first substrate, wherein the other quantum circuit device is electromagnetically coupled with the quantum circuit device through the electrical conductor. For example, the first surface of the second substrate further defines another recess of the second substrate, the first and second substrates being further arranged such that the other recess of the second substrate forms another enclosure that houses the other quantum circuit device. Further, the electrically conducting layer can cover at least a portion of the other recess of the second substrate. Furthermore, the other recess of the second substrate is configured to suppress propagation inside the other recess of electromagnetic waves that have frequencies below another cutoff frequency, the other cutoff frequency being larger than the other operating frequency.

In some cases, the recesses of the second substrate can be part of an array of that form an array of recesses of the second substrate; the quantum circuit devices can be part of an array of quantum circuit devices disposed on the first surface of the first substrate, the array of recesses of the second substrate forming an array of enclosures that respectively host the array of quantum circuit devices; and the recesses of the third substrate can be part of an array of recesses of the third substrate that are registered with corresponding recesses of the second substrate.

In some cases, the array of recesses of the second substrate can be periodic at least in one dimension. In some cases, the array of recesses of the second substrate can be periodic in two dimensions.

In some cases, the third substrate has a second surface opposing the first surface that defines a second recess, and the quantum computing systems may include another electrically conducting layer that covers at least a portion of the second recess of the third substrate; another quantum circuit device having at least one other operating frequency; a fourth substrate having a first surface onto which the other quantum circuit device is disposed, the third substrate being sandwiched between the first substrate and the fourth substrate, the third and fourth substrates being arranged such that the second recess of the third substrate forms another enclosure that houses the other quantum processing device, the second recess of the third substrate being configured to suppress propagation inside the recess of electromagnetic waves that have frequencies below the other cutoff frequency, the other cutoff frequency being larger than the operating frequency; a fifth substrate having a first surface that defines a recess of the fifth substrate, the fourth substrate being sandwiched between the third substrate and the fifth substrate, wherein the fourth and fifth substrates are arranged such that the recess of the fifth substrate forms an enclosure that registers with the other enclosure that houses the other quantum circuit device; another electrically conducting layer that covers at least a portion of the recess of the fifth substrate, wherein the recess of the fifth substrate is configured to suppress, inside the recess and across a volume of the fourth substrate that is sandwiched between the second recess of the third substrate and the recess of the fifth substrate, propagation of the electromagnetic waves that have frequencies below the other cutoff frequency; and an electrical conductor extending through the first substrate and third substrate, wherein the other quantum circuit device is electromagnetically coupled with the quantum circuit device through the electrical conductor.

In some implementations, the one or more recesses of the corresponding substrates can be between 5 and 1 mm deep. In some implementations, the electrically conducting layer can be grounded during operation of the quantum computing system. In some implementations, the electrically conducting layer can be a metalized layer. In some implementations, the electrically conducting layer can be a superconducting layer during operation of the quantum computing system.

In some implementations, the quantum computing systems may include bonding elements in contact with both the first surface of the first substrate and the first surface of the second substrate.

In some cases, the quantum computing systems may include bonding elements in contact with (i) both the first surface of the first substrate and the first surface of the second substrate, and (ii) both the second surface of the first substrate and the first surface of the third substrate.

In some cases, the third substrate has mating protrusions; the second substrate has mating recesses corresponding to the mating protrusions; the first substrate has openings corresponding to the mating protrusions; the first substrate is disposed on the third substrate such that the mating protrusions penetrate through the openings, and the second substrate is disposed on the first substrate such that the mating recessions cover the mating protrusions. For example, the mating protrusions can be spaced apart from the enclosure that houses the quantum circuit device. As another example, one or more of the mating protrusions are adjacent the enclosure that houses the quantum circuit device.

In general, in a further aspect, the invention features a quantum computing system that includes a quantum circuit device; a first substrate having a first surface on which the quantum processing device is disposed and a second, opposing surface; a second substrate having a first surface; and bonding elements in contact with one of the surfaces of the first substrate and the first surface of the second substrate.

Implementations of the quantum computing systems may include one or more of the following features and/or features of other aspects. In some implementations, the quantum circuit device can be one of a qubit, a tunable quantum coupler, a readout circuit including one or more linear resonators or one or more non-linear resonators, a filter, a quantum amplifier, or a circulator.

In some implementations, the first surface of the second substrate can form a recess, and the first and second substrates are arranged such that the recess forms an enclosure that hosts the quantum circuit device. In some cases, the recess can include channels that allow for gas trapped inside the recess to be pumped out. In some cases, the quantum computing systems may include an electrically conducting layer disposed on the first surface of the second substrate that covers at least a portion of the recess. Here, the bonding elements can form an electromagnetic contact between the electrically conducting layer and structures of the first substrate that are grounded during operation of the quantum computing system. For example, the recess of the second substrate can create a capacitance between a circuit and the bottom of the recess. As another example, the recess of the second substrate can reduce a participation ratio of the first substrate by increasing a capacitance between a circuit and the bottom of the recess. As yet another example, the recess of the second substrate can isolate circuit components from interacting with spurious modes and surface loss to improve coherence times of the circuit components. As yet another example, the recess of the second substrate can provide controlled coupling between neighboring circuit components. As yet another example, the recess of the second substrate reduces cross couplings between circuit components. In some cases, the second substrate can include one of silicon, sapphire, silicon oxide, silicon nitride, quartz, lithographically defined thick photoresists (SU8) or an electrical conducting material that is a superconducting material when the quantum computing system is operated.

In some implementations, the quantum computing systems may include a second quantum circuit device disposed on the first surface of the second substrate. Here, the bonding elements are in contact with the second surface of the first substrate. In some cases, the bonding elements can form an electromagnetic contact between the first and second substrates through which the quantum circuit devices respectively disposed on the first and second substrates are coupled to each other. In some cases, the bonding elements can form an electromagnetic contact between the bonded first and second substrates through which the quantum circuit device disposed on the first substrate receives DC signals or MW signals from signal lines of the second substrate.

In some implementations, the bonding elements can include bumps that include an electrically conducting material that is a superconducting material when the quantum computing system is operated. In some cases, the electrically conducting material can be selected from the group consisting of Indium, aluminum, and palladium. In some cases, the bumps can be arranged to form channels that allow for gas trapped between the bumps to be pumped out. In some cases, the quantum computing systems may include bond pads disposed on one of the surfaces of the first substrate or the first surface of the second substrate, opposing the other surface on which the bumps are disposed. For example, the bond pads can include one of aluminum, indium or Ti. As another example, the bond pads can include a cap layer of one of aluminum, indium or Ti. In some cases, the quantum computing systems may include an Al layer deposited on one of the surfaces of the first substrate or the first surface of the second substrate; and UnderBump Metallization (UBM) formed on the Al layer, the UBM being a wettable and solderable material to facilitate bonding to aluminum which has a surface oxide and not solderable.

In some implementations, the quantum computing systems may include spacers disposed on one of the surfaces of the first substrate or the second substrate that face each other. Here, the spacers are in contact with the surfaces of the first substrate and the second substrate that face each other to cause a separation thereof that is substantially equal to a height of the spacers. In some cases, the spacers can include insulating standoff bumps. For example, the standoff bumps can include one of Si Oxide or Si Nitride. As another example, the standoff bumps form a non-hermetic connection between the first and second substrates that allows for gas trapped inside the recess of the second substrate to be pumped out. As yet another example, the quantum computing systems may include an electrically conducting layer disposed on the first surface of the second substrate that conforms to the insulating standoff bumps. Here, the electrically conducting layer comprises on of aluminum, indium or Ti.

In some implementations, the quantum computing systems may include one or more of an integrated quantum processing device, quantum memory device, filter device, circulator device, or quantum amplifier device.

In general, in a further aspect, the invention features a method of fabricating a quantum computing system. Here, the method includes forming standoff bumps on a surface of a substrate; etching one or more recesses in the surface of the substrate; forming an electrically conducting layer that conforms to the standoff bumps and the one or more recesses; and forming bonding elements coupled with the electrically conducting layer, the bonding elements being formed outside the one or more recesses.

Implementations of the method of fabricating a quantum computing system may include one or more of the following features and/or features of other aspects. In some implementations, the method may include forming one or more quantum circuit devices on a first surface of a second substrate; and bonding the substrate and the second substrate such that the one or more recesses form respective enclosures that house the one or more quantum circuit devices. In some implementations, the etching of the recesses of the substrate can be performed using either Deep Reactive Ion Etch process or a wet etch process with lithographic mask or machining. In some implementations, the etching of the recesses of the substrate can be performed to at least one specified depth using at least one lithographic mask and at least one etch stop layer. In some implementations, the etch stop layer comprises one of Si Oxide, Si Nitride, or Al oxide.

In some implementations, one or more of the forming operations can be performed using a lithographic mask is one of photoresist, silicon oxide, or silicon nitride. In some implementations, the forming of the electrically conducting layer can be performed by sputtering, e beam evaporation, atomic layer deposition (ALD), Metal Organic Chemical Vapor Deposition (MOCVD) or electroplating. In some implementations, the standoff bumps can be thermally grown or deposited using one of LPCVD or PECVD.

In some implementations, the method of fabricating a quantum computing system may include depositing an adhesion layer on the electrically conducting layer. Here, the bonding elements can be formed on the adhesion layer. In some cases, the adhesion layer can include an electrically conducting material that is a superconducting material when the quantum computing system is operated. For example, the electrically conducting material of the adhesion layer can include one of Ti, Ta. In some cases, the adhesion layer can be deposited by one of sputtering, evaporation, or electroplating.

In some implementations, the bonding elements can be formed via one of sputtering, evaporation, or electroplating. In some implementations, the bonding elements are formed to be longer than the standoff bumps. In some cases, the bonding elements can be formed using one of lift-off resist, spray on resist, wet or dry etching.

In some implementations, the bonding of the substrate and the second substrate can be performed by applying pressure on one or both of the substrates to be bonded. In some cases, the standoff bumps can form a gap between the substrates to be bonded to control a bonding force. In some cases, a die bonder or a wafer bonder can be used to align and bond the substrates to be bonded. In some cases, the method of fabricating a quantum computing system may include dispersing nanoparticles over the bonding elements to break the oxide layers from both first and second substrates. For example, the nanoparticles can include diamond. As another example, the nanoparticles can have sharp edges to break oxide layers of the bonding elements. As yet another example, the dispersing of the nanoparticles can be performed by submersing the bonding elements in a solution containing the nanoparticles.

In some implementations, the bonding can result in a low DC-resistance contact between the bonded substrates.

In general, in a further aspect, the invention features a quantum computing apparatus that includes a quantum circuit device; and an interposer including (i) a connectorization layer that includes a plurality of terminals for connecting the quantum computing apparatus to a corresponding plurality of cables and a plurality of signal lines electrically coupled, via electrical contacts, to the plurality of terminals; and (ii) at least one intermediate layer between the quantum circuit device and the connectorization layer, the at least one intermediate layer including an integrated circuit layer, the at least one intermediate layer being electrically coupled to the signal lines of the interposer. Here, the interposer is configured to supply the quantum circuit device, during operation of the quantum computing apparatus, at least control signals and readout signals to and from the plurality of cables.

Implementations of the quantum computing apparatus may include one or more of the following features and/or features of other aspects. In some implementations, the integrated circuit layer can be integrated with the quantum circuit device. In some cases, the quantum circuit device can include a circuit wafer supporting a quantum circuit and the integrated circuit layer is wafer bonded to the circuit wafer. In some cases, the quantum circuit device can include a circuit wafer supporting a quantum circuit and the integrated circuit layer comprises a substrate bonded to the circuit wafer. For example, the substrate can be a printed circuit board (PCB), polyimide, or a ceramic layer. As another example, the substrate can be a silicon or a sapphire substrate.

In some implementations, the integrated circuit layer of the intermediate layers can include a directional coupling circuit. In some implementations, the integrated circuit layer of the intermediate layers comprises a quantum amplifier circuit. In some implementations, the integrated circuit layer of the intermediate layers can include a multiplexing circuit. In some implementations, the integrated circuit layer can include a circulator circuit or an isolator circuit.

In some implementations, quantum computing apparatus may include a plurality of bonding elements each connecting a corresponding electrical contact on a surface of the one or more intermediate layers with an electrical contact on a surface of the quantum circuit device. In some cases, each bonding element can be formed from a bonding ball or bonding bump during a flip chip process.

In some implementations, at least one of the intermediate layers can include vias each electrically coupling an electrical contact on one side of the layer with a corresponding electrical contact on the opposite side of the layer. In some implementations, the quantum circuit device can include a circuit wafer supporting a quantum circuit and the one or more intermediate layers comprise a material having a coefficient of thermal expansion (CTE) that substantially matches a CTE of the circuit wafer. In some cases, the material can be different from a material of the circuit wafer. For example, the material can be selected from the group consisting of BeO, Al$_2$O$_3$, AlN, Quartz and Sapphire. In some cases, the material can be the same as a material of the circuit wafer. For example, the bonding elements can include conductive metals.

In some implementations, the one or more intermediate layers can include an electrically conductive film. In some cases, the electrically conductive film can be formed from a material selected from the group consisting of indium, aluminum, copper, silver, or tin. In some implementations, the quantum circuit device can include a circuit wafer and the interposer can include an interposer material that is the same as a material of the circuit wafer.

In some implementations, the interposer can include through hole vias coated with an electrically conductive film. In some implementations, the interposer can include a printed circuit board (PCB). In some cases, the PCB supports the signal lines which can be wire bonded to electrical contacts on the quantum circuit device or the integrated circuit layer. For example, the PCB can have one or more physical holes acting as pass-throughs for the wire bonds from the signal lines of the PCB to the electrical contacts on the quantum circuit device or the integrated circuit layer. Further, the wire bonds from the signal lines of the PCB to the electrical contacts on the quantum circuit device or the integrated circuit layer can form (i) a connection for DC signals and MW signals, or (ii) a ground connection.

In some implementations, the connectorization layer can include an electrically conductive metal. In some cases, the electrically conductive metal is aluminum, copper or molybdenum. In some implementations, the connectorization layer can include a printed circuit board (PCB). In some implementations, the interposer can include a substrate attached to the connectorization layer by a layer of epoxy or eccosorb. In some implementations, the interposer can include a substrate coupled to the connectorization layer via alignment pins and registration marks.

In some implementations, the interposer can include a substrate and a thinnerposer positioned between the substrate and the connectorization layer. In some cases, the thinnerposer can include one or more compressible electrical contacts. In some cases, the compressible electrical contacts can include fuzz buttons. In some cases, the compressible electrical contacts can include a metal wool. In some cases, the compressible electrical contacts can be registered with corresponding electrical contacts on an adjacent surface of the substrate. In some cases, the compressible electrical contacts are registered with corresponding electrical contacts on an adjacent surface of the connectorization layer.

In general, in a further aspect, the invention features a method of forming an assembly for a quantum computing apparatus. Here, the method includes attaching an interposer to a circuit wafer for a quantum circuit device, the interposer including an integrated circuit layer and a connectorization layer including a plurality of terminals for connecting the quantum computing apparatus to a corresponding plurality of cables, the interposer being attached so that the integrated circuit layer is between the circuit wafer and the connectorization layer. Further, the interposer includes a plurality of signal lines electrically coupled, via electrical contacts, to the circuit wafer to supply, during operation of the quantum computing apparatus, at least control signals and readout signals to and from the plurality of cables.

Implementations of the method of forming an assembly for a quantum computing apparatus may include one or more of the following features and/or features of other aspects. In some implementations, the attaching of the interposer to the circuit wafer can include wafer bonding a wafer of the integrated circuit layer to the circuit wafer. In some cases, the interposer can be attached to the circuit wafer using a flip-chip method. In some cases, the interposer can be attached to the circuit wafer using a wire bonding method.

In some implementations, the integrated circuit layer can be attached to the circuit wafer using a flip-chip method. In some implementations, the integrated circuit layer can be attached to the circuit wafer using a wire bonding method.

Details of one or more implementations of the disclosed technologies are set forth in the accompanying drawings and the description below. Other features, aspects, descriptions and potential advantages will become apparent from the description, the drawings and the claims.

BRIEF DESCRIPTION OF THE DRAWINGS

FIGS. 5A-5C show aspects of a 2D microwave integrated quantum circuit that includes a circuit wafer and thru vias.

FIGS. 6A-6D show aspects of 2D microwave integrated quantum circuits that include a circuit wafer, thru vias, and one or more cap wafers of a single type.

Certain illustrative aspects of the systems, apparatuses, and methods according to the disclosed technologies are described herein in connection with the following description and the accompanying figures. These aspects are, however, indicative of but a few of the various ways in which the principles of the disclosed technologies may be employed and the disclosed technologies are intended to include all such aspects and their equivalents. Other advantages and novel features of the disclosed technologies may become apparent from the following detailed description when considered in conjunction with the figures.

DETAILED DESCRIPTION

Technologies are described for constructing and packaging microwave integrated quantum circuits to be used in quantum computing systems. Prior to describing example implementations of techniques for constructing and packaging microwave integrated quantum circuits, structural aspects and functional aspects of a quantum computing system are described.

Figure 1:
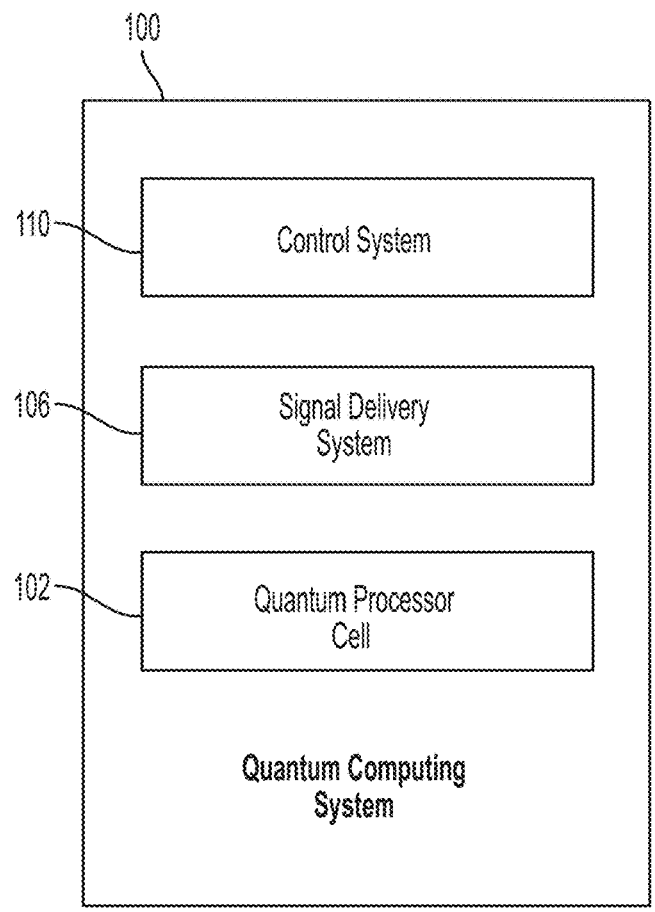
FIG. 1 is a block diagram of a quantum computing system.

FIG. 1 shows an example of a quantum computing system 100. The quantum computing system 100 includes a control system 110, a signal delivery system 106, and a quantum processor cell 102. More generally, quantum computing systems may include additional or different features, and the components of a quantum computing system may operate as described with respect to FIG. 1 or in another manner.

The quantum computing system 100 shown in FIG. 1 can perform quantum computational tasks by executing quantum algorithms (e.g., step-by-step procedures for solving a problem on a quantum computer). In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. Coupler devices can be used to perform quantum logic operations on single qubits or conditional quantum logic operations on multiple qubits. In some instances, the conditional quantum logic can be performed in a manner that allows large-scale entanglement within the quantum computing device. Control signals can manipulate the quantum states of individual qubits and the joint states of multiple qubits. In some instances, information can be read out from the composite quantum system by measuring the quantum states of the individual qubits.

In some implementations, the quantum computing system 100 can operate using gate-based models for quantum computing. In some models, fault-tolerance can be achieved by applying a set of high-fidelity control and measurement operations to the qubits. For example, topological quantum error correction schemes can operate on a lattice of nearest-neighbor-coupled qubits. In some instances, these and other types of quantum error correcting schemes can be adapted for a two- or three-dimensional lattice of nearest-neighbor-coupled qubits, for example, to achieve fault-tolerant quantum computation. The lattice can allow each qubit to be independently controlled and measured without introducing errors on other qubits in the lattice. Adjacent pairs of qubits in the lattice can be addressed, for example, with two-qubit gate operations that are capable of generating entanglement, independent of other pairs in the lattice.

In some implementations, the quantum computing system 100 is constructed and operated according to a scalable quantum computing architecture. For example, in some cases, the architecture can be scaled to a large number of qubits to achieve large-scale general purpose coherent quantum computing. In some instances, the architecture is adaptable and can incorporate a variety of modes for each technical component. For example, the architecture can be adapted to incorporate different types of qubit devices, coupler devices, readout devices, signaling devices, etc.

The quantum processor cell 102 includes qubit devices that are used to store and process quantum information. In some instances, all or part of the quantum processor cell 102 functions as a quantum processor, a quantum memory, or another type of subsystem. The quantum processor cell 102 can be implemented, for example, based on the examples described below or in another manner.

In the quantum processor cell 102, the qubit devices each store a single qubit (a bit of quantum information), and the qubits can collectively define the computational state of a quantum processor or quantum memory. The quantum processor cell 102 may also include readout devices that selectively interact with the qubit devices to detect their quantum states. For example, the readout devices may generate readout signals that indicate the computational state of the quantum processor or quantum memory. The quantum processor cell 102 may also include coupler devices that selectively operate on individual qubits or pairs of qubits.

For example, the coupler devices may produce entanglement or other multi-qubit states over two or more qubits in the quantum processor cell 102.

In some implementations, the quantum processor cell 102 processes the quantum information stored in the qubit devices by applying control signals to the qubit devices or to the coupler devices housed in the quantum processor cell. The control signals can be configured to encode information in the qubit devices, to process the information by performing logical gates or other types of operations, or to extract information from the qubit devices. In some examples, the operations can be expressed as single-qubit gates, two-qubit gates, or other types of logical gates that operate on one or more qubit devices. A sequence of operations can be applied to the qubit devices to perform a quantum algorithm. The quantum algorithm may correspond to a computational task, a quantum error correction procedure, a quantum state distillation procedure, or a combination of these and other types of operations.

The signal delivery system 106 provides communication between the control system 110 and the quantum processor cell 102. For example, the signal delivery system 106 can receive control signals (e.g., qubit control signals, readout control signals, coupler control signals, etc.) from the control system 110 and deliver the control signals to the quantum processor cell 102. In some instances, the signal delivery system 106 performs preprocessing, signal conditioning, or other operations to the control signals before delivering them to the quantum processor cell 102. In many instances, the signal delivery system 106 includes an interposer which provides electrical connections between the quantum processor cell 102 and cables (or other signal lines) to the control system 110.

The control system 110 controls operation of the quantum processor cell 102. The control system 110 may include data processors, signal generators, interface components and other types of systems or subsystems. In some cases, the control system 110 includes one or more classical computers or classical computing components.

Various implementations of the quantum processor cell 102 are described below, including various embodiments of its components along with various methods for fabricating the quantum processor cell and its components.

Figure 2A:
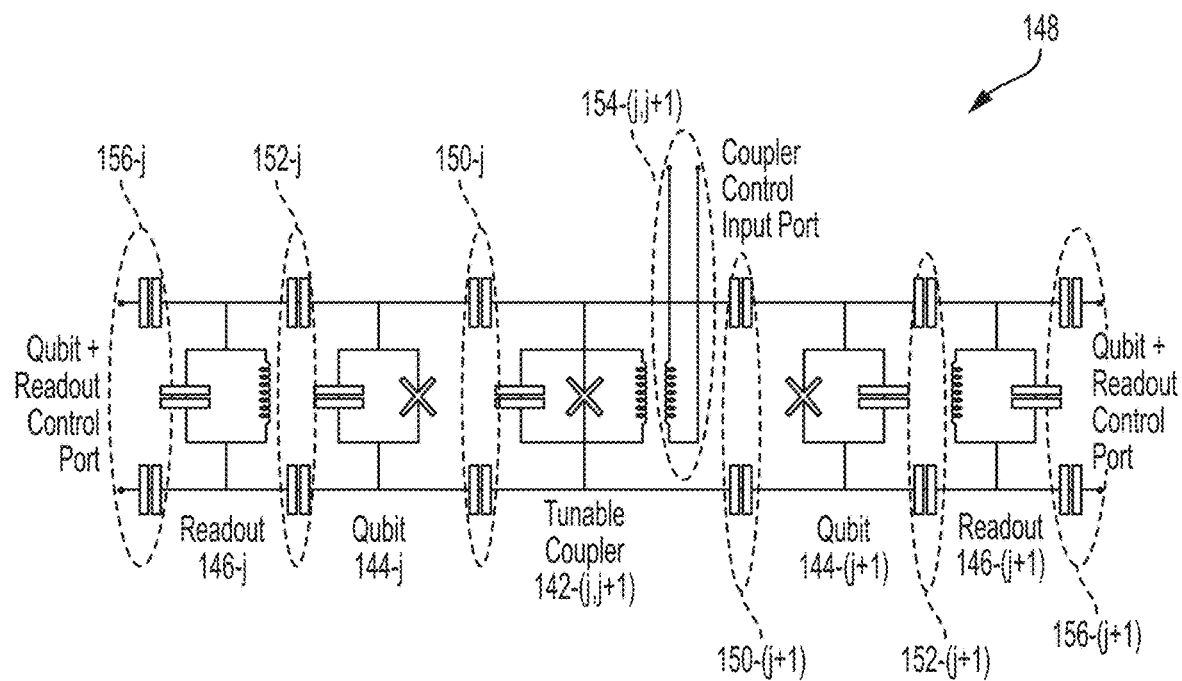
FIG. 2A shows an equivalent circuit of a portion of a microwave integrated quantum circuit.

While generally the quantum processor cell 102 can be implemented using a variety of different qubit devices, readout devices, and coupler devices, FIG. 2A shows an equivalent circuit of an example of a microwave integrated quantum circuit 148 that can be used to perform quantum operations. Here, the microwave integrated quantum circuit 148 includes a subset of qubit devices 144, their corresponding readout devices 146 and a subset of the coupler devices 142 from the quantum processor cell 102. In this example, the microwave integrated quantum circuit 148 includes qubit devices 144-$j$ and 144-($j$+1), corresponding readout devices 146-$j$ and 146-($j$+1), and a tunable coupler device 142-($j,j$+1) disposed between the qubit devices 144-$j$ and 144-($j$+1). In the example shown in FIG. 2A, each of the qubit devices 144-$j$ and 144-($j$+1) is capacitively coupled to the coupler device 142-($j,j$+1) by respective differential capacitances 150-$j$ and 150-($j$+1). Also, each of the qubit devices 144-$j$ and 144-($j$+1) is capacitively coupled to its respective readout device 146-$j$ and 146-($j,j$+1) by respective differential capacitances 152-$j$ and 152-($j$+1).

Figure 3A:
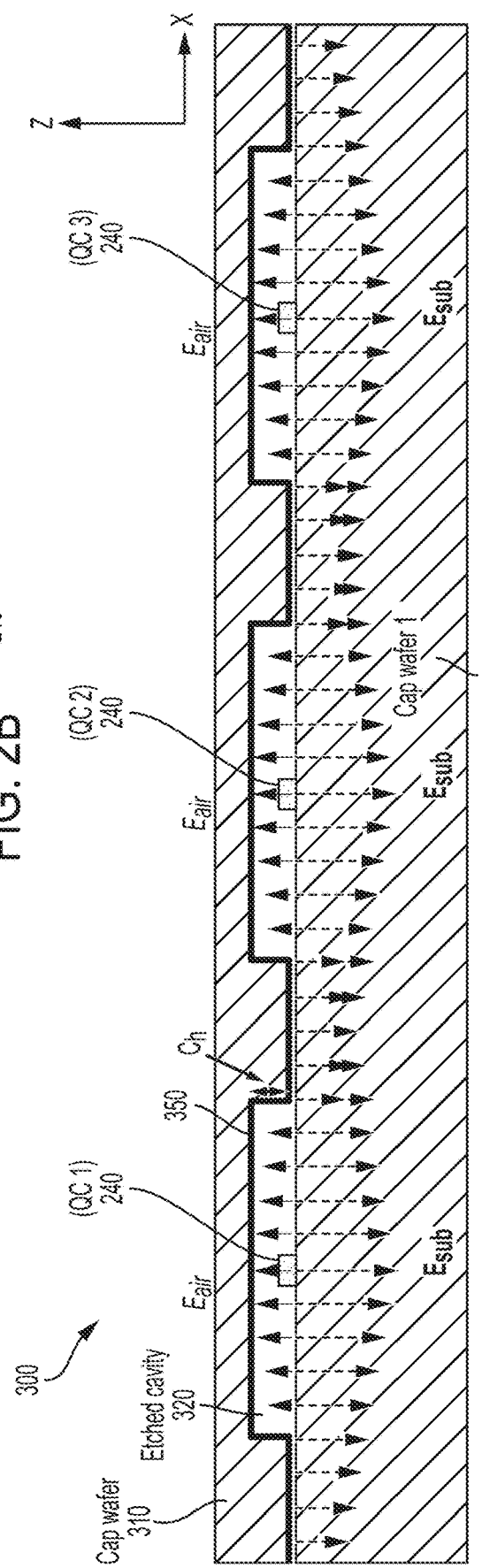
FIGS. 3A-3D show aspects of a 2D microwave integrated quantum circuit that includes a circuit wafer and a cap wafer.

Write signals (e.g., coupler control signals, qubit control signals, readout control signals, etc.) can be transmitted from the control system 110, through the signal delivery system 106, to various input ports of the microwave integrated quantum circuit 148. An example of such input port is shown in FIG. 2A as a coupler control input port 154-($j, j$+1). In this manner, the tunable coupler device 142-($j,j$+1) is inductively coupled with a source of coupler control signals at the coupler control input port 154-($j,j$+1). Other examples of input ports are shown in FIG. 3A as qubit+readout control port 156-$j$ and qubit+readout control port 156-($j$+1). In this manner, each of the readout devices 146-$j$ and 146-$j$+1 is capacitively coupled to a source of qubit control signals and a source of readout control signals at the respective qubit+readout control ports 156-$j$ and 156-($j$+1). Additionally, readout signals (e.g., qubit readout signals) are received by the control system 110, through the system delivery system 106, from various output ports in the microwave integrated quantum circuit 148. In the example microwave integrated quantum circuit 148 shown in FIG. 2A, the qubit+readout control ports 156-$j$ and 156-($j$+1) also are used as output ports. Note that the control signals and the readout signals used to operate the quantum circuit devices of the microwave integrated quantum circuit 148 and of other microwave integrated quantum circuits disclosed in this specification have frequencies in the microwave frequency range. As such, the term operating frequency $f_O$ of a quantum circuit device, as used in this specification, represents a microwave frequency of a control signal or a readout signal used to operate quantum circuit devices of a microwave integrated quantum circuits disclosed in this specification.

Each of the qubit devices 144-$j$, 144-($j$+1) includes a Josephson junction (represented by the symbol "X" in FIG. 2A) and a shunt capacitance. Qubit devices 144-$j$, 144-($j$+1) can be implemented as transmon qubits, as flux qubits or as fluxonium qubits, as described in connection with FIG. 3B of PCT application publication WO 2015/178990, the content of which is incorporated herein by reference. In the example shown in FIG. 2A, the tunable coupler device 142-($j,j$+1) includes a Josephson junction (represented by the symbol "X" in FIG. 2A), a shunt inductance and a shunt capacitance. A tunable coupler device 142 can be implemented as a fluxonium coupler 170, as described in connection with FIG. 3B of PCT application publication WO 2015/178990.

The portion of the microwave integrated quantum circuit 148 illustrated in FIG. 2A can be copied multiple times, e.g., as a unit cell, to extend the microwave integrated quantum circuit 148 along a path (e.g., along x-axis of a Cartesian coordinate system), on a surface (e.g., x-y plane of a Cartesian coordinate system) or in space (e.g., as layers parallel to x-y plane that are distributed along a z-axis of a Cartesian coordinate system). For example, fault-tolerance quantum computing can be achieved by implementing gate-based models in a two-dimensional (2D) microwave integrated quantum circuit 148 that includes a large number of nearest-neighbor coupled qubit devices 144. A 2D microwave integrated quantum circuit 148 can allow each qubit device 144 to be independently controlled and measured without introducing crosstalk or errors on other qubit devices 144 in the 2D microwave integrated quantum circuit. Nearest-neighbor pairs of qubit devices 144 in the 2D microwave integrated quantum circuit 148 should be addressable with two-qubit gate operations capable of generating entanglement, independent of all other such pairs in the 2D microwave integrated quantum circuit 148. Exemplary implementations of 2D microwave integrated quantum circuits 200, 300, 400, 500, 600A, 600B are described below in connection with FIGS. 2B, 3A, 4A, 5A, 6A, 6B, respectively. As another example, fault-tolerant quantum computing can likewise be performed, and possibly advantageous, in a three-dimensional (3D) microwave integrated quantum circuit 148M that includes a large number of nearest-neighbor coupled qubit devices 144. Exemplary implementations of 3D microwave integrated quantum circuits 400M, 600AM, 600BM are described below in connection with FIGS. 4E, 6E, 6F, respectively.

A variety of technical features may be used (alone or in combination) in microwave integrated quantum circuits to carry out large-scale, fault tolerant quantum computing. One such feature is the delivery of control signals to qubit devices 144 and tunable coupling devices 142 of a 2D microwave integrated quantum circuit 148 or a 3D microwave integrated quantum circuit 148, and another such feature is the extraction of measurement signals from the qubit devices 144 being performed with low-crosstalk of the applied signals from target qubit devices to non-target qubit devices. Another such feature is the ability to sustain coherence of individual and entangled quantum states of the qubit devices 144 of the 2D microwave integrated quantum circuit 148 or the 3D microwave integrated quantum circuit 148. Yet another such feature is the shielding and isolation of the qubit device 144-$j$ from external noise, from the external environment, and from each other qubit device 144-($j$+k) in the 2D microwave integrated quantum circuit 148 or the 3D microwave integrated quantum circuit 148 to which the qubit device 144-$j$ is not specifically coupled (k≠0 or ±1) for performing a two-qubit gate.

Figure 2B:
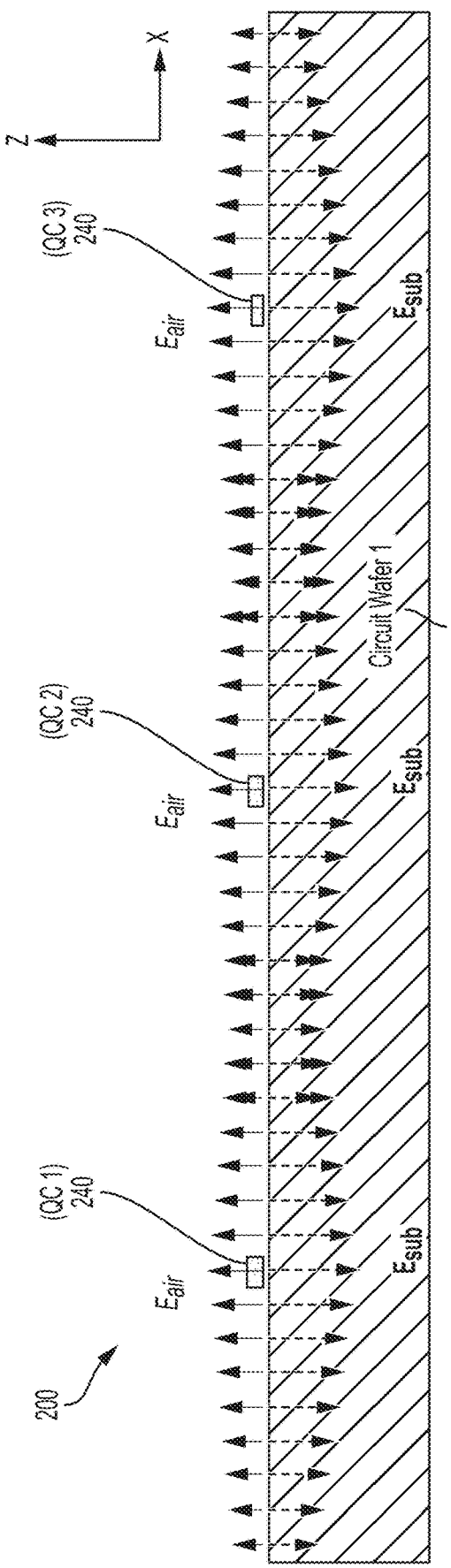
FIG. 2B shows a two dimensional (2D) microwave integrated quantum circuit that includes a circuit wafer.

For instance, FIG. 2B shows a 2D microwave integrated quantum circuit 200, similar to the microwave integrated quantum circuit 148, including quantum circuit devices 240 fabricated on a first substrate 210. As the first substrate supports the quantum circuit devices 240, it will also be referred to as the circuit wafer 210. Note that, in this example, microwave signals used to operate each of the quantum circuit devices 240 of 2D microwave integrated quantum circuit 200 can propagate to nearest-neighbor quantum circuit devices, and beyond, as illustrated in FIG. 2B by the appearance of the in-air electric field spatial distribution $E_{air}$ and in-substrate electric field spatial distribution $E_{sub}$ of the operating signals. Additionally, the quantum circuit devices 240 of 2D microwave integrated quantum circuit 200 are exposed to the external electromagnetic environment.

In some implementations, quantum circuit devices 240 can be isolated (e.g., exponentially) from each other using one encapsulation substrate or a pair of encapsulation substrates lined with an electrically conducting layer that is grounded during operation of the microwave integrated quantum circuits (see, e.g., 2D microwave integrated quantum circuits 300, 400 and 3D microwave integrated quantum circuit 400M, described below). Here, recesses of the encapsulation substrates are sized to cause available modes of the recesses to evanesce with respect to relevant operating frequencies of the encapsulated quantum circuit devices 240. In certain implementations, quantum circuit devices 240 can be isolated from each other using electrically conducting thru vias formed in the circuit wafer 210 of the 2D microwave integrated quantum circuit, where the electrically conducting thru vias are grounded during operation of the microwave integrated quantum circuit (see, e.g., 2D microwave integrated quantum circuit 500, described below). Here, the electrically conducting thru vias are distributed around a respective footprint of each quantum circuit device 240 to cause available modes of the electrically conducting thru via distribution to evanesce with respect to relevant operating frequencies of the surrounded quantum circuit device. In some implementations, a combination of an encapsulation substrate and electrically conducting thru vias distributed around each recess of the encapsulation substrate is used to isolate from each other quantum circuit devices 240 (see, e.g., 2D microwave integrated quantum circuits 600A, 600B, and 3D microwave integrated quantum circuits 600AM, 600BM, described below). In this manner, the quantum circuit devices 240 can be shielded and isolated from their nearest neighbors and from the external electromagnetic environment.

Figure 3B:
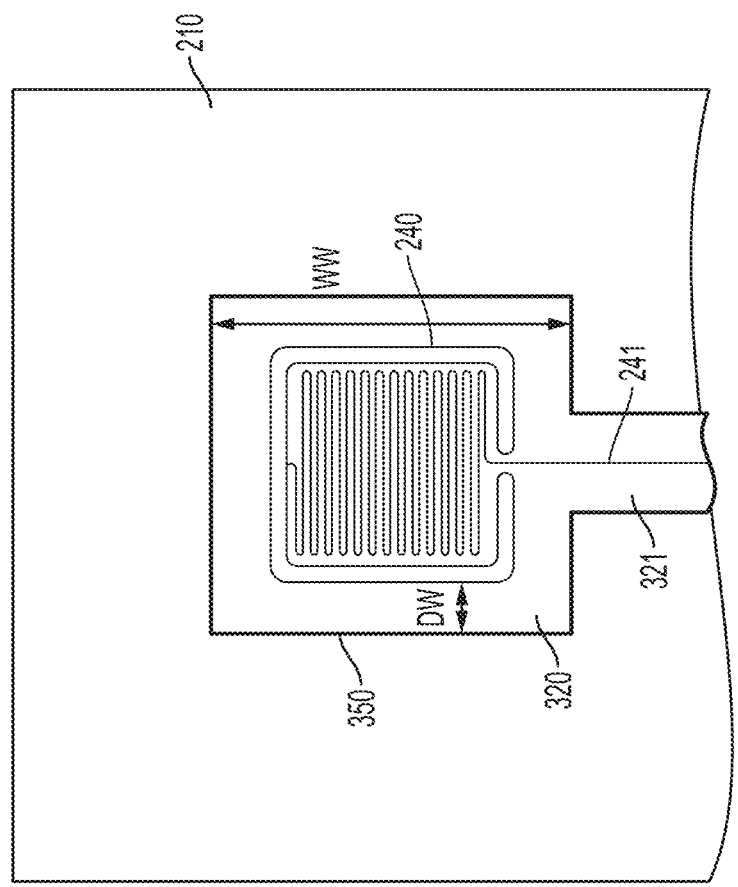

FIG. 3A is a side view of a 2D microwave integrated quantum circuit 300, and FIG. 3B is a top view of the same in the vicinity of one of a plurality of quantum circuit devices 240 included in the 2D microwave integrated quantum circuit. Here, the 2D microwave integrated quantum circuit 300 includes a first substrate 210, also referred to as a circuit wafer, such that the quantum circuit devices 240 are disposed on a first surface of the circuit wafer 210. Each quantum circuit device QC-$j$ 240, where $j$=1, 2, 3, ..., has an associated operating frequency $f_O$-$j$. In some implementations, the operating frequencies of the quantum circuit devices 240 are different from each other. In other implementations, at least some of the quantum circuit devices 240 have common operating frequencies.

The 2D microwave integrated quantum circuit 300 further includes a second substrate 310 having a first surface that defines recesses 320 of the second substrate that correspond to the quantum circuit devices 240 disposed on the circuit wafer 210. In this manner, the circuit wafer 210 and second substrate 310 are arranged such that each recess 320 of the second substrate forms an enclosure that houses a respective quantum circuit device 240. A dimension $C_h$, e.g., along the z-axis, of each recess 320 can be in a range of 5-500 μm (e.g., 20-200 μm) for a thickness of the second substrate 210 in a range of 1μm to 1 mm. As the second substrate 310 "caps" the quantum circuit devices 240 disposed on the circuit wafer 210, the second substrate will be referred to as the cap wafer 310. Note that the cap wafer 310 is bonded to the circuit wafer 210, as described below in connection with FIGS. 14A-14B, 15 and 16. In addition, spacers (or standoff bumps) may be used between the bonded cap wafer 310 and circuit wafer 210, as described below in connection with FIGS. 12, 13A-13B, 14A-14B, 15 and 16.

Additionally, the 2D microwave integrated quantum circuit 300 includes an electrically conducting layer 350 that covers at least a portion of each of the recesses 320 of the cap wafer 310. In some implementations, the electrically conducting layer 350 includes a material (e.g., Al, In, Ti, Pn, Sn, etc.) that is superconducting at an operating temperature of the 2D microwave integrated quantum circuit 300. In other implementations, the electrically conducting layer 350 includes a material that has normal conductance (i.e., it is an electrical conductor but not superconducting) at the operating temperature of the 2D microwave integrated quantum circuit 300. In this manner, the 2D microwave integrated quantum circuit 300 can be operated at cryogenic temperatures (e.g., using liquid helium) and the electrically conducting layer 350 (or at least a portion thereof) can operate as a superconducting layer at that temperature. In addition, during operation of the 2D microwave integrated quantum circuit 300, the electrically conducting layer 350 is grounded.

Moreover, each recess 320 is configured (e.g., sized) to suppress propagation inside the recess of electromagnetic waves that have frequencies "f" below a cutoff frequency $f_C$, $f<f_C$, where the cutoff frequency $f_C$ is larger than the operating frequency $f_O$, $f_O<f_C$, of the respective encapsulated quantum circuit device 240. The noted suppression of the propagation of the recess modes is illustrated in FIG. 3A by the relative appearance of the in-air electric field spatial distribution $E_{air}$ and in-substrate electric field spatial distribution $E_{sub}$ of operating signals. Note that because the cutoff frequency $f_C$ is larger than the operating frequency $f_O$, the enclosure formed by the recess 320 is a non-resonant cavity relative to operation of the encapsulated quantum circuit device 240.

In this manner, a lateral dimension WW of a recess 320 is smaller than a maximum distance $L_{MAX}$ corresponding to the cutoff frequency $f_C$. For example, the lateral dimension WW of a recess 320 can be in the range of 20 µm and 2 mm. Additionally, a distance DW between the outer perimeter of the encapsulated quantum circuit device 240 and a nearest wall of the recess 320 corresponds to a value of a capacitance between the encapsulated quantum circuit device and the portion of the electrically conducting layer 350 that covers the wall of the recess.

Moreover, adjacent quantum circuit devices 240 disposed on the circuit wafer 210 can be coupled electromagnetically through a coupling line that includes an electrical conductor 241 extending along the first surface of the circuit wafer over at least a portion of the distance between the adjacent quantum circuit devices. The coupling between the adjacent quantum circuit devices 240 can be capacitive or direct. Note that at least a portion of the coupling line is encapsulated by a trench 321 of the cap wafer 310, as illustrated in FIG. 3B.

The use of the cap wafer 310 can improve coherence times of the quantum circuit devices 240 disposed on the circuit wafer 210. Quantum circuit devices 240 with long coherence times are useful for the realization of a robust quantum processor cell 106. The cap wafer 310 can improve coherence times of the quantum circuit devices 240 of the 2D microwave integrated quantum circuit 300 relative to the 2D microwave integrated quantum circuit 200 by decreasing the participation ratio of the circuit wafer 210 (which is lossy at microwave frequencies) and increase that of the air (which is lossless) so that more of the field resides in air, thus improving the coherence time of the quantum circuit devices 240. To estimate the improvement in coherence time due to cap wafer 310 we consider a dimension $C_h$ of the recess 320 of the cap wafer 310 on top of a silicon circuit wafer 210 of a given thickness. The participation ratios of the substrate $P_{sub}$ and air $P_{air}$ are defined as $$P_{air} = \frac{E_{air}}{E_{air} + E_{sub}}, \quad (1)$$

$$P_{sub} = \frac{E_{sub}}{E_{air} + E_{sub}}. \quad (2)$$

where $E_{air} = \int dv \epsilon_{air} |E_{air}|^2$ and $E_{sub} = \int dV \epsilon_{sub} |E_{sub}|^2$ are energies stored in the electric field in air $E_{air}$ and in the circuit wafer 210 $E_{sub}$, respectively.

The loss in the circuit wafer 210 can be described by the quality factor $Q_\Sigma$. In general, the dissipation factor (the loss-rate of energy) is related to the tangent $\delta$ via $$\frac{1}{Q_\Sigma} = \sum_j P_j \tan \delta_j. \quad (3)$$

The coherence time $T_1$ can be expressed in terms of the quality factor as $$T_1 = \frac{Q_\Sigma}{\omega} = \frac{1}{\omega P_{sub} \tan \delta_{sub}}, \quad (4)$$

where $\omega$ is the operating frequency of a quantum circuit device 240.

The participation ratio of air can be increased by tuning the dimension $C_h$ of the recess 320 of the cap wafer 310 as compared to the thickness of the circuit wafer 210. Simulations show that a more concentrated field in air is observed when the dimension $C_h$ of the recess 320 is smaller than the thickness of the circuit wafer 210.

Figure 3C:
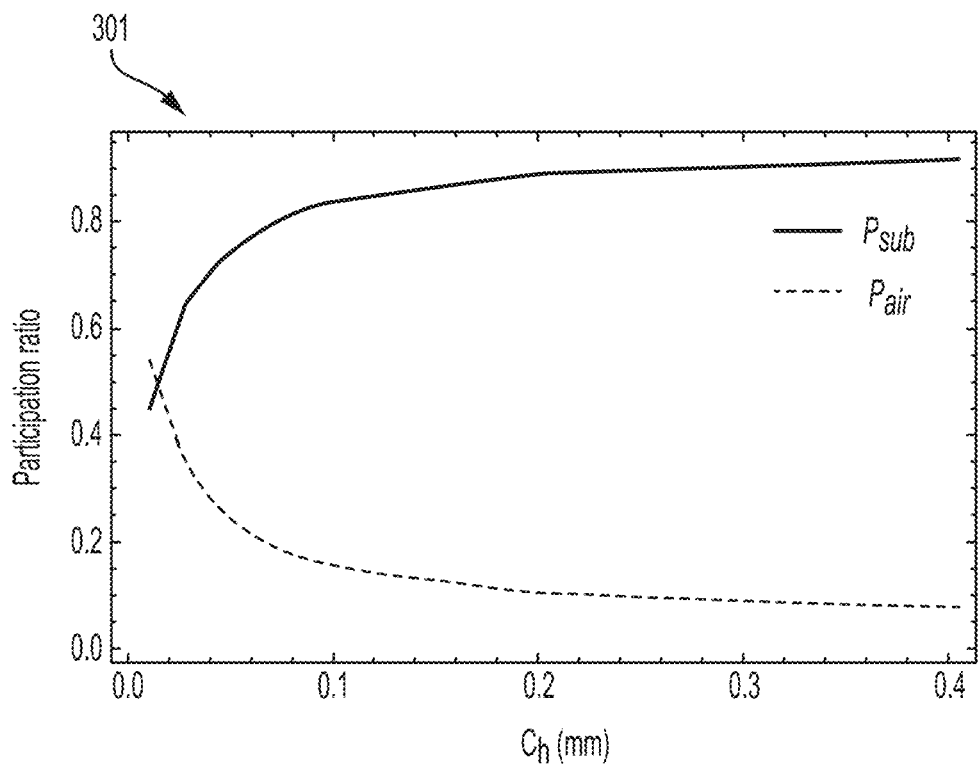

FIG. 3C is a plot 301 that shows that for a thickness of the circuit wafer 210 of 100 µm, the participation ratio of the circuit wafer decreases as the dimension $C_h$ of the recess 320 of the cap wafer 310 decreases. This effect is substantial when the dimension $C_h$ of the recess 320 is below 50 µm. Note that the dimension $C_h$ of the recess 320 cannot be decreased indefinitely due to the possibility of other undesired effects such as surface loss.

Figure 3D:
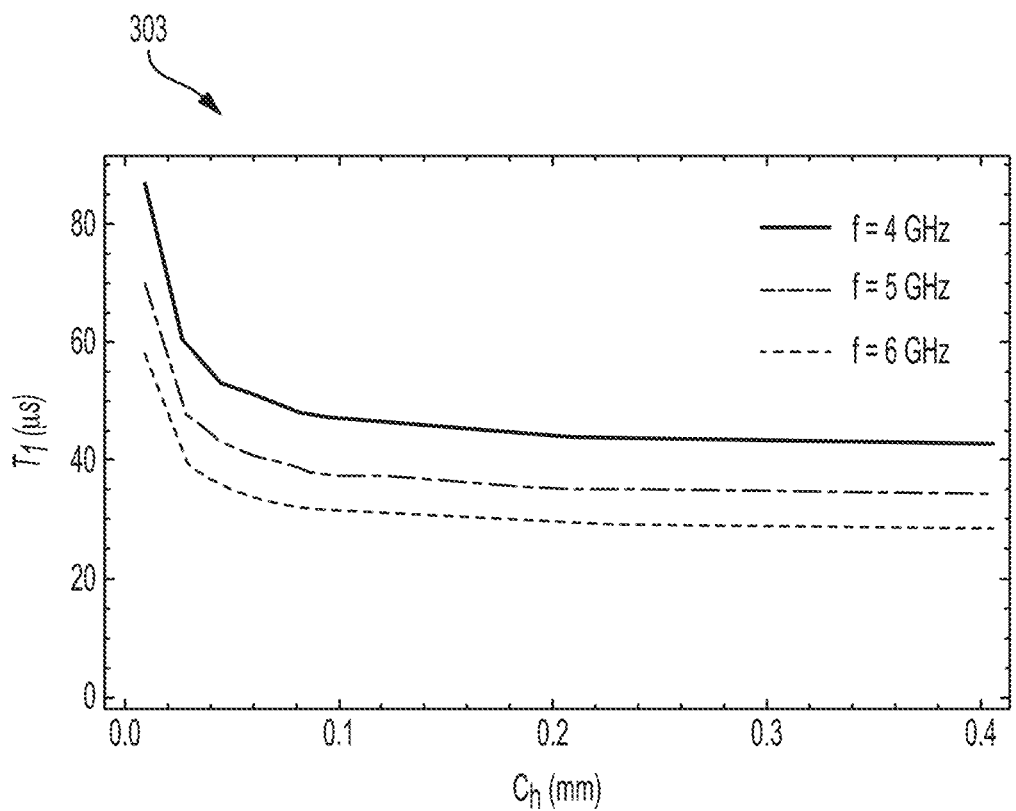

FIG. 3D is a plot 303 that shows dependence of the coherence time $T_1$ versus the dimension $C_h$ of the recess 320 of the cap wafer 310, for multiple operating frequencies $f_O$ of quantum circuit devices 240 enclosed by the recess 320. A comparison of plots 301 and 303 suggests that the coherence time $T_1$ increases as the participation ratio of the circuit wafer 210 decreases. The participation ratio of air can be further improved by sandwiching the circuit wafer 210 between a pair of cap wafers, as described below.

Figure 4A:
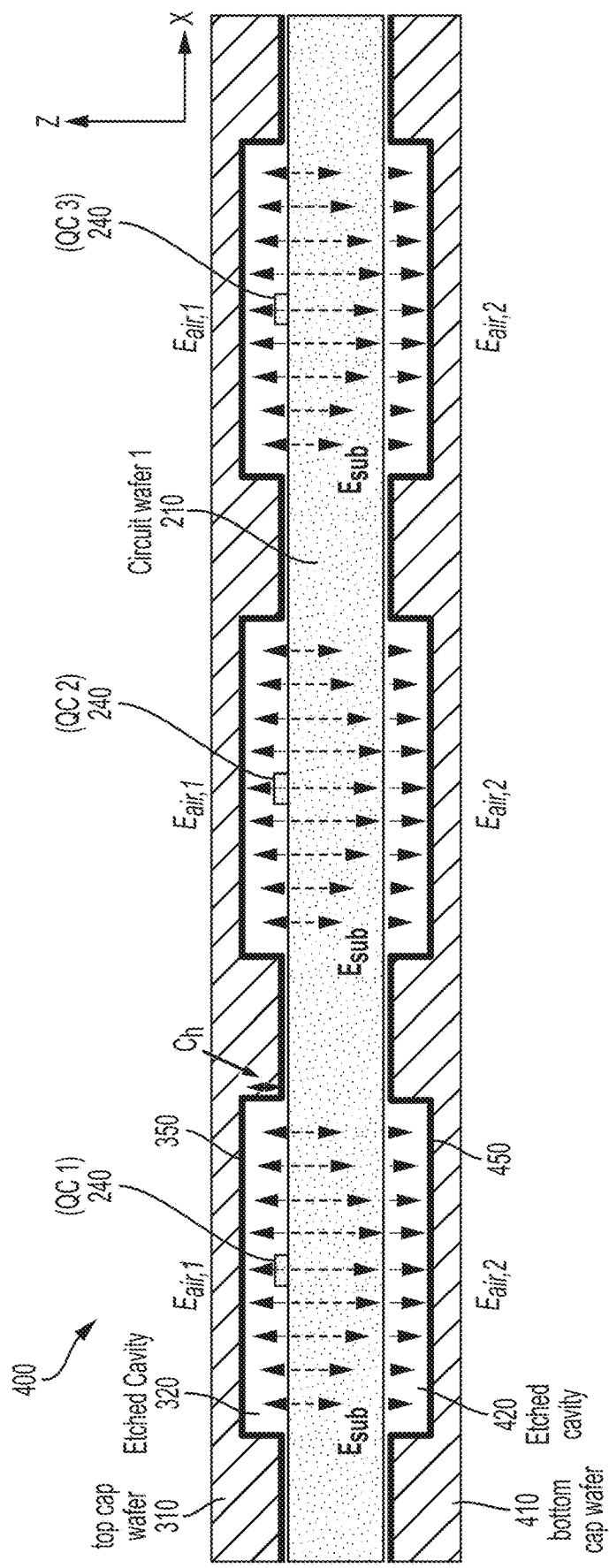
FIGS. 4A-4D show aspects of a 2D microwave integrated quantum circuit that includes a circuit wafer and two cap wafers of a single type.

FIG. 4A is a side view of a 2D microwave integrated quantum circuit 400 that includes a third substrate 410, also referred to as a second cap wafer, in addition to the circuit wafer 210 that supports on its first surface quantum circuit devices 240 and the cap wafer 310 described above in connection with FIGS. 3A-3B. The second cap wafer 410 has a first surface that defines recesses 420 of the third substrate that also correspond to the quantum circuit devices 240 disposed on the circuit wafer 210. Here, the circuit wafer 210 is sandwiched between the cap wafer 310 and the second cap wafer 410. Moreover, the cap wafer 310 and the second cap wafer 410 are arranged such that each recess 420 of the second cap wafer 410 forms with a back surface of the circuit wafer an enclosure that registers with a respective recess 320 that houses an associated quantum circuit device 240. Note that the second cap wafer 410 is bonded to the circuit wafer 210, as described below in connection with FIGS. 15 and 16. In addition, spacers (or standoff bumps) may be used between the bonded cap wafer 310 and circuit wafer 210, as described below in connection with FIGS. 12, 13A-13B, 15 and 16.

Additionally, the 2D microwave integrated quantum circuit 400 includes an electrically conducting layer 450 that covers at least a portion of each of the recesses 420 of the second cap wafer 410. In some implementations, the electrically conducting layer 450 includes a material (e.g., Al, In, Ti, Pn, Sn, etc.) that is superconducting at an operating temperature of the 2D microwave integrated quantum circuit 400. In other implementations, the electrically conducting layer 450 includes a material that has normal conductance (i.e., it is electrically conducting but not superconducting) at the operating temperature of the 2D microwave integrated quantum circuit 400. In this manner, the 2D microwave integrated quantum circuit 400 can be operated at cryogenic temperatures (e.g., using liquid helium) and the electrically conducting layer 450 (or at least a portion thereof) can operate as a superconducting layer at that temperature. In addition, during operation of the 2D microwave integrated quantum circuit 400, both electrically conducting layers 350 and 450 are grounded.

Moreover, each recess 420 is configured (e.g., sized) to suppress, inside the recess and across a volume of the circuit wafer 210 that is sandwiched between the recesses 320 and 420, propagation of electromagnetic waves that have frequencies "f" below the cutoff frequency $f_C$, $f<f_C$. The noted suppression of the propagation of the recess modes and of the substrate modes is illustrated in FIG. 4A by the relative appearance of the in-air electric field spatial distribution $E_{air}$ and in-substrate electric field spatial distribution $E_{sub}$ of operating signals. Note that because the cutoff frequency $f_C$ is larger than the operating frequency $f_O$, the enclosure formed by the recess 420 also is a non-resonant cavity relative to operation of the quantum circuit device 240 encapsulated in the non-resonant cavity formed by the recess 320.

Performance of the quantum circuit devices 240 of the 2D microwave integrated quantum circuit 400 can improve relative to the 2D microwave integrated quantum circuit 300 in the following manner. A participation ratio of the 2D microwave integrated quantum circuit 400 is given by $$P_k = \frac{E_k}{E_{air,1} + E_{air,2} + E_{sub}}, \quad (5)$$

where $E_{air,1}=\int dv \epsilon_{air,1}|E_{air,1}|^2$, $E_{air,1}=\int dv \epsilon_{air,1}|E_{air,1}|^2$, and $E_{sub}=\int dV \epsilon_{sub}|E_{sub}|^2$ are energies stored in the electric field in air $E_{air,1}$ confined by the top recess 320, electric field in air $E_{air,2}$ confined by the bottom recess 420, and electric field confined in the circuit wafer 210, respectively.

Figure 4B:
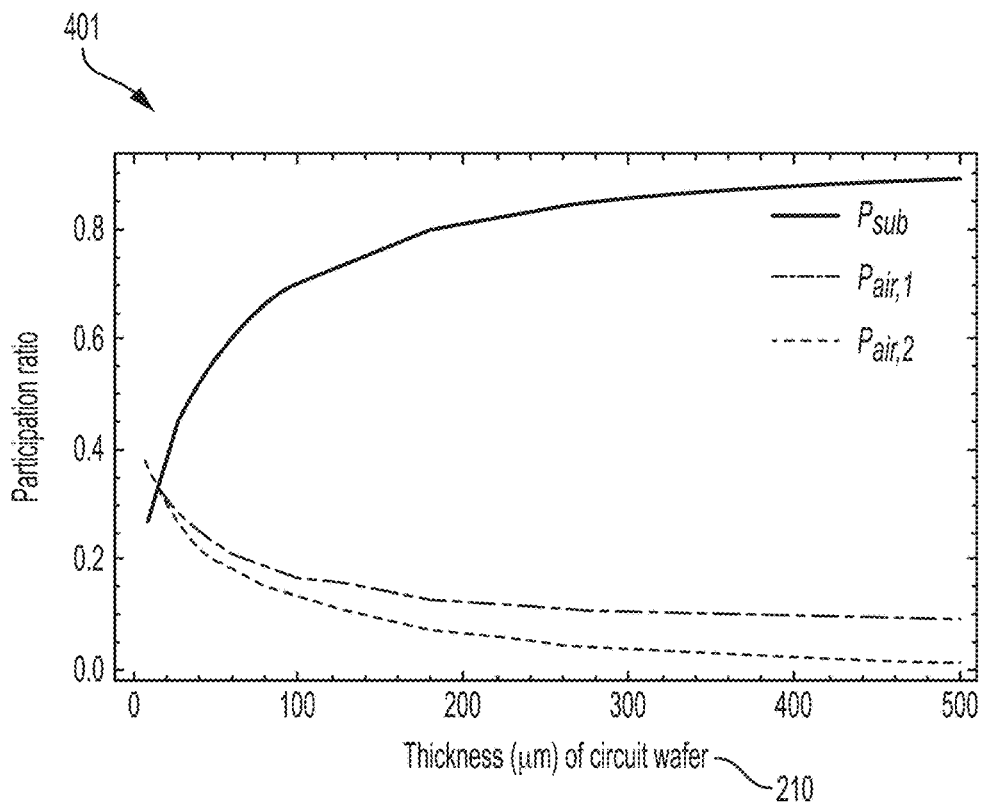

The participation ratio of the circuit wafer 210, in general, increases as its thickness increases. For example, for a fixed $C_h$ dimension of the top recess 320 and the bottom recess 320 of 100 μm, the participation ratio of the circuit wafer 210 can be as low as 70% for a circuit wafer of thickness 100 μm. FIG. 4B is a plot 401 that shows that the participation ratio goes up to 90% when the thickness of the circuit wafer 210 is increased to 500 μm. This is because when the circuit wafer 210 is thick, most of the electric field emitted by the enclosed quantum circuit device 240 will be stored in the substrate.

Figure 4C:
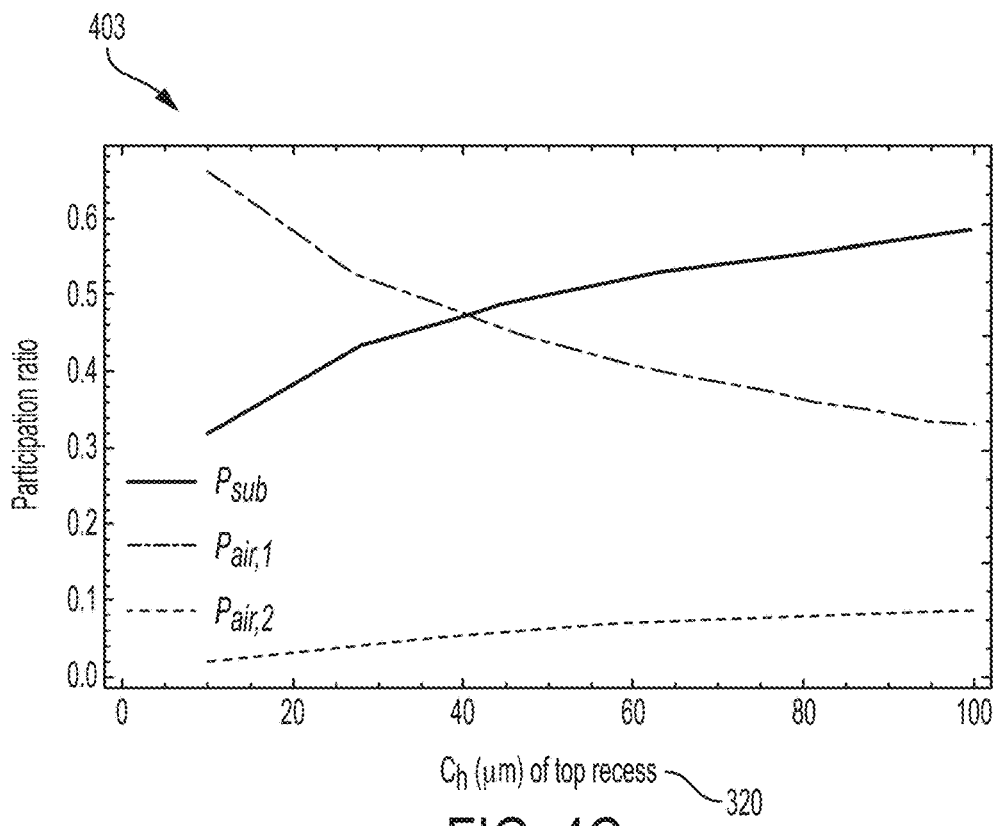

Note that the participation ratio strongly depends on the dimension $C_h$ of the top and bottom recesses 320 and 420. The smaller the dimension $C_h$ of the top recess 320, the larger the participation ratio of air, and the smaller the participation ratio of the circuit wafer 210. FIG. 4C is a plot 403 that shows that fixing the thickness of the circuit wafer 210 at 100 μm (a minimum thickness such that the circuit wafer is mechanically robust and reasonable to handle in microfabrication processes), the participation ratio of the circuit wafer can go below 50% for a dimension $C_h$ of the top recess 320 of less than 50 μm and a dimension $C_h$ of the bottom recess 420 of 500 μm. In fact, the participation ratio of the circuit wafer 210 can be significantly reduced by using dimensions $C_h$ of the top and bottom recesses 320, 420 less than 50 μm along with a thin (less than 200 μm) thick circuit wafer 210. It is therefore beneficial to use two cap wafers 310, 410 to decrease the participation ratio of circuit wafer 210, albeit fabrication and bonding subtleties. Alternatively, the thickness of the circuit wafer 210 can be extremely thin (e.g., less than 10 μm) to reduce or minimize the participation ratio of the circuit wafer. Such a 2D microwave integrated quantum circuit can be fabricated on a thin membrane made of a low-loss material such as high quality silicon oxide or silicon nitride membranes.

Figure 4D:
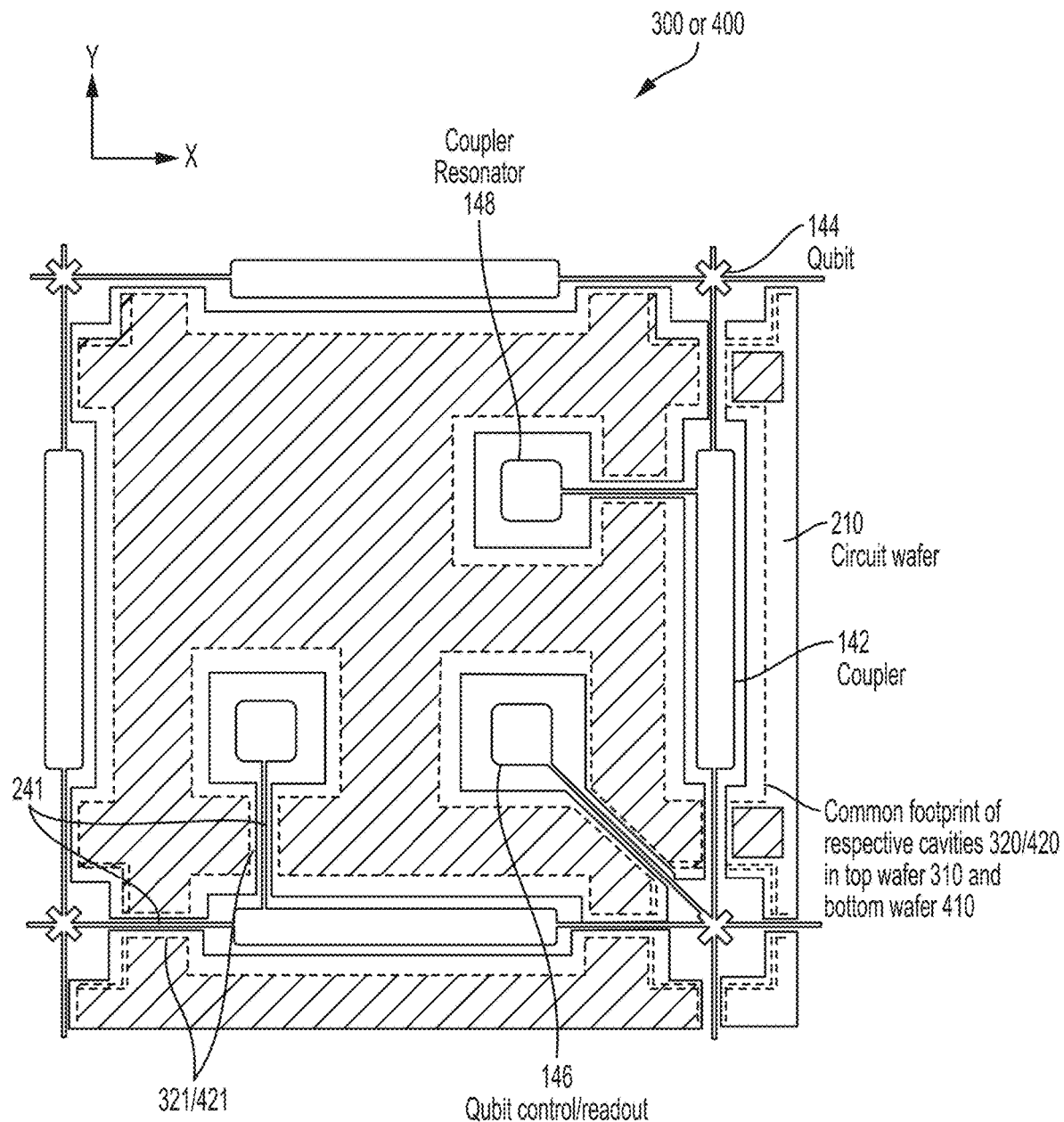

FIG. 4D is a top view of either the 2D microwave integrated quantum circuit 300 or the 2D microwave integrated quantum circuit 400. Here, it is shown that the 2D microwave integrated quantum circuit 300/400 can be scaled to a large number of quantum circuit devices 240 that include multiple qubits 144, resonators 146, 148, tunable couplers 142, etc. Here, distances between adjacent qubits 144 can be in the range of 0.5-5 mm, for instance. Note that recesses 320 of the (top) cap wafer 310 enclose each quantum circuit device 240 formed on the circuit wafer and trenches 321 (which are recesses with large aspect ratio) of the (top) cap wafer enclose the coupling lines 241. Further note that in the case of 2D microwave integrated quantum circuit 400, the contours representing the recess walls can be the common footprint of the recesses 320 of the top cap wafer 310 and the recesses 420 of the bottom cap wafer 410.

Figure 4E:
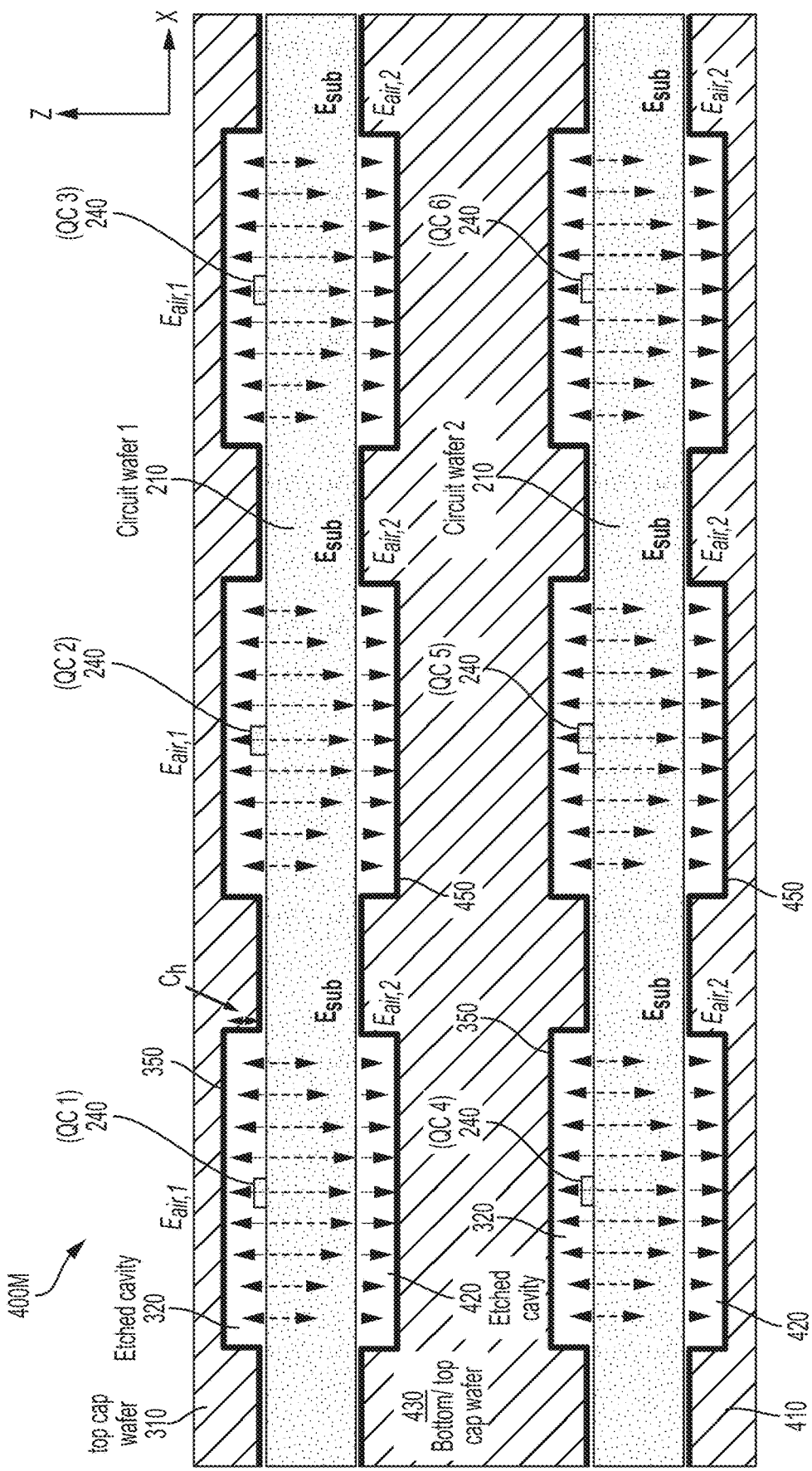
FIG. 4E shows a three dimensional (3D) microwave integrated quantum circuit that includes multiple circuit wafers and cap wafers of two types.

FIG. 4E is a side view of a 3D microwave integrated quantum circuit 400M that includes multiple 2D microwave integrated quantum circuits similar to the microwave integrated quantum circuit 400. The outermost layers of the 3D microwave integrated quantum circuit 400M are the cap wafer 310 and the second cap wafer 410 that have been described above in connection with FIGS. 3A and 4A, respectively. Further, the 3D microwave integrated quantum circuit 400M includes multiple circuit wafers 210 stacked along the z-axis, each of the circuit wafers supporting a plurality of quantum circuit devices 240. For instance, quantum circuit devices QC1, QC2, QC3 are disposed on a first circuit wafer 210, quantum circuit devices QC4, QC5, QC6 are disposed on a second circuit wafer 210, etc. In this manner, a given quantum circuit device 240, e.g., QC2, has a particular number of near-neighbor quantum circuit devices disposed on the same circuit wafer 210, e.g., some of which are QC1 and QC3, and one or two near-neighbor quantum circuit devices disposed on respective one or two adjacent circuit wafers, e.g., QC5. Moreover, each quantum circuit device QC-j 240, where j=1, 2, 3, 4, 5, 6, . . . , has an associated operating frequency $f_O$-j. In some implementations, the operating frequencies of adjacent quantum circuit devices 240 are different from each other. In other implementations, at least some of adjacent quantum circuit devices 240, whether in-plane or out-of-plane, have common operating frequencies.

Note that adjacent ones of the multiple stacked circuit wafers 210 are separated by another type of cap wafer referred to as a bottom/top cap wafer 430. The bottom/top cap wafer 430 has a first surface that defines recesses 420 corresponding to the recesses 420 of the bottom cap wafer 410, and a second, opposing surface that defines recesses 320 corresponding to the recesses 320 of the top cap wafer 310. Here, the recesses 420 of the bottom/top cap wafer 430 correspond to the quantum circuit devices 240 disposed on the circuit wafer 210 adjacent to the first surface of the bottom/top cap wafer. Similarly, the recesses 320 of the bottom/top cap wafer 430 correspond to the quantum circuit devices 240 disposed on the circuit wafer 210 adjacent to the second surface of the bottom/top cap wafer. Note that the bottom/top cap wafer 430 is bonded to each of adjacent circuit wafers 210, as described below in connection with FIGS. 14A-14B, 15 and 16. In addition, spacers (or standoff bumps) may be used between the bonded bottom/top cap wafer 430 and each of adjacent circuit wafers 210, as described below in connection with FIGS. 12, 13A-13B, 14A-14B, 15 and 16.

Additionally, the 3D microwave integrated quantum circuit 400M includes, for each bottom/top cap wafer 430, a first electrically conducting layer 450 that covers at least a portion of each of the recesses 420 of the bottom/top cap wafer, and a second electrically conducting layer 350 that covers at least a portion of each of the recesses 320 of the bottom/top cap wafer. During operation of the 3D microwave integrated quantum circuit 400M, all electrically conducting layers 350 and 450 are grounded.

Moreover, each recess 420 and each recess 320 of the bottom/top cap wafer 430 is configured to suppress propagation inside the recess of electromagnetic waves that have frequencies "f" below an associated cutoff frequency $f_C$-j, f<$f_C$-j, where the associated cutoff frequency $f_C$-j is larger than an operating frequency $f_O$-j, $f_O$-j<$f_C$-j, of a corresponding quantum circuit device 240-j. For example, a recess 420 of bottom/top cap wafer 430 corresponding to quantum circuit device QC2 is configured to suppress propagation inside the recess of electromagnetic waves that have frequencies "f" below cutoff frequency $f_{C2}$, f<$f_{C2}$, where the cutoff frequency $f_{C2}$ is larger than an operating frequency $f_{O2}$, $f_{O2}$<$f_{C2}$, of quantum circuit device QC2, while a recess 320 of the bottom/top cap wafer corresponding to quantum circuit device QC5 is configured to suppress propagation inside the recess of electromagnetic waves that have frequencies "f" below cutoff frequency $f_{C5}$, f<$f_{C5}$, where the cutoff frequency $f_{C5}$ is larger than an operating frequency $f_{O5}$, $f_{O5}$<$f_{C5}$, of quantum circuit device QC5. In the latter example, the recess 420 can have a different size in the x-y plane from the recess 320.

As noted above in connection with FIG. 2B, another approach to isolate quantum circuit devices 240 of a microwave integrated quantum circuit uses electrically conducting thru vias. Microwave integrated quantum circuits designed based on this approach are described next.

FIG. 5A is a side view of a 2D microwave integrated quantum circuit 500, and FIG. 5B is a top view of the same in the vicinity of one of a plurality of quantum circuit devices 240 included in the 2D microwave integrated quantum circuit. Here, the 2D microwave integrated quantum circuit 300 includes a first substrate 210, also referred to as a circuit wafer, such that the quantum circuit devices 240 are disposed on a first surface of the circuit wafer 210. Each quantum circuit device QC-j 240, where j=1, 2, 3, . . . , has an associated operating frequency $f_O$-j. In some implementations, the operating frequencies of the quantum circuit devices 240 are different from each other. In other implementations, at least some of the quantum circuit devices 240 have common operating frequencies.

The 2D microwave integrated quantum circuit 500 further includes electrically conducting vias 560 each extending through the circuit wafer 210 outside of a footprint of each quantum circuit device 240. A length of the electrically conducting vias 560 along the z-axis corresponds to a thickness of the circuit layer 210, which can be in the range of 1 µm to 2 mm. Note that the electrically conducting vias 560 include a material (e.g., Al, In, Ti, Pn, Sn, etc.) that is superconducting at an operating temperature of the 2D microwave integrated quantum circuit 500. In this manner, the 2D microwave integrated quantum circuit 500 can be operated at cryogenic temperatures (e.g., using liquid helium) and the electrically conducting vias 560 (or at least portions thereof) can operate as superconducting vias at that temperature. In addition, during operation of the 2D microwave integrated quantum circuit 500, the electrically conducting vias 560 are grounded.

Moreover, the electrically conducting vias 560 are distributed around the footprint of each quantum circuit device 240 to suppress, across a volume of the circuit wafer 210 that is adjacent to the footprint of the quantum circuit device, propagation of electromagnetic waves (also referred to as substrate modes) that have frequencies "f" below a cutoff frequency $f_C$, f<$f_C$, where the cutoff frequency $f_C$ is larger than the operating frequency $f_O$, $f_O$<$f_C$, of the surrounded quantum circuit device. The noted suppression of the propagation of the substrate modes is illustrated in FIG. 5A by the relative appearance of the in-air electric field spatial distribution $E_{air}$ and in-substrate electric field spatial distribution $E_{sub}$ of operating signals.

Figure 5C:
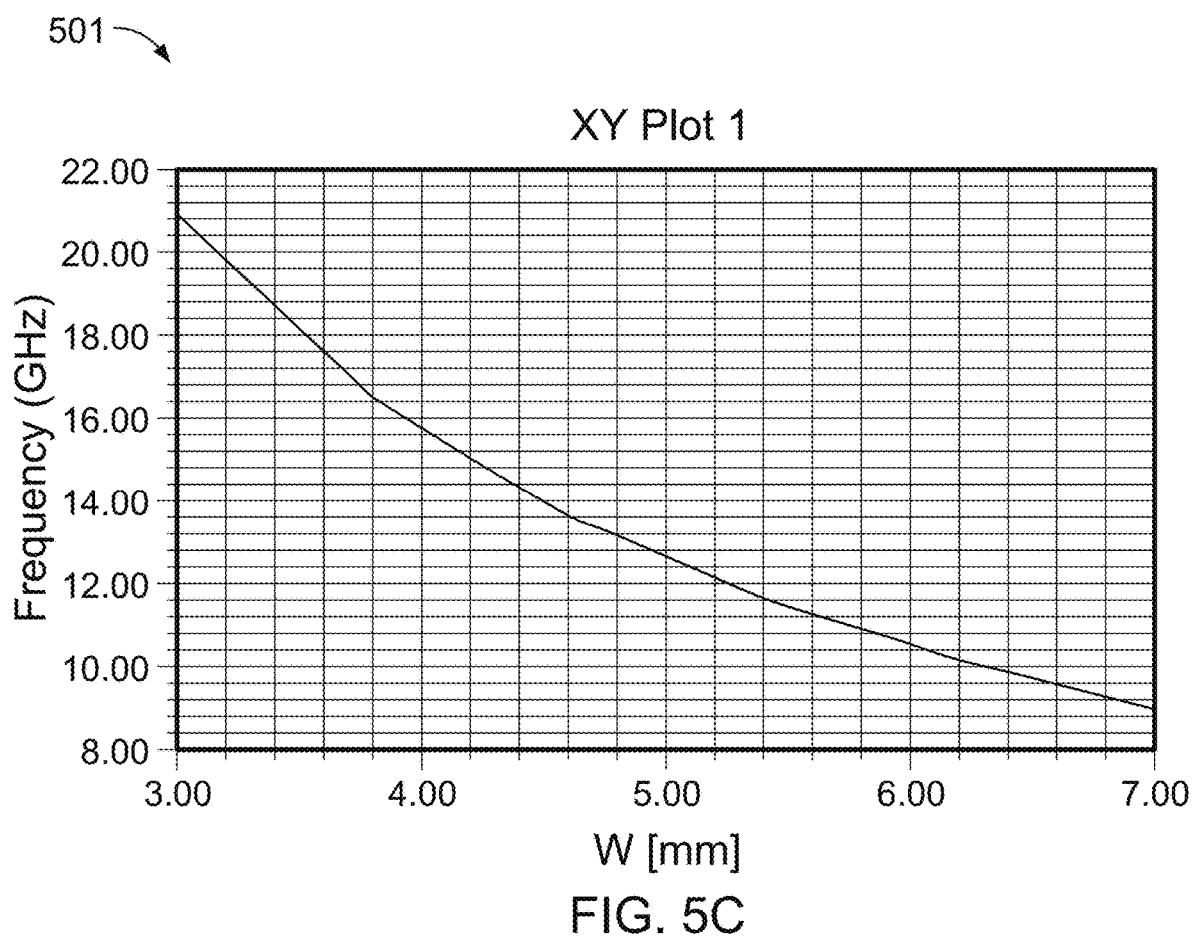

In this manner, a separation S between adjacent electrically conducting vias 560 is smaller than a maximum separation $S_{MAX}$ corresponding to the cutoff frequency $f_C$. In general, structures with parallel metal plates support the propagation of parallel-plate or substrate modes. A resonant frequency of these modes depends on the metal plate area: it drops as the area increases. FIG. 5C is a plot 501 that shows dependence of the resonant frequency of the first fundamental mode of a square cavity of silicon (the material from which the circuit wafer 210 can be made) versus size:

$$f_q = \frac{c}{2\pi\sqrt{\epsilon_r}} \sqrt{\left(\frac{\pi}{p}\right)^2 + \left(\frac{\pi}{q}\right)^2 + \left(\frac{\pi}{r}\right)^2}, \quad (6)$$

where c is the speed of light in free space, $\epsilon_r$ is the relative dielectric constant of silicon, and p, q and r are the dimensions of the cavity. Such substrate modes can cause undesired coupling among the quantum circuit devices 240 of the 2D microwave integrated quantum circuit 500 giving rise to a degraded performance of the quantum circuit devices. Therefore, if substrate modes have frequencies in a bandwidth that includes the operating frequency of the quantum circuit devices 240, the electrically conducting vias 560 are used to suppress them.

Figure 7A:
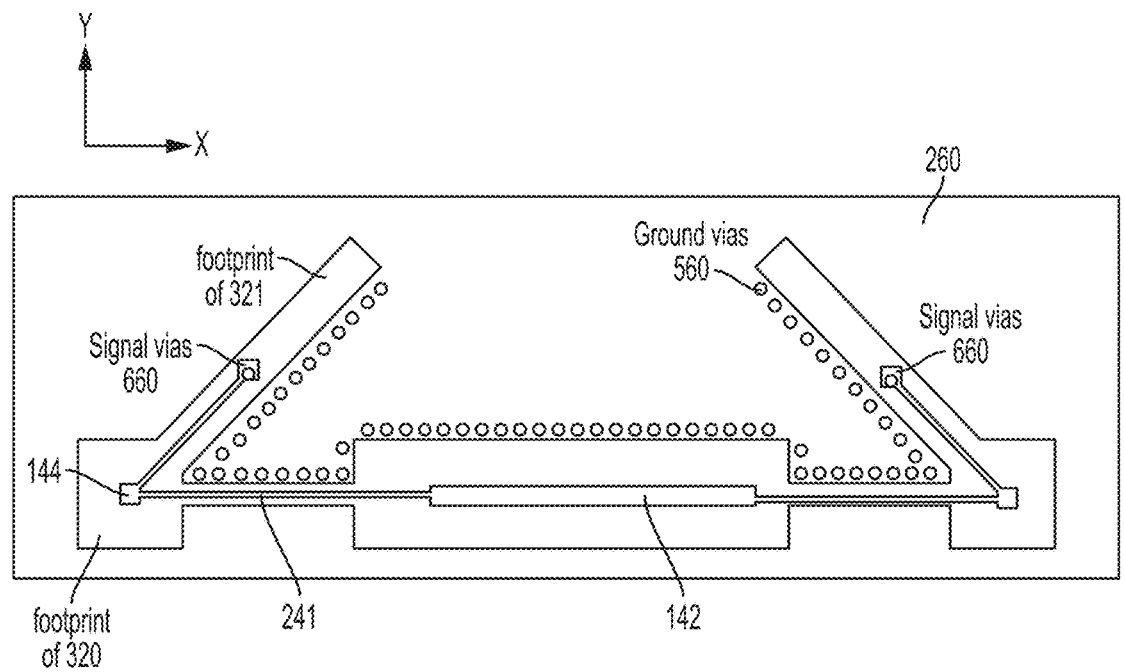
FIGS. 7A-7D show aspects of multiple types of thru vias.

Referring again to FIG. 5B, a distance DV between the outer perimeter of the surrounded quantum circuit device 240 and a nearest electrically conducting vias 560 corresponds to a value of a capacitance between the surrounded quantum circuit device and the nearest electrically conducting vias. Moreover, adjacent quantum circuit devices 240 disposed on the circuit wafer 210 can be coupled electromagnetically through a coupling line that includes an electrical conductor 241 extending along the first surface of the circuit wafer over at least a portion of the distance between the adjacent quantum circuit devices. The coupling between the adjacent quantum circuit devices 240 can be capacitive, inductive, or galvanic. In some implementations, electrically conducting vias 560 can be distributed along at least a portion of the coupling line to isolate it from interaction to unwanted modes (e.g., environmental modes), as shown in FIG. 7A, for instance.

It was noted above in connection with FIG. 2B that yet another approach to isolate quantum circuit devices 240 of a microwave integrated quantum circuit combines the isolation approach that uses cap wafers, as described above in connection with FIGS. 3-4, with the isolation approach that uses electrically conducting thru vias, as described above in connection with FIG. 5. Microwave integrated quantum circuits designed based on this combined approach are described next.

FIG. 6A is a side view of a 2D microwave integrated quantum circuit 600A that includes, in addition to the components of the 2D microwave integrated quantum circuit 300 described above in connection with FIGS. 3A-3B, electrically conducting vias 560 each extending through the circuit wafer 210 as described above in connection with FIGS. 5A-5B. Here, the electrically conducting vias 560 are disposed outside of a footprint of each recess 320 encapsulating an associated quantum circuit device 240. FIG. 6B is a side view of a 2D microwave integrated quantum circuit 600B that includes, in addition to the components of the 2D microwave integrated quantum circuit 400 described above in connection with FIG. 4A, electrically conducting vias 560 each extending through the circuit wafer 210 as described above in connection with FIGS. 5A-5B. Here, the electrically conducting vias 560 are disposed outside of a common footprint of each recess 320 encapsulating an associated quantum circuit device, and respective recess 420 on the other side of the circuit wafer from the encapsulated quantum circuit device. FIG. 6C is a top view of either the 2D microwave integrated quantum circuit 600A or the 2D microwave integrated quantum circuit 600B in the vicinity of one of a plurality of quantum circuit devices 240 included therein.

During operation of the 2D microwave integrated quantum circuit 600A, the electrically conducting layer 350 and the electrically conducting vias 560 are grounded. During operation of the 2D microwave integrated quantum circuit 600B, the electrically conducting layers 350 and 450, and the electrically conducting vias 560 are grounded.

Note that each recess 320 of the cap wafer 310 is configured to suppress propagation inside the recess of electromagnetic waves that have frequencies "f" below a cutoff frequency $f_C$, where the cutoff frequency $f_C$ has been established based on the separation S of the electrically conducting vias 560, as described above in connection with FIGS. 5A-5B. The noted suppression of the propagation of the recess modes and of the substrate modes is illustrated in FIG. 6 by the relative appearance of the in-air electric field spatial distribution $E_{air}$ and in-substrate electric field spatial distribution $E_{sub}$ of operating signals. Moreover, (i) the separation S of the electrically conducting vias 560 distributed around the footprint of each recess 320 encapsulating an associated quantum circuit device 240, and (ii) the size WW of the recess are both determined by the cutoff frequency $f_C$. As noted above, in the case of the 2D microwave integrated quantum circuit 600A, a separation DV between the perimeter of the quantum circuit device 240 and nearest electrically conducting vias 560 is larger than or at most equal to a separation DW between the perimeter of the quantum circuit device 240 and adjacent walls of the recess 320 of the cap wafer 310.

Moreover, adjacent quantum circuit devices 240 disposed on the circuit wafer 210 can be coupled electromagnetically through a coupling line that includes an electrical conductor 241 extending along the first surface of the circuit wafer over at least a portion of the distance between the adjacent quantum circuit devices. The coupling between the adjacent quantum circuit devices 240 can be capacitive or direct. Note that, as illustrated in FIG. 6C, at least a portion of the coupling line is electromagnetically isolated from environmental noise because it is encapsulated by a trench 321 of the cap wafer 310 and flanked by electrically conducting vias 560 disposed outside the trench.

Referring again to FIG. 6B, the 2D microwave integrated quantum circuit 600B further includes a routing wafer 610. Some electrically conducting lines 650 of the routing wafer 610 are coupled with signal vias 660 extending through the cap wafer 310 to supply control signals to, or retrieve readout signals from, quantum circuit devices 240 encapsulated in respective recesses 320. The foregoing I/O signals can be provided/retrieved through the routing wafer 610 directly from the signal delivery system 106 of the quantum computing system 100 or from quantum circuit devices in adjacent 2D microwave integrated quantum circuit 600B that is stacked vertically, e.g., along the z-axis, as shown below in FIG. 6F. Other electrically conducting lines 650 of the routing wafer 610 are coupled with ground vias 560 extending through the cap wafer 310 to provide ground to the electrically conducting layer 350 (or to the electrically conducting layer 450, or the electrically conducting vias 560 that extend through the circuit wafer 210.)

In the example illustrated in FIG. 6B, the cap wafer 310 has hollow thru vias or apertures 330 into the recess 320. A capacitive coupling can be formed, through such an aperture 330, between a quantum circuit device 240 encapsulated in a recess 320 and an I/O signal carrying electrically conducting line 650.

Figure 6D:
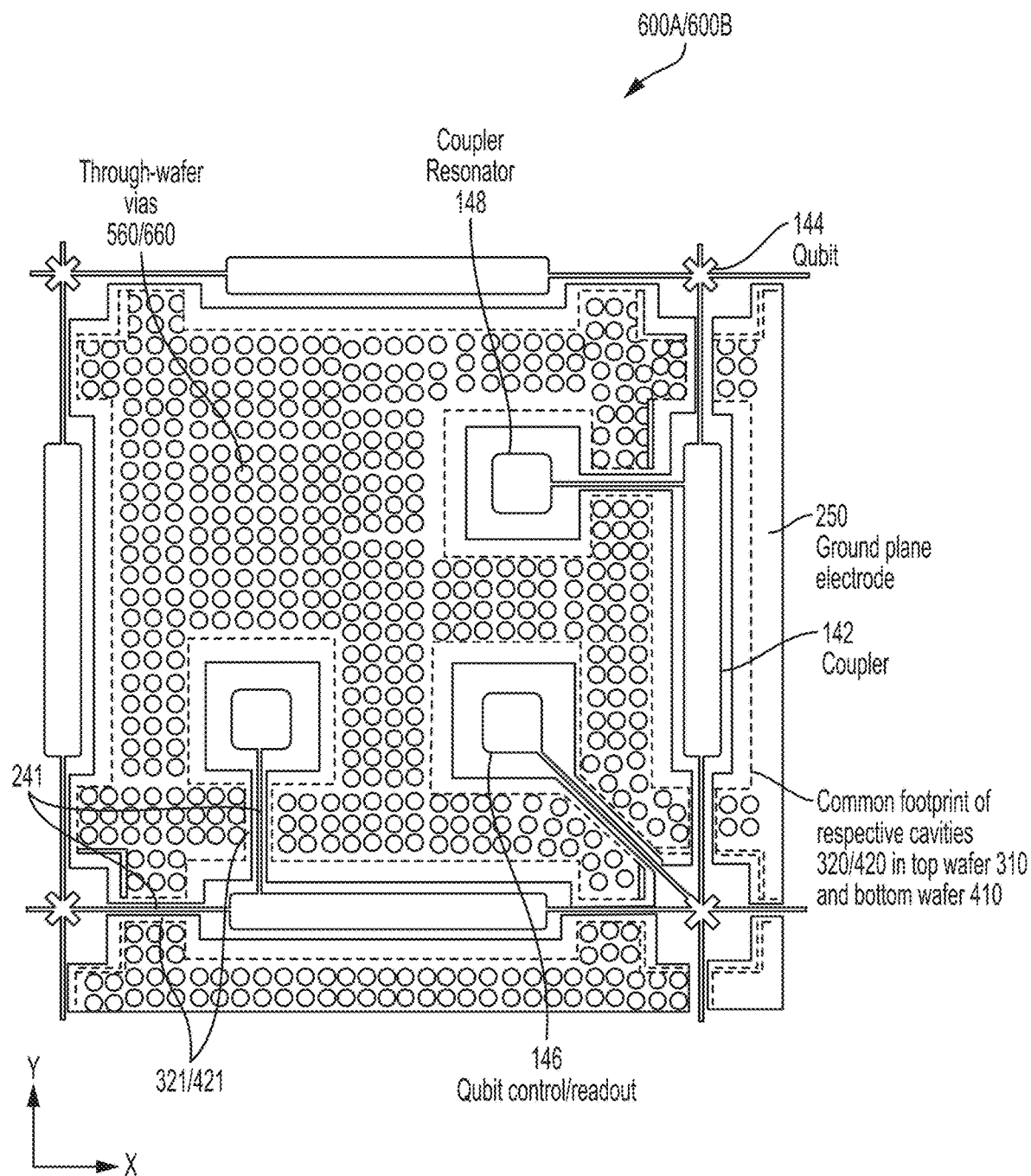

FIG. 6D is a top view of either the 2D microwave integrated quantum circuit 600A or the 2D microwave integrated quantum circuit 600B. Here, it is shown that the 2D microwave integrated quantum circuit 600A/600B can be scaled to a large number of quantum circuit devices 240 that include multiple qubits 144, resonators 146, 148, tunable couplers 142, etc. Here, distances between adjacent qubits 144 can be in the range of 0.5-5 mm, for instance. Note that recesses 320 of the (top) cap wafer 310 enclose each quantum circuit device 240 formed on the circuit wafer and trenches 321 (which are recesses with large aspect ratio) of the (top) cap wafer enclose the coupling lines 241. Further note that in the case of 2D microwave integrated quantum circuit 600B, the contours representing the recess walls can be the common footprint of the recesses 320 of the top cap wafer 310 and the recesses 420 of the bottom cap wafer 410.

Furthermore, a plurality of electrically conducting vias that includes ground vias 560 and I/O signal delivery vias 660 (or other types of via electrically conducting vias that will be described below in connection with FIGS. 7A-7D) are distributed outside the footprint of the recesses 320 for the 2D microwave integrated quantum circuit 600A, or the common footprint of the recesses 320/420 for the 2D microwave integrated quantum circuit 600B, and between the qubits 144, resonators 146, 148, tunable couplers 142 of the circuit wafer 312. For example, the electrically conducting vias 560 adjacent to the footprint of the recesses 320/420 are grounded, while the electrically conducting vias 660 further apart from the footprint of the recesses 320/420 can be signal carrying vias 660.

Note that at least some of the electrically conducting vias 560, e.g., the ones that are far from the footprint of the recesses 320/420, are used mainly to provide thermalization, e.g., because these electrically conducting vias serve as a heat sink that reduces heat dissipation to the circuit wafer 210. In this manner, quantum circuit devices 240 disposed on the thermalized circuit wafer 210 can experience reduced loss.

Figure 6E:
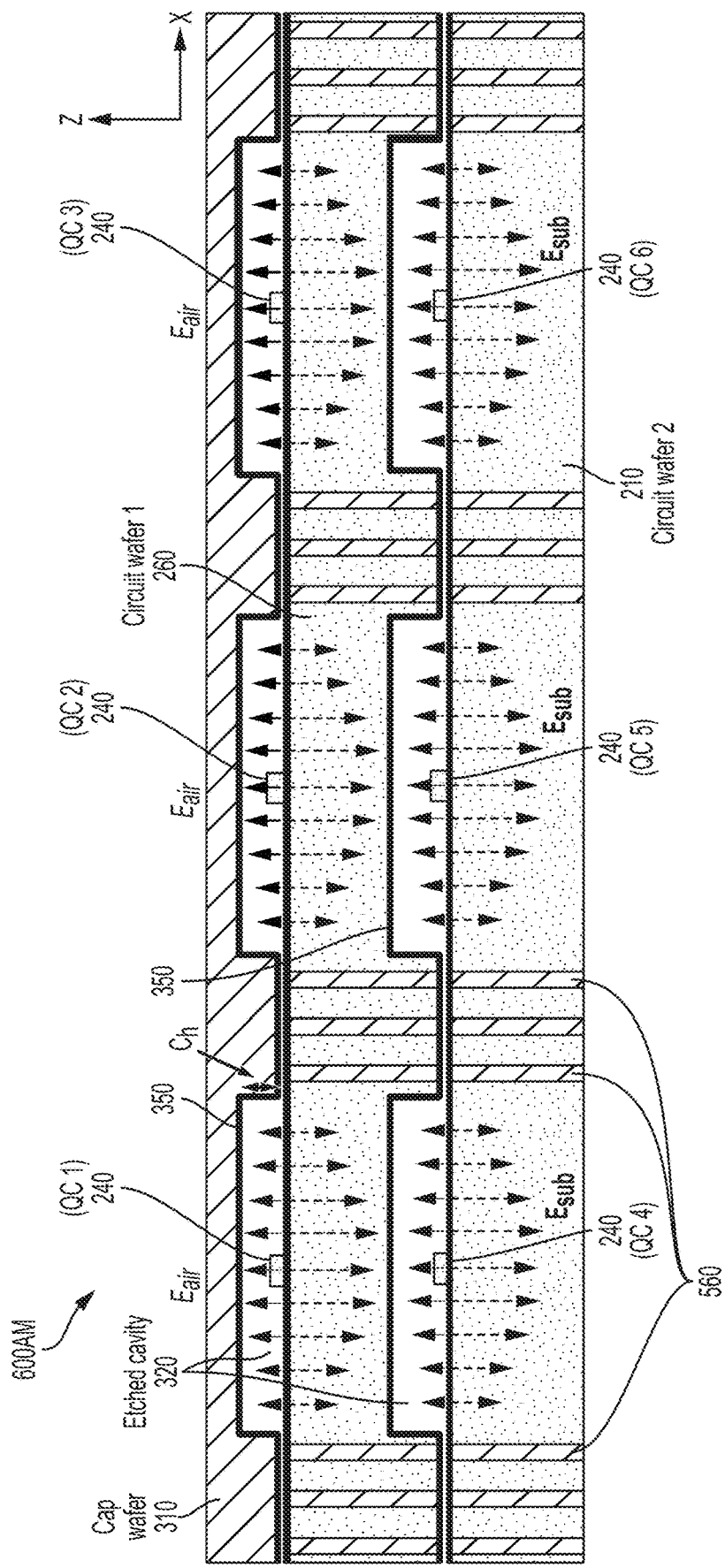
FIG. 6E shows a 3D microwave integrated quantum circuit that includes circuit wafers and cap wafers of multiple types, and thru vias.

FIG. 6E is a side view of a 3D microwave integrated quantum circuit 600AM that includes multiple 2D microwave integrated quantum circuits similar to the microwave integrated quantum circuit 600A. The outermost layers of the 3D microwave integrated quantum circuit 600AM are the cap wafer 310 and the circuit wafer 210 that have been described above in connection with FIG. 3A. Further, the 3D microwave integrated quantum circuit 600AM includes one or more substrates 260 stacked along the z-axis between the cap wafer 310 and the circuit wafer 210, each of the substrates supporting quantum circuit devices 240 included in the 3D microwave integrated quantum circuit 600AM. Note that the substrates 260 are of a different type than the circuit wafer 210 and are referred to as circuit/cap wafers 260. Each circuit/cap wafer 260 has a first surface onto which associated quantum circuit devices 240 are disposed, and a second, opposing surface that defines recesses 320 the correspond to quantum circuit devices 240 disposed on another circuit/cap wafer or circuit wafer 210 adjacent to the second surface of the circuit/cap wafer. Note that the circuit/cap wafer 260 is bonded to each of two adjacent wafers from among a circuit wafer 210, a cap wafer 310, or another circuit/cap wafer, as described below in connection with FIGS. 14A-14B, 15 and 16. In addition, spacers (or standoff bumps) may be used between the bonded circuit/cap wafer 260 and each of adjacent wafers, as described below in connection with FIGS. 12, 13A-13B, 14A-14B, 15 and 16.

Additionally, the 3D microwave integrated quantum circuit 600AM includes, for each circuit/cap wafer 260, an electrically conducting layer 350 that covers at least a portion of each of the recesses 320 of the circuit/cap wafer. Further, for each circuit/cap wafer 260 and for the circuit wafer 210, the 3D microwave integrated quantum circuit 600AM includes electrically conducting vias 560 each extending through the circuit/cap wafer and through the circuit wafer. Here, the electrically conducting vias 560 are disposed outside of a footprint of each recess 320 encapsulating an associated quantum circuit device 240. During operation of the 3D microwave integrated quantum circuit 600AM, all electrically conducting layers 350 and all the electrically conducting vias 560 are grounded.

Note that each recess 320 of the cap wafer 310 and of each of the circuit/cap wafers 260 is configured to suppress propagation inside the recess of electromagnetic waves that have frequencies "f" below an associated cutoff frequency $f_C$-j, $f<f_C$-j, where the associated cutoff frequency $f_C$-j is larger than an operating frequency $f_O$-j, $f_O$-j$<f_C$-j, of a corresponding encapsulated quantum circuit device 240-j. Moreover, the cutoff frequency $f_C$-j has been established based on a separation S-j of the electrically conducting vias 560 distributed around the footprint of recess 320-j encapsulating the associated quantum circuit device 240-j, as described above in connection with FIGS. 5A-5B.

For example, a recess 320-2 of cap wafer 310 corresponding to quantum circuit device QC2 has a width W2 and electrically conducting vias 560-2 extending through the circuit/cap wafer 260 and surrounding the footprint of recess 320-2 are separated by a separation S2 to suppress propagation inside the recess 320-2 of electromagnetic waves that have frequencies "f" below cutoff frequency $f_{C2}$, $f<f_{C2}$, where the cutoff frequency $f_{C2}$ is larger than an operating frequency $f_{O2}$, $f_{O2}<f_{C2}$, of quantum circuit device QC2; further, a recess 320-5 of the circuit/cap wafer 260 corresponding to quantum circuit device QC5 has a width W5 and electrically conducting vias 560-6 extending through the circuit wafer 210 and surrounding the footprint of recess 320-5 are separated by a separation S5 to suppress propagation inside the recess 320-5 of electromagnetic waves that have frequencies "f" below cutoff frequency $f_{C5}$, $f<f_{C5}$, where the cutoff frequency $f_{C5}$ is larger than an operating frequency $f_{O5}$, $f_{O5}<f_{C5}$, of quantum circuit device $Q_{C5}$. In this example, the width W2 of the recess 320-2 of cap wafer 310 can be different from the width W2 of the recess 320-5 of circuit/cap wafer 260, and the separation S2 of the electrically conducting vias 560-2 extending through the circuit/cap wafer 260 and surrounding the footprint of recess 320-2 can be different from the separation S5 of the electrically conducting vias 560-5 extending through the circuit wafer 210 and surrounding the footprint of recess 320-5.

Figure 6F:
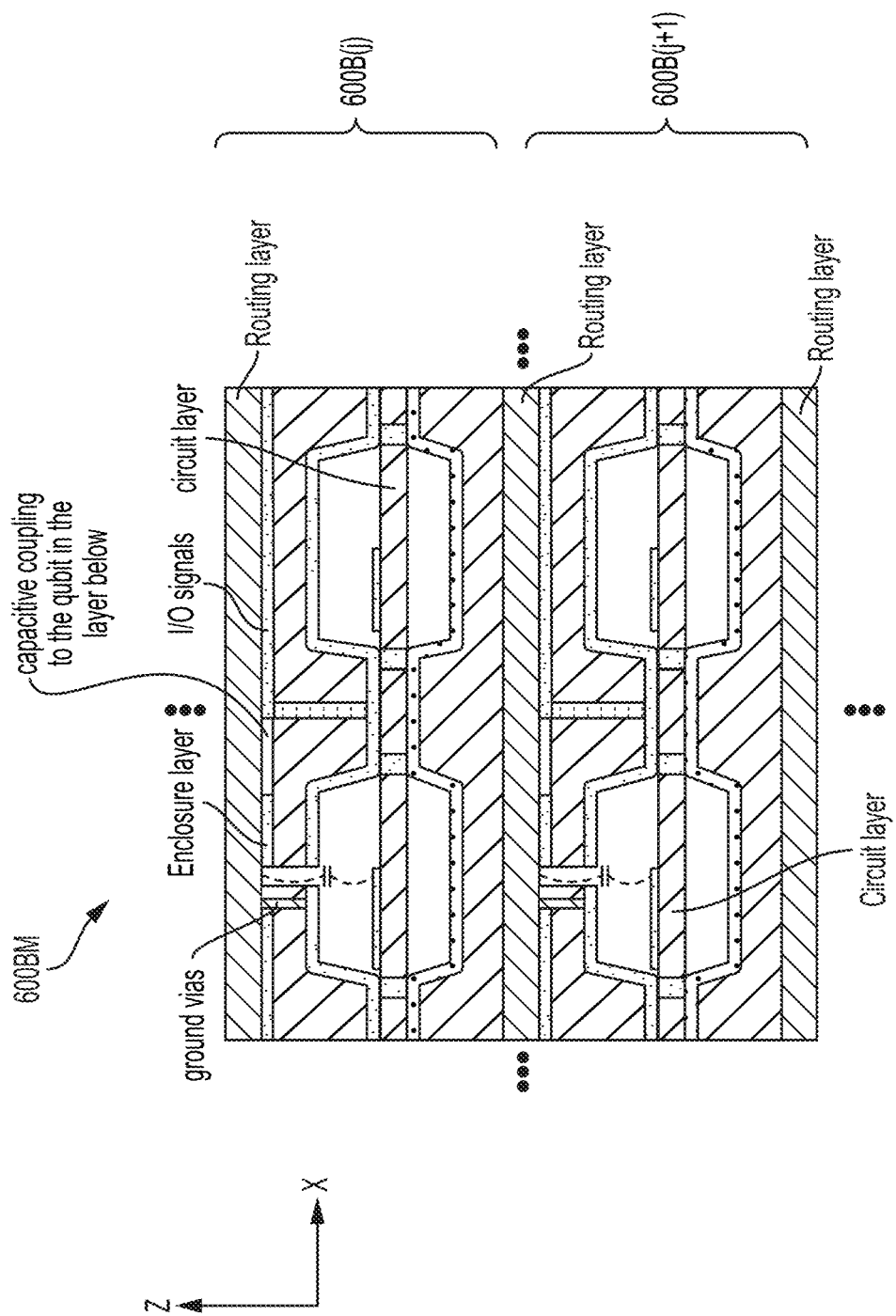
FIG. 6F shows a 3D microwave integrated quantum circuit that includes multiple circuit wafers and cap wafers of a single type, and thru vias.

FIG. 6F is a side view of a 3D microwave integrated quantum circuit 600BM that includes multiple 2D microwave integrated quantum circuits like the microwave integrated quantum circuit 600B stacked along the z-axis. Note that, as each microwave integrated quantum circuit 600B(j), where j=2, . . . , N, includes a routing wafer 610, adjacent microwave integrated quantum circuit 600B(j), 600B(j+1) interface through such a routing wafer. As such, quantum circuit devices 240 from adjacent microwave integrated quantum circuits 600B(j), 600B(j+1) can be coupled through the routing wafer 610 disposed between them, e.g., in the example shown in FIG. 6F through the routing wafer 610 of the microwave integrated quantum circuit 600B(j+1). For example, the quantum circuit devices 240 from adjacent microwave integrated quantum circuits 600B(j), 600B(j+1) can be capacitively coupled through an aperture 330 in the cap wafer 310 of the microwave integrated quantum circuit 600B(j+1). As another example, the quantum circuit devices 240 from adjacent microwave integrated quantum circuits 600B(j), 600B(j+1) can be directly coupled through a I/O signal carrying via 660 extending through the cap wafer 310 of the microwave integrated quantum circuit 600B(j+1).

Various types of electrically conductive vias will be described next in more detail. Prior to that, note that in addition to the quantum circuit devices 240 disposed on one of the surfaces (e.g., the top surface) of the circuit wafer 210 of at least some of the microwave integrated quantum circuits described above, additional electrically conducting circuits can be disposed on the opposing surface (e.g., the bottom surface) of the circuit wafer, in some implementations.

FIG. 7A is a top view of a portion of the 3D microwave integrated quantum circuit 600A, for instance. Note that adjacent qubit circuit devices 144 are coupled with each other through a coupler circuit device 142, where the qubit circuit devices and the coupler circuit device are disposed on a circuit/cap wafer 260. Signal vias 660 extending through the circuit/cap wafer 260 provide control signals to and retrieve readout signal from a control/readout resonator disposed on another circuit/cap wafer or circuit wafer 210, not shown in this figure. Coupling lines 241, which can be capacitive, inductive, or direct, are used to in-plane couple the qubit circuit devices 144 with the coupler circuit device 142 and with the signal vias 660.

Note that recesses 320 of the cap wafer 310 or of another circuit/cap wafer 260 encapsulate each of the qubit circuit devices 144 and coupler circuit device 142, while trenches 321 (which are recesses with large aspect ratio) of the cap wafer or of the other circuit/cap wafer enclose the coupling lines 241. Also note that electrically conducting vias 560 extending through the circuit/cap wafer 260 flank the walls of the recesses 320 and trenches 321. Electrically conducting vias 560 are spaced apart from each other by a separation S related to a cutoff frequency $f_C$ associated with operating frequencies $f_O$ of the qubit circuit devices 144 and coupler circuit device 142, as described above in connection with FIGS. 5A-5B. In this manner, the electrically conducting vias 560 are grounded during operation of the 3D microwave integrated quantum circuit 600A to isolate, from spurious substrate modes, the qubit circuit devices 144 and coupler circuit device 142 encapsulated by the recesses 320 and the coupling lines 321 encapsulated by the trenches 321.

Figure 7B:
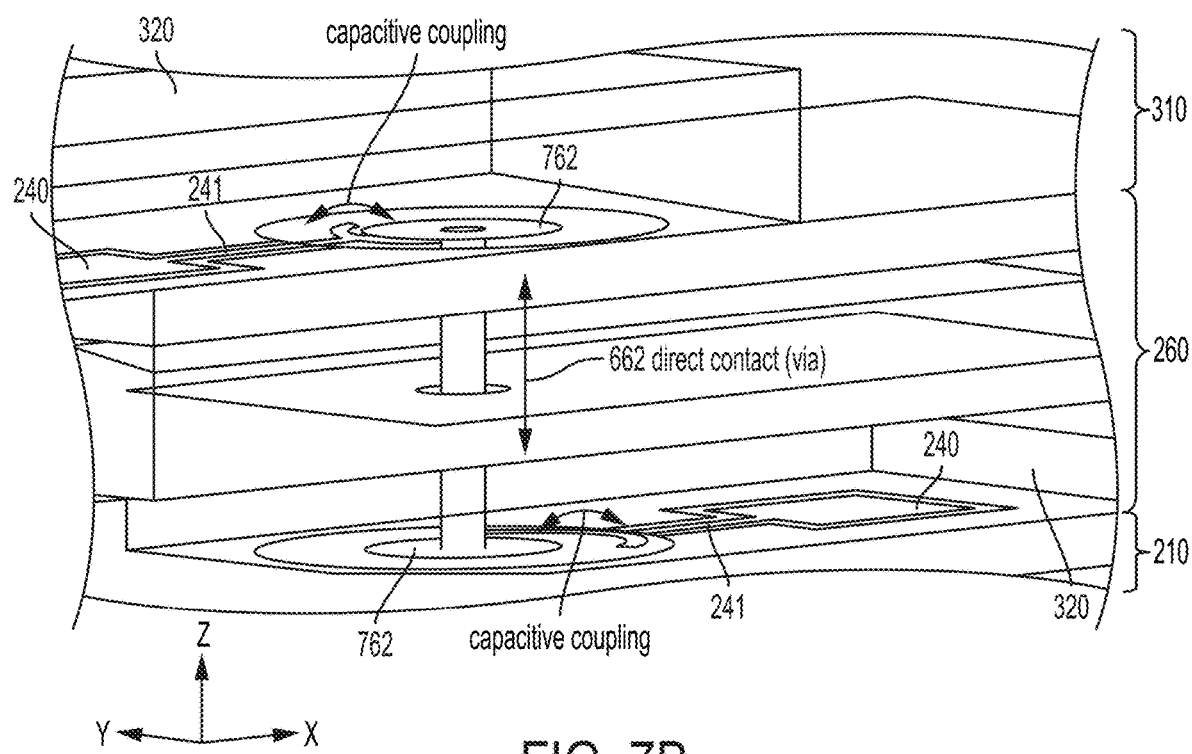

FIG. 7B is a close-up perspective view of two quantum circuit devices 240 of the 3D microwave integrated quantum circuit 600A, for instance. A first quantum circuit device 240, a first coupling line 241 and a first contact pad 762 are disposed on the circuit/cap wafer 260 and are encapsulated by a recess 320 of the cap wafer 310. A second quantum circuit device 240, a second coupling line 241 and a second contact pad 762 are displaced along the z-axis from the first quantum circuit device 240, the first coupling line 241 and the first contact pad 762, are disposed on the circuit wafer 210, and are encapsulated by a recess 320 of the circuit/cap wafer 260. Note that in this example, capacitive coupling is established between the first coupling line 241 and the first contact pad 762, and between the second coupling line 241 and the second contact pad 762. However, a direct contact via 662 extending through the recess 320 and remaining thickness of the circuit/cap wafer 260 provides direct contact between the first contact pad 762 and the second contact pad 762.

In the example illustrated in FIG. 7B, the vertical distance between the layers of the 3D microwave integrated quantum circuit 600A is usually set by fabrication technology and flexibility in designing a desired coupling capacitance between quantum circuit devices 240 might be limited if the capacitance is to be made between layers, e.g., along the z-axis. Here, the direct contact via 662 helps with transferring a control signal or a readout signal between layers of the 3D microwave integrated quantum circuit 600A, because a planar coupling capacitance could be designed in a more straightforward manner with much more flexibility.

Figure 7C:
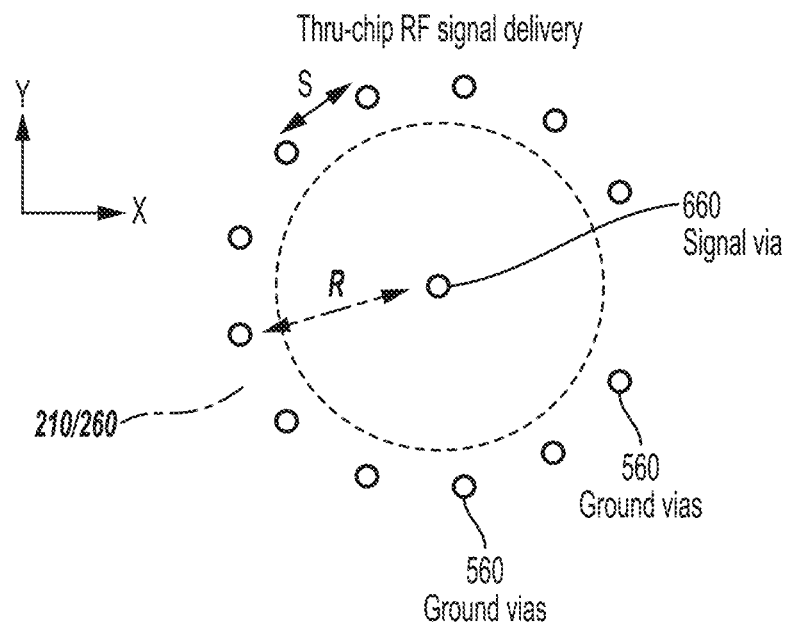

FIG. 7C is a (x-y) cross-section of a circuit wafer 310 or a circuit/cap wafer 260 in the vicinity of a signal via 660 extending through the circuit wafer or the circuit/cap wafer to transfer control signals or readout signals between the sides of the circuit wafer or the circuit/cap wafer. Note that the signal via 660 is surrounded by electrically conductive vias 560 that are separated from each other by a spacing S. The spacing S is related to a cutoff frequency $f_C$ that is larger than operating frequencies $f_O$ of the signals transferred through the signal via 660. The electrically conductive vias 560 are grounded when signals are being transferred through the signal via 660 to isolate the transferred signals from spurious substrate modes. A radius R of the path of electrically conductive vias 560 surrounding the signal via 660 is related to a capacitance of the arrangement illustrated in FIG. 7C.

Figure 7D:
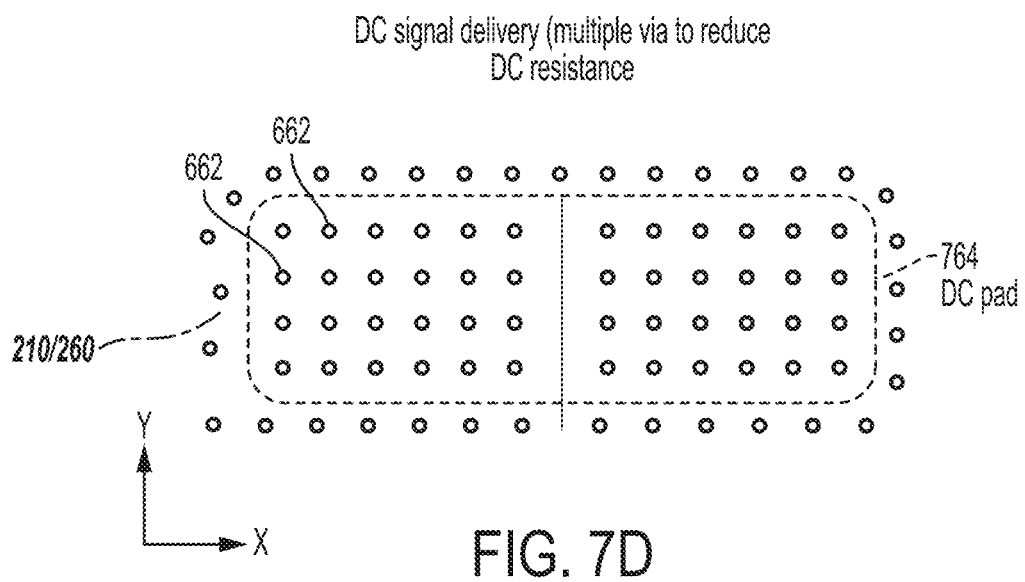

FIG. 7D is a (x-y) cross-section of a circuit wafer 310 or a circuit/cap wafer 260 in the vicinity of a DC pad 764. A plurality of direct contact vias 662 extend through the circuit wafer or the circuit/cap wafer to deliver, to the DC pad 764, DC signals from a DC signal source disposed on the opposite side of the circuit wafer or the circuit/cap wafer relative to the DC pad. A DC resistance of the DC connection illustrated in FIG. 7D decreases when the number of direct contact vias 662 increases.

Note that the electrically conductive vias described above in connection with FIG. 5, FIG. 6 and FIG. 7, regardless of their function, are formed from a material (e.g., Al, In, Ti, Pn, Sn, etc.) that is superconducting at an operating temperature of the disclosed microwave integrated quantum circuits. Such a material is referred to as a superconducting material. In this manner, the disclosed microwave integrated quantum circuits can be operated at cryogenic temperatures (e.g., using liquid helium) and the electrically conducting vias (or at least portions thereof) can operate as superconducting vias at that temperature. In some implementations, each of the disclosed electrically conductive vias comprises a pair of end caps of the superconducting material, where the end caps are disposed adjacent to the first surface and an opposing surface of the circuit wafer 210 or circuit/cap wafer 260. In some implementations, the disclosed electrically conductive vias have hollow structure, e.g., are formed as tubes of superconducting material. In some implementations, the disclosed electrically conductive vias can be filled with conductive material and coated with a layer of superconducting material. For example, the conductive material (which here means a conductive material that is not superconducting at the operating temperature of the disclosed microwave integrated quantum circuits) can be Au, Cu, Pd, etc.

The microwave integrated quantum circuits described above in connection with FIG. 3, FIG. 4, FIG. 5 and FIG. 6 can be fabricated by forming their respective components, e.g., from among circuit wafers 210, circuit/cap wafers 260, cap wafers 310, 410, bottom/top cap wafers 430, or routing wafers 610, and then by bonding together their respective components. Various techniques are described for fabricating and assembling the components of the disclosed microwave integrated quantum circuits. At least some of the disclosed fabrication techniques satisfy one or more of the following capabilities: (i) deep etching processes of thick wafers are used that are capable to form the recesses 320, 420 of the circuit/cap wafers 260, cap wafers 310, 410, bottom/top cap wafers 430 that have a dimension $C_h$ of the order of hundreds of microns; (ii) deposition processes are used that are capable to coat superconducting materials (e.g., Al, In, Ti, Pn, Sn, etc.); (iii) plating processes are used that are capable of filling with a conductor material via holes that are coated with a superconducting material.

A circuit wafer 210 can include signal delivery circuitry of quantum circuit devices 240, e.g., qubits, couplers, and I/O signals, while a routing wafer 610 can includes couplers and I/O signal paths. Thus, processes for their fabrication can be very similar. An example of such fabrication process can include metal patterning on a substrate, machining via holes and metalizing the via holes. The pattering on the substrate could be through metal etching or lift-off depending on the feature sizes.

Figure 8:
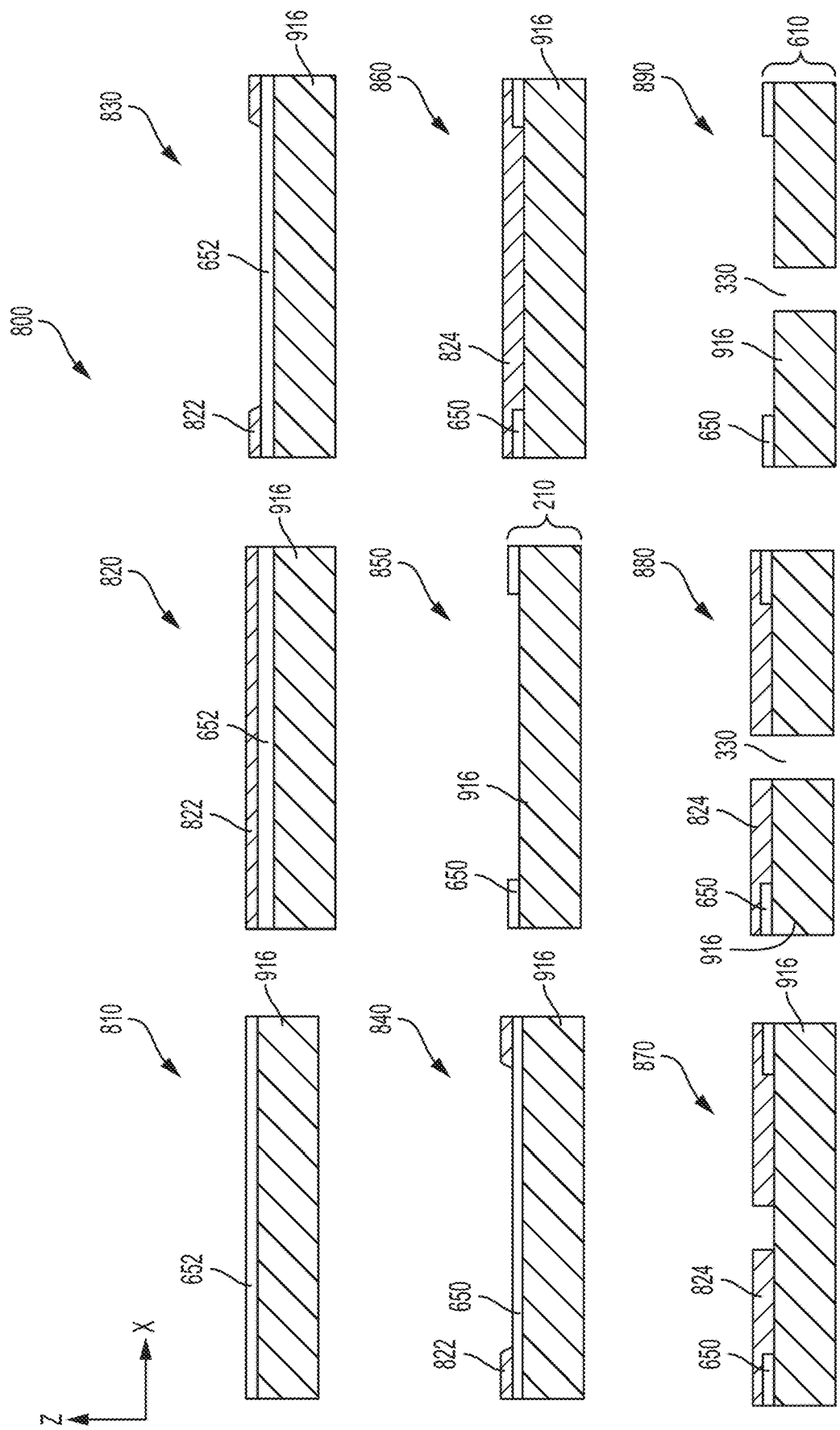
FIG. 8 shows an example of a process for fabricating either of circuit wafers or routing wafers based on etching.

FIG. 8 shows an example of a method 800 for fabricating either of circuit wafers 210 or routing wafers 610 based on etching. At 810, a metal layer 852 is deposited on a substrate 816. In some implementations, the substrate can be a high resistivity silicon wafer. In some implementations, the metal layer includes Al or other material (e.g., In, Ti, Pn, Sn, etc.) that is superconducting at an operating temperature of the disclosed microwave integrated quantum circuits. Here, the Al deposition is performed by either sputtering or e-beam evaporation methods. Note that deposition of a Ti adhesion layer might be needed.

At 820, a photoresist layer 822 is spun on the metal layer 852. Additionally, the photoresist layer 822 can be soft-baked.

At 830, the photoresist layer 822 is patterned for metal features. In some implementations, when higher resolution pattering is required for the circuit wafer 210, this operation is performed using E-beam lithography. In other implementations, the photoresist layer 822 is exposed and developed.

At 840, the metal layer 852 is wet etched to obtain metal features 650. The etch mask used for the wet etch is the patterned photoresist layer 822.

At 850, the patterned photoresist layer 822 is stripped to expose the metal features 650. Operations 810-850 can be repeated for depositing additional metal layers or a metal oxide (e.g., $Al_2O_3$). At this point fabrication of a circuit wafer 210 may be completed. If via holes also are needed in the circuit wafer 210 or a routing wafer 610, the method 800 continues in the following manner:

At 860, another photoresist layer 824 is spun on the metal layer 852 on the circuit wafer 210.

At 870, the photoresist layer 824 is patterned for vias. In this example, the photoresist layer 824 is exposed and developed.

At 880, the substrate 816 is thru etched to obtain via hole 330. In some implementations, the via hole 330 is obtained through wet etching. In other implementations, the via hole 330 is obtained through dry etching.

At 890, the photoresist patterned photoresist layer 824 is stripped to expose the metal features 650.

In some implementations, operations 860-890 can be replaced with a laser drilling process in the following manner. As a first operation, a protective layer is deposited on sensitive areas of the circuit wafer 210 or routing wafer 610. As a second operation, the via hole 330 is drilled using a laser. At a third operation, the protective layer is removed from the sensitive areas of the circuit wafer 210 or routing wafer 610.

As noted above, the metal features 650 on the substrate 816 could be obtained through a lift-off process as an alternative to operations 810-850. Such lift of process can be performed in the following manner: (i) Photoresist is spun, then soft baked; (ii) Either of E-beam lithography with a reverse mask, OR, photoresist development, bake can be used to pattern the photoresist; (iii) Al is deposited over the patterned photoresist by either sputtering or e-beam evaporation methods. Note that deposition of a Ti adhesion layer might be needed; (iv) The patterned photoresist is stripped for lift-off. In this case, Al is lift-off from areas of the patterned photoresist.

An alternative method to reduce or avoid the possibility of damaging sensitive superconducting circuit components during laser drilling or etching vias is to perform via drilling/etching process in the first step. Depending on the sizes/dimensions of the vias, spinning a uniform layer of photoresist might not be practical in some instances. One solution is to fill the vias with Al or In (or with any superconducting paste) and polish the surface.

Cap wafers 310, 410, bottom/top cap wafers 430, or circuit/cap wafers 260 can be fabricated from substrates (e.g., wafers) that include one or more of Si, Al2O3, SiO2, Si2N4, SiOx, lithographically defined thick photoresists (such as SU8, etc.) or superconducting metals. Processes that used to fabricate either of cap wafers 310, 410, bottom/top cap wafers 430, or circuit/cap wafers 260 include (i) micromachining of recesses 320, 420 and trenches 321, and (ii) deposition of a superconducting material to at least partially cover the walls and bottom of the micromachined recesses and trenches.

Processes for fabricating either of wafers 310, 410, bottom/top cap wafers 430, or circuit/cap wafers 260 from thick Si wafers or silicon-on-insulator (SOI) wafers will be described. Table 1 lists processes for fabricating either of cap wafers 310, 410, bottom/top cap wafers 430, or circuit/cap wafers 260 that are described in detail below.

TABLE 1

| | Process 900 | Process 1100 | Process 1000 | Process 1150 |
|---|---|---|---|---|
| Structural material | Si | | SOI | SU-8 |
| Process | Wet etch | DRIE | DRIE or wet etch | SU-8 expose & develop |

TABLE 1-continued

| | Process 900 | Process 1100 | Process 1000 | Process 1150 |
|---|---|---|---|---|
| Described in connection with FIG. | 9 | 11A | 10 | 11B-11C |
| Photoresist | Hard (SiO2, Si2N4, metals) | Soft and thick | Soft and thick | N/A |
| Etch depth control | Required (timing) | Required (timing) | Not required | N/A |
| Walls | Angled/ smooth | Vertical/ scalloped | Either | Vertical/ smooth |
| Cost | Medium | Medium | High | Low |

Figure 9:
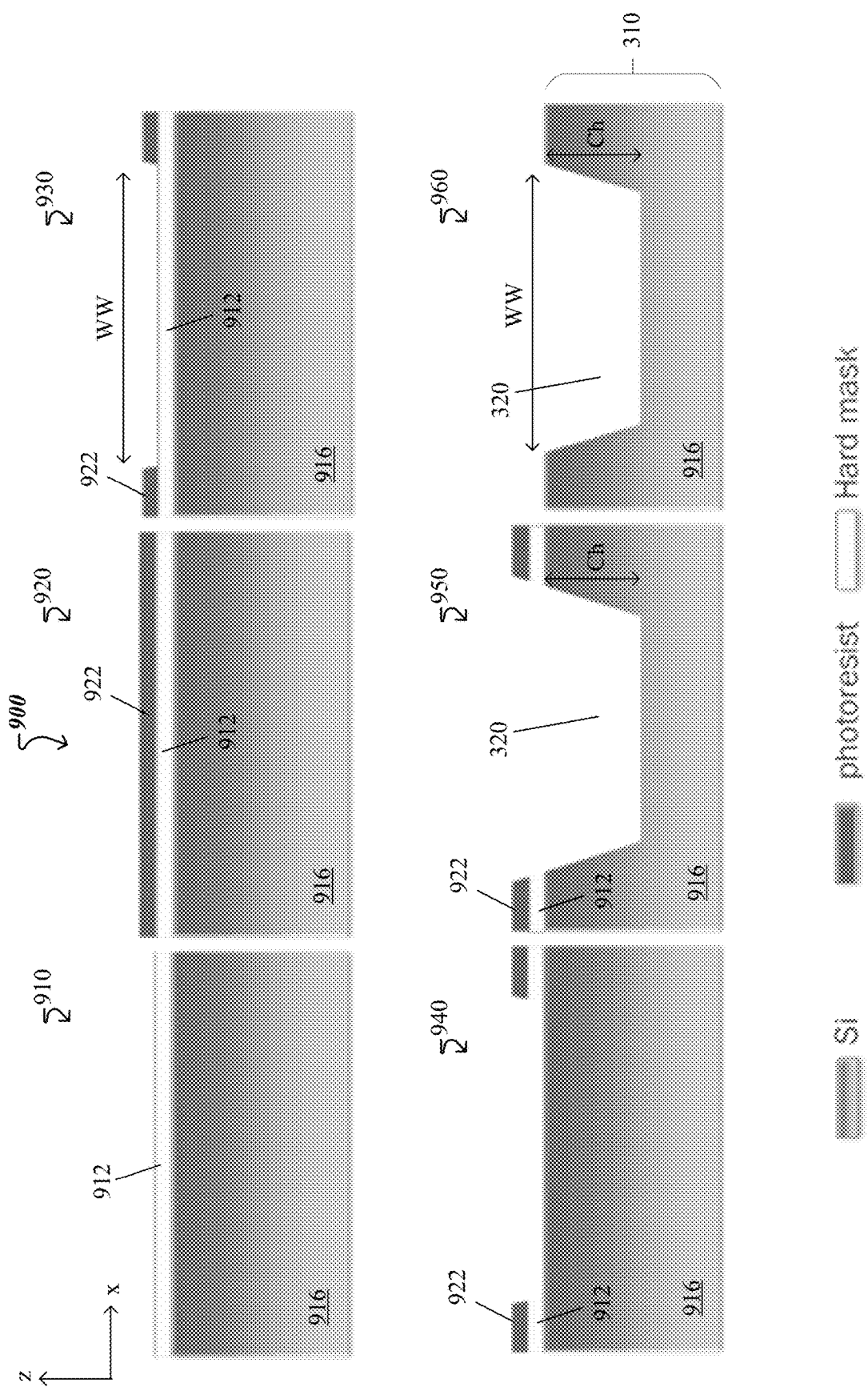
FIG. 9 shows an example of a process for fabricating cap wafers using wet etching of Si wafers.

FIG. 9 shows an implementation of a process 900 for fabricating either of cap wafers 310/410, bottom/top cap wafers 430, or circuit/cap wafers 260 using wet etching of Si wafers 916. Here, a Si wafer 916 can be up to 2 mm thick.

At 910, a hard mask 912 is deposited on a Si wafer 916. As photoresists do not hold up to wet etchants, the hard mask 912 can be SiO2, Si2N4 and metals. For example, low pressure chemical vapor deposition (LPCVD) of 1 μm of SiO2 is performed in a furnace tube, e.g., Tempress TS 6604 S1 (that can be used to deposit low temperature oxide).

At 920, photoresist 922 is spun on the hard mask 912. Then, the photoresist 922 is soft baked. For example, photoresist S1813 can be used to obtain a film of ~1.3 μm thickness. First, photoresist S1813 is dispensed at 900 rpm for 5 sec, then spun at 4000 rpm for 60 sec. Then, the spun photoresist is soft baked on a hot plate at 115° C. for 60 sec.

At 930, the photoresist 922 is exposed, developed and hard baked. In this manner, the lateral dimensions (e.g., a width) WW and locations in the (x-y) plane of recesses 320 are defined at this operation. For example, the soft baked photoresist is exposed with GCA 8500 G-Line (0.35 NA), then developed with MIF-319 developer for 60 sec. Finally, the developed resist is rinsed with DI water and dried.

Alternative to operations 920 and 930, features of the photoresist 922 can be laser printed.

At 940, the hard mask 912 is etched. Wet or dry etching can be used depending on the material of the hard mask 912. As the hard mask 912 is about 1 μm thick, the wet etch undercut is not a concern given the tolerances. For example, buffered HF is used (etch rate for LPCVD SiO2: 120 nm/) for 8 min and 20 sec to etch 1 mm of SiO2. The etched SiO2 is then rinsed with DI water and dried.

At 950, the Si wafer 916 is wet etched to form recesses 320 with a depth $C_h$. Possible etchants are $HNO_3+HF$, KOH, EDP, TMAH. The recommended etchant for different materials of the masks 912 are listed in Table 2.

TABLE 2

| Mask material | Etchant | Operating Temp (° C.) | R100 (μm/min) | $S = R_{100}/R_{111}$ |
|---|---|---|---|---|
| SiO2, Si2N4, Au, Cr, Ag, Cu | Ethylenediamine pyrocatechol (EDP) | 100 | 0.47 | 17 |
| SiO2, Si2N4 (etches at 2.8 nm/min) | KOH/isopropyl alcohol (IPA) | 50 | 1.0 | 400 |
| SiO2, Si2N4 | Tetramethyl-ammonium hydroxide (TMAH) | 80 | 0.6 | 37 |

Note that common Si wet etchants are usually anisotropic with an etch rate depending upon orientation to crystalline planes. For instance, for <100> wafers, KOH selectively etches <111> plane, which results in angled sidewalls (54.7°). Etch depth must be time-controlled after characterizing the etch rate for the specific etchants conditions (temperature, etc.) Etching is stopped when a depth equal to a dimension $C_h$ of a recess 320 is obtained. For example, a wet process is used based on an available recipe and a desired etch depth. Etch time for a target depth of a recess 320 is calculated based on etch rate. The etched recess 320 is then rinsed with DI water and dried.

At 960, the patterned photoresist 922 and the hard mask 912 are removed. In this manner, a cap wafer 310 that has recesses 320 with a width WW and a depth $C_h$ is obtained. For example, the SiO2 is removed using HF or BHF. Note that the photoresist 922 may be removed before operation 950, otherwise it lifts off during the wet etching. Finally, the cap wafer 310 is rinsed with DI water and dried.

Figure 10:
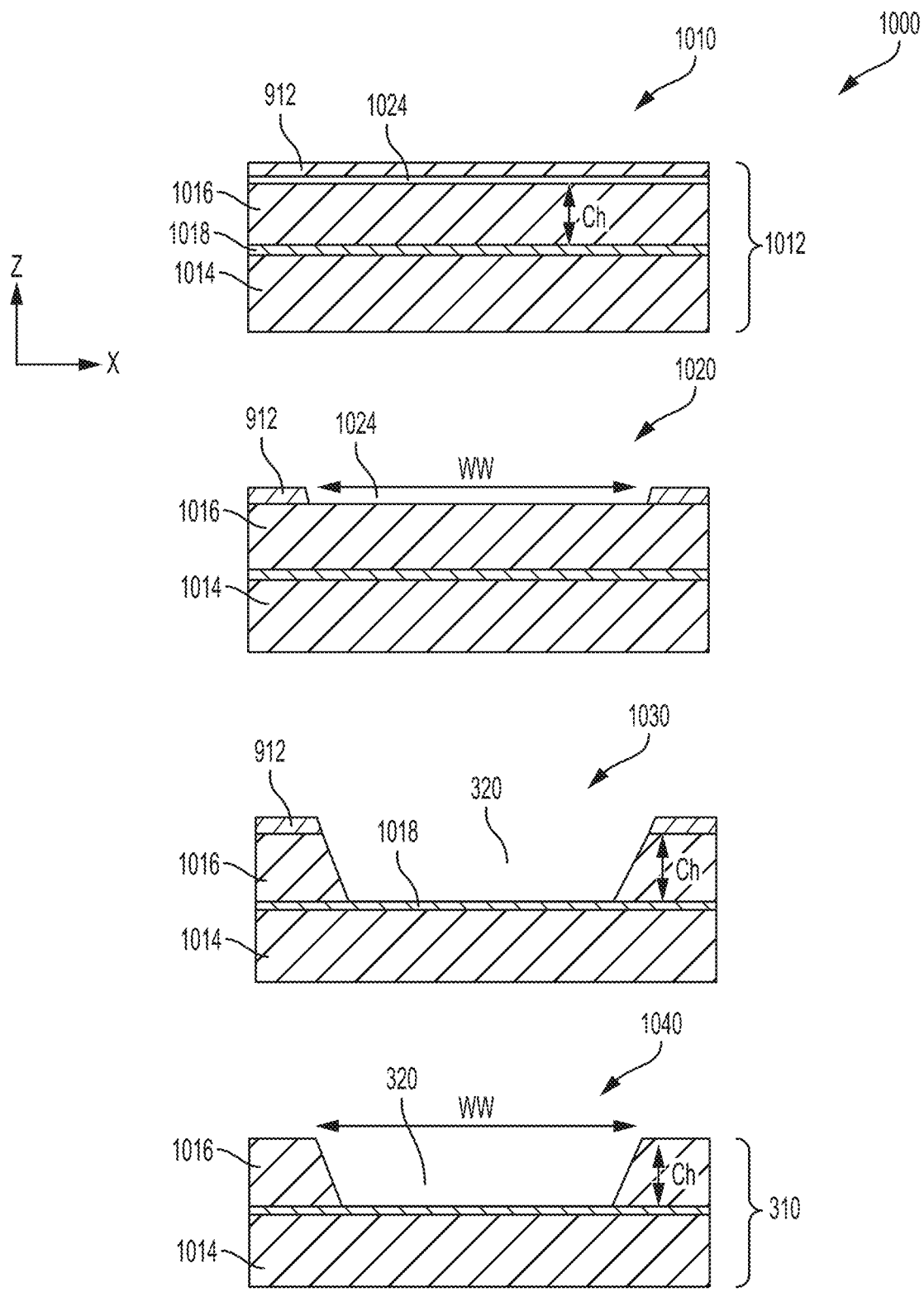
FIG. 10 shows an example of a process for fabricating cap wafers using wet etching of Si on insulator (SOI) wafers.

FIG. 10 shows an implementation of another process 1000 for fabricating either of cap wafers 310/410, bottom/top cap wafers 430, or circuit/cap wafers 260 using wet etching of Si on insulator (SOI) wafers 1012. In other implementations, a Si-insulator-Si (SIS) wafers can be used, where an insulator layer is sandwiched between two Si layers. Note that SOI or SIS wafers can cost 3-4 times more than plain Si wafers. An SOI wafer 1012 includes an insulator layer 1114 and a Si layer 1116. The insulator layer 1114 can include one or more of SiO2, Si2N4, Al2O3, etc.

A depth $C_h$ of a recess 320 is given by the thickness (e.g., 0.5-1.5 mm) of the Si layer 1016 of the SOI wafer 1012. The thickness of the Si layer 1016 is measured between the outer surface 1024 of the SOI wafer 1012 and the interface 1018 between the Si layer and the insulator layer 1014. In the example illustrated in FIG. 10, the insulator layer 1014 of the SOI wafer 1012 is used as an etch stop to avoid difficulties associated with characterization of etch rates. As the insulator layer 1014 has high selectivity to Si etchants, time-controlled etching is not required for process 1000.

At 1010, a hard mask 912 is deposited on the Si layer 1016. For example, LPCVD of 1 µm of SiO2 is performed in a furnace tube, e.g., Tempress TS 6604 S1 (that can be used to deposit low temperature oxide).

At 1020, the hard mask 912 is patterned to define the lateral dimensions (e.g., a width) WW and locations in the (x,y) plane of the recess 320. For example, photoresist S1813 can be used to obtain a film of ~1.3 µm thickness. First, photoresist S1813 is dispensed at 900 rpm for 5 sec, then spun at 4000 rpm for 60 sec. The spun photoresist is soft baked on a hot plate at 115° C. for 60 sec. The soft baked photoresist is exposed with GCA 8500 G-Line (0.35 NA), and developed with MIF-319 developer for 60 sec. Finally, the developed resist is rinsed with DI water and dried. Then, the SiO2 hard mask 912 is etched using buffered HF. The etching of the SiO2 hard mask 912 may take around 8 min and 20 sec, depending on the etch rate and thickness of the SiO2 hard mask. Finally, the etched SiO2 hard mask 912 is rinsed with DI water and dried. Note that the photoresist may be removed before operation 1030, otherwise it lifts off during the wet etching.

At 1030, the Si layer 1016 is wet etched to obtain the recess 320 with a depth $C_h$ equal to the thickness of the Si layer. One of the wet etch recipes listed in Table 2 can be used, although no timing is necessary in this case, as the wet etching of the Si layer 1016 will stop at the interface 1018 between the Si layer and the insulator layer 1014. The etched recess 320 is then rinsed with DI water and dried.

At 1040, the patterned photoresist and the hard mask 912 are removed. In this manner, a cap wafer 310 that has recesses 320 with a width WW and a depth $C_h$ is obtained. For example, the SiO2 hard mask 912 is removed using HF or BHF. Finally, the cap wafer 310 is rinsed with DI water and dried.

Figure 11A:
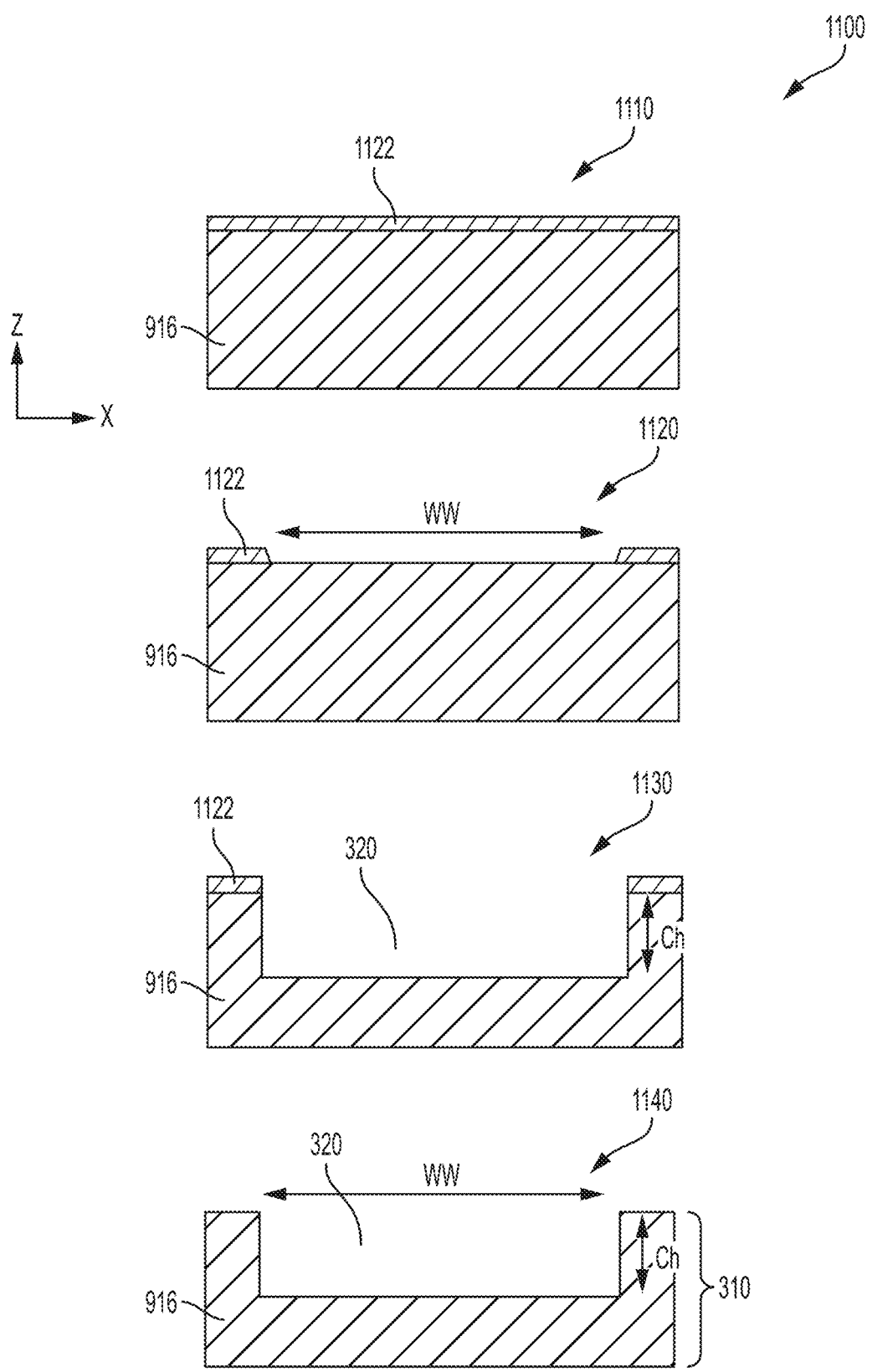
FIG. 11A shows an example of a process for fabricating cap wafers using deep reactive-ion etching (DRIE) of Si wafers.

FIG. 11A shows an implementation of another process 1100 for fabricating either of cap wafers 310/410, bottom/top cap wafers 430, or circuit/cap wafers 260 using deep reactive-ion etching (DRIE) of Si wafers 916. DRIE is a highly anisotropic etch process used to create deep, steep-sided recesses 320 and trenches 321 in Si wafers 916, with aspect ratios of 20:1 or more. Here, a Si wafer 916 can be up to 2 mm thick.

At 1110, a mask layer 1122 is deposited on the Si wafer 916. In some implementations, the mask layer 1122 is a layer of thick photoresist that is spun onto the Si wafer 916, and then soft baked. In other implementations, the mask layer 1122j can be a layer of SiO2 or Si2N4 which have high selectivity to Si etchants. Note that metal masks are not desirable as they sputter inside the DRIE chamber and result in high surface roughness. For example, a 24 µm thick film of AZ 9260 photoresist can be deposited on the Si wafer 916 in the following manner: (i) first coat target: 10 µm film thickness: dispense: static or dynamic @ 300 rpm spin: 2400 rpm, 60 sec; (ii) edge bead removal rinse: 500 rpm, 10 sec dry: 1000 rpm, 10 sec; (iii) first soft bake 110° C., 80 sec hotplate; (iv) second coat target: 24 µm total film thickness: dispense: static or dynamic @ 300 rpm spin: 2100 rpm, 60 sec; (v) edge bead removal rinse: 500 rpm, 10 sec dry: 1000 rpm, 10 sec; and (vi) second soft bake 110° C., 160 sec hotplate.

At 1120, the mask layer 1122 is patterned to define the lateral dimensions (e.g., a width) WW and the locations in the (x,y) plane of the recess 320. For example, the mask layer 1122 that is a thick photoresist layer is exposed, developed and hard baked. Here, the 24 µm thick film of soft baked AZ 9260 photoresist is patterned in the following manner: (i) exposure dose (10% bias) 2100 mJ/cm2, broadband stepper; (ii) development AZ® 400K Developer 1:4, 260 sec spray dispense temp. 27° C. rinse: 300 rpm, 20 sec. dry: 4000 rpm, 15 sec; and (iii) rinse with DI water and dry.

As another example, if the mask layer 1122 is a layer of SiO2 or Si2N4, then photolithography operations described above in connection with FIGS. 9 and 10 are used to pattern the layer of SiO2 or Si2N4. Moreover, laser printing can be used as an alternative method to operations 1110 and 1120.

At 1130, the Si layer 1016 is etched using DRIE to obtain the recess 320 with a depth Ch. For example, a Bosch DRIE process can be used. This process contains successive cycles of etching and passivation with the flow of SF6 and C4F8 gases. C4F8 source gas yields a substance similar to Teflon. Scalloped etched walls are common features of DRIE which could be made smooth by lowering the etch rate. Etch depth (e.g., for obtaining the target depth CO must be time-controlled after characterizing the etch rate for specific chamber conditions (temperature, pressure, gas content, etc.)

At 1140, the patterned photoresist mask layer 912 is removed. In this manner, a cap wafer 310 that has recesses 320 with a width WW and a depth $C_h$ is obtained. For example, the 24 µm thick film of hard baked AZ 9260 photoresist is stripped in the following manner: wet photoresist stripper (NMP: 1-Methyl-2-pyrrolidon or DMSO: dimethyl sulfoxide) or dry oxygen plasma. For 20+µm photoresist film thickness ~15 min is sufficient to remove it all. Then, cap wafer 310 is rinsed with DI water and dried.

Figure 11B:
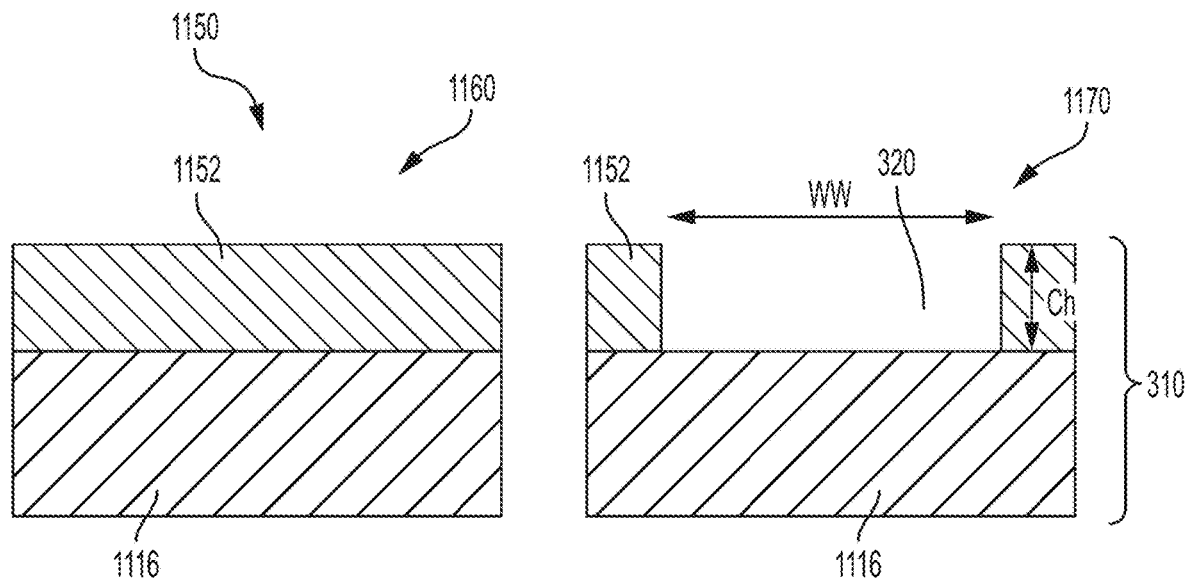
FIGS. 11B-11C show an example of a process that uses SU-8 as structural material for fabricating cap wafers.

FIG. 11B shows an implementation of another process 1150 that uses SU-8 as structural material for fabricating either of cap wafers 310/410, bottom/top cap wafers 430, or circuit/cap wafers 260. SU-8 is an epoxy-based, highly viscous, negative photoresist. It can be spun up to a thickness above 1 mm (normally with multiple spinning steps) and still be processed with optical contact lithography methods. SU-8 has been used to fabricate high aspect ratio waveguide structures. By using SU-8, the bulk micromachining process can be performed through exposure and developing the photoresist rather than etching silicon. As a result, the sidewalls of the recesses 320 are vertical and smooth. In general, cap wafers 310 do not need to have any specific conditions (thickness, crystal planes, etc.) as it remains intact and serves only as the holder during the process. Low temperature characteristics of SU-8 are being investigated.

Figure 11C:
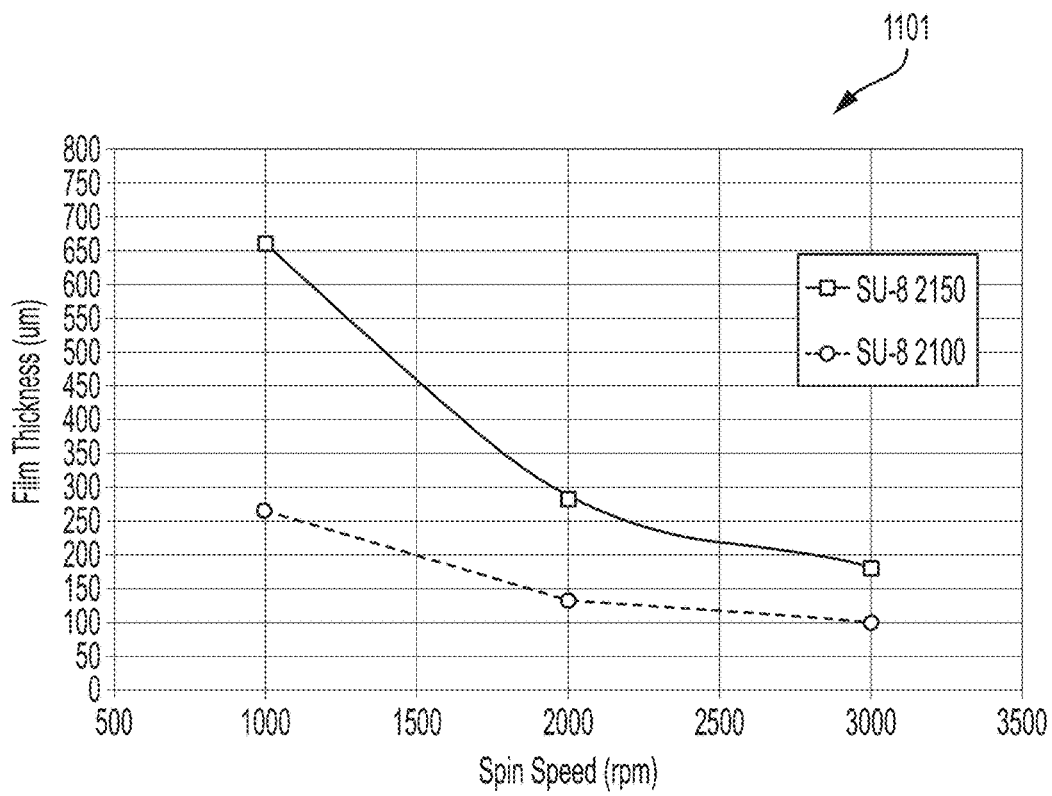

At 1160, an SU-8 layer 1152 is spun on a substrate 1116. The substrate 1116 can be a Si wafer, an insulator wafer, a ceramic wafer or a metallic plate. Here, a thickness of the SU-8 layer 1152 can be equal to or larger than the depth $C_h$ of the recess 320. The spun SU-8 layer 1152 is then baked. FIG. 11C is a plot 1101 that shows dependence of film thickness on the spin speed, for two SU-8 materials.

Referring again to FIG. 11B, at 1170, the baked SU-8 layer 1152 is patterned to obtain a recess with lateral dimensions (e.g., a width) WW at a desired location in the (x,y) plane. Here the baked SU-8 layer 1152 is first exposed and then developed. A total processing time of operations 1160 and 1170 can take about 10 min.

After the cap wafers 310/410, bottom/top cap wafers 430, or circuit/cap wafers 260 have been fabricated using either of the fabrication processes 900, 1000, 1100 or 1150, at least portions of the cap wafers, bottom/top cap wafers, or circuit/cap wafers that include the recesses 320/420 and trenches 321 are coated with an electrically conducting layer that is superconducting at operating temperatures of quantum computing systems 100. In some implementations, spacers (also referred to as standoff bumps) are formed, on a surface of the cap wafers, bottom/top cap wafers, or circuit/cap wafers, between recesses 320/420 and trenches 321, prior to depositing the electrically conducting layer. The standoff bumps are used to control (i) a spacing between a cap wafer on which they are formed with another wafer to which the cap wafer is bonded, and (ii) forces applied, during the bonding process, to a bonding line between the bonded wafers. In some implementations, In bumps are deposited on a surface of the cap wafers, bottom/top cap wafers, or circuit/cap wafers, between recesses 320/420 and trenches 321, after depositing the electrically conducting layer. The indium bumps are used to bond a cap wafer on which they are formed with another wafer to which the cap wafer is bonded.

Figure 12:
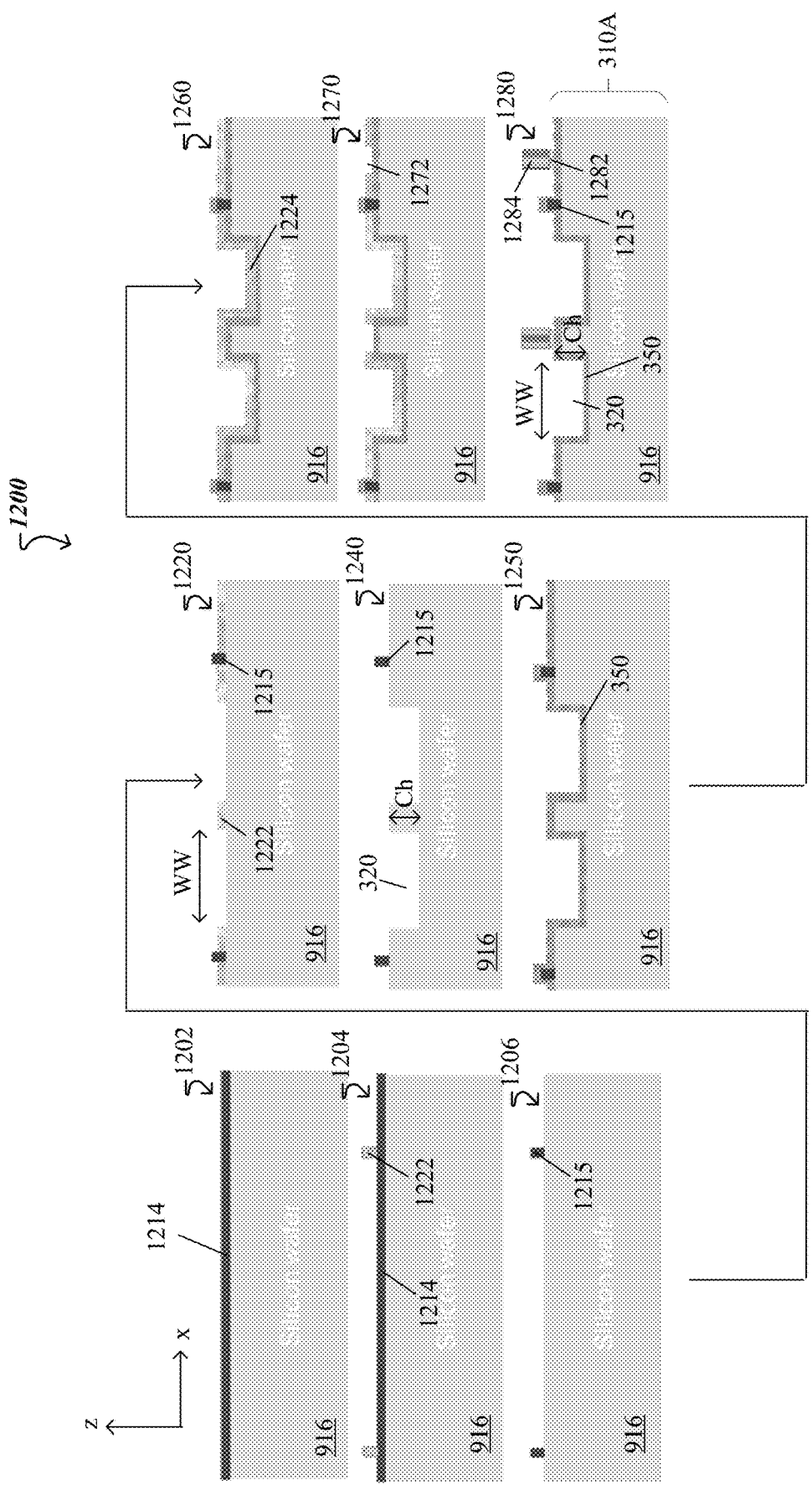
FIG. 12 shows an example of a process for fabricating cap wafers that are coated with an electrically conductive layer and have In bumps.

FIG. 12 shows an implementation of another process 1200 for fabricating cap wafers, for instance, where a fabricated cap wafer 310A has standoff bumps 1215, is coated with an electrically conducting layer 350, and further has In bumps 1284. The process 1200 has four stages: (i) forming the standoff bumps 1215; (ii) forming the recesses 320; (iii) coating the electrically conducting layer 350; and (iv) forming the In bumps 1284.

Stage (i), or forming the standoff bumps 1215, includes the following operations: at 1202, a $SiO_2$ layer 1214 is thermally grown on a Si wafer 916. A thickness of the $SiO_2$ layer 1214 defines the height of the standoff bumps 1215.

At 1204, a photoresist layer 1222 is patterned to define the location in the (x-y) plane of the standoff bumps 1215. The patterned photoresist layer 1222 will be used as a mask for etching the $SiO_2$ layer 1214.

At 1206, the $SiO_2$ layer 1214 is etched to form the standoff bumps 1215 at their desired location in the (x-y) plane. The photoresist layer 1222 is now stripped and the Si wafer 916 that supports the standoff bumps 1215 is cleaned in preparation for the next stage of process 1200.

Stage (ii), or forming the recesses 320, includes the following operations: at 1220, a photoresist layer 1222 is patterned on the Si wafer 916 to define the lateral dimensions (e.g., a width) WW and the locations in the (x,y) plane of the recesses 320. This operation can be performed in a manner similar to the way operation 1120 of process 1100 is performed.

At 1240, the Si wafer 916 is etched using DRIE, and then the photoresist layer 1222 is removed. In this manner, recesses 320 with a depth $C_h$ are obtained. This operation can be performed in a manner similar to the way operation 1130 of process 1100 is performed. The photoresist layer 1222 is now stripped (in a manner similar to the photoresist stripping 1140 of process 1100), and, hence, the Si wafer 916—that supports the standoff bumps 1215 and has the recesses 320—is ready for the next stage of process 1200.

Stage (iii), or coating the electrically conducting layer 350, includes the following operations: at 1250, the electrically conducting layer 350 is coated on the Si wafer 916, over the standoff bumps 1215 and, at least in part, over the recesses 320. For example, a layer of Al having a thickness in the range of 0.1-2 µm is coated using sputter deposition. Sputtering is a non-directional physical vapor deposition (PVD) process which provides the best step/sidewall coverage among all the PVD and chemical vapor deposition (CVD) methods. In this manner, the base and the sidewalls of the recesses 320, and the top and the sidewalls of the standoff bumps 1215 can be effectively covered. To ensure the required thickness on the sidewalls, a layer 350 that is at least twice as much thicker than required is deposited especially for the cases where sidewalls are vertical. After the deposition, EDX could be used to measure the thickness of the deposited layer 350. In some implementations, sub-steps performed at 1250 can be: (a) oxygen plasma treatment to enhance aluminum adhesion; and (b) sputtering aluminum twice as thick as the minimum required thickness to ensure sidewall coverage. Note that a Ti adhesion layer might be needed. In some implementations, a cold/hot deposition can be used for smoother step coverage. The cold/hot deposition consists of cumulatively depositing two layers of Al at different temperatures to achieve a desired total thickness of the electrically conducting layer 350. At this point, the Si wafer 916—that supports standoff bumps 1215, has recesses 320, and is coated with an electrically conducting layer 350—is ready for the next stage of process 1200.

Stage (iv), or forming the In bumps 1284, includes the following operations: at 1260, a negative photoresist layer 1224 is spun on the electrically conducting layer 350. Here, the negative photoresist layer 1224 is coated in a conformal manner to cover the sidewalls of the recesses 320. For this purpose, the negative photoresist layer 1224 has a thickness of up to 10 µm.

At 1270, the negative photoresist layer 1224 is patterned to define openings 1272 in the negative photoresist layer that correspond to locations in the (x-y) plane of the In bumps 1284. Note that the In bumps 1284 are disposed between the recesses 320. Although not shown in FIG. 12, but shown in FIGS. 14A-14B, the In bumps 1284 can be formed based on a pattern that includes channels used to pump out the trapped gas between bumps. This is advantageous because the disclosed microwave integrated quantum circuits will experience low pressure inside dilution refrigerators, and, therefore, trapped gases should be pumped out.

At 1280, the In bumps 1284 are formed. Before the forming of the In bumps 1284, a Ti adhesion layer 1282 is formed on the electrically conducting layer 350 inside the openings 1272. Then, the In bumps 1284 are evaporated on the Ti adhesion layer 1282, such that a height of the In bumps is larger than a total height of the standoff bumps 1215 coated with the electrically conducting layer 350. Once the patterned negative photoresist layer 1224 has been removed, the cap wafer 310A is ready to be bonded to a circuit wafer 210 as part of any of the microwave integrated quantum circuits described above. Note that the cap wafer 310A formed by using process 1200 has standoff bumps 1215, has recesses 320 of width WW and depth $C_h$, is coated with an electrically conducting layer 350, and further includes In bumps 1284.

Figure 13A:
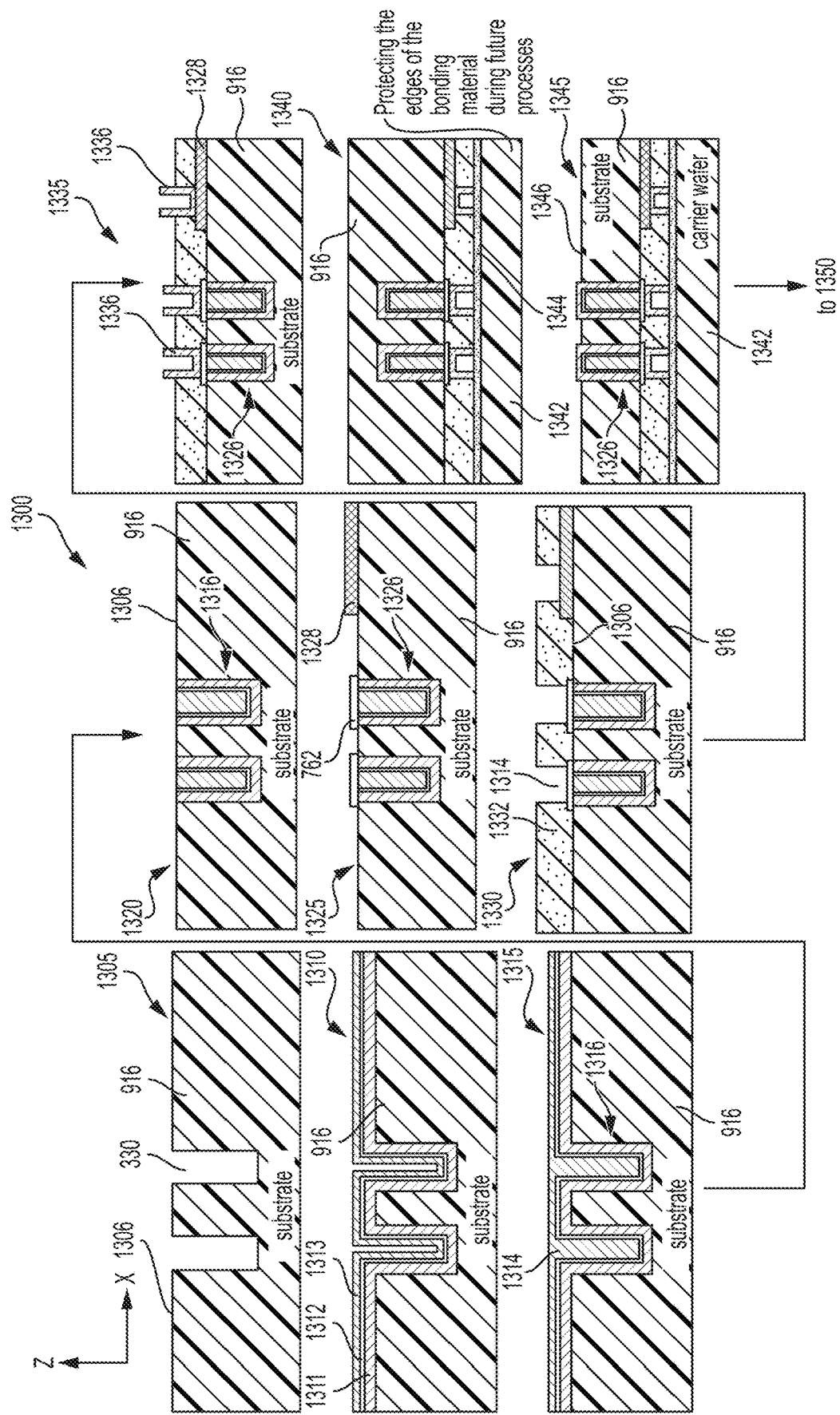
FIGS. 13A-13B show an example of a process for fabricating circuit wafers that have thru vias.
Figure 13B:
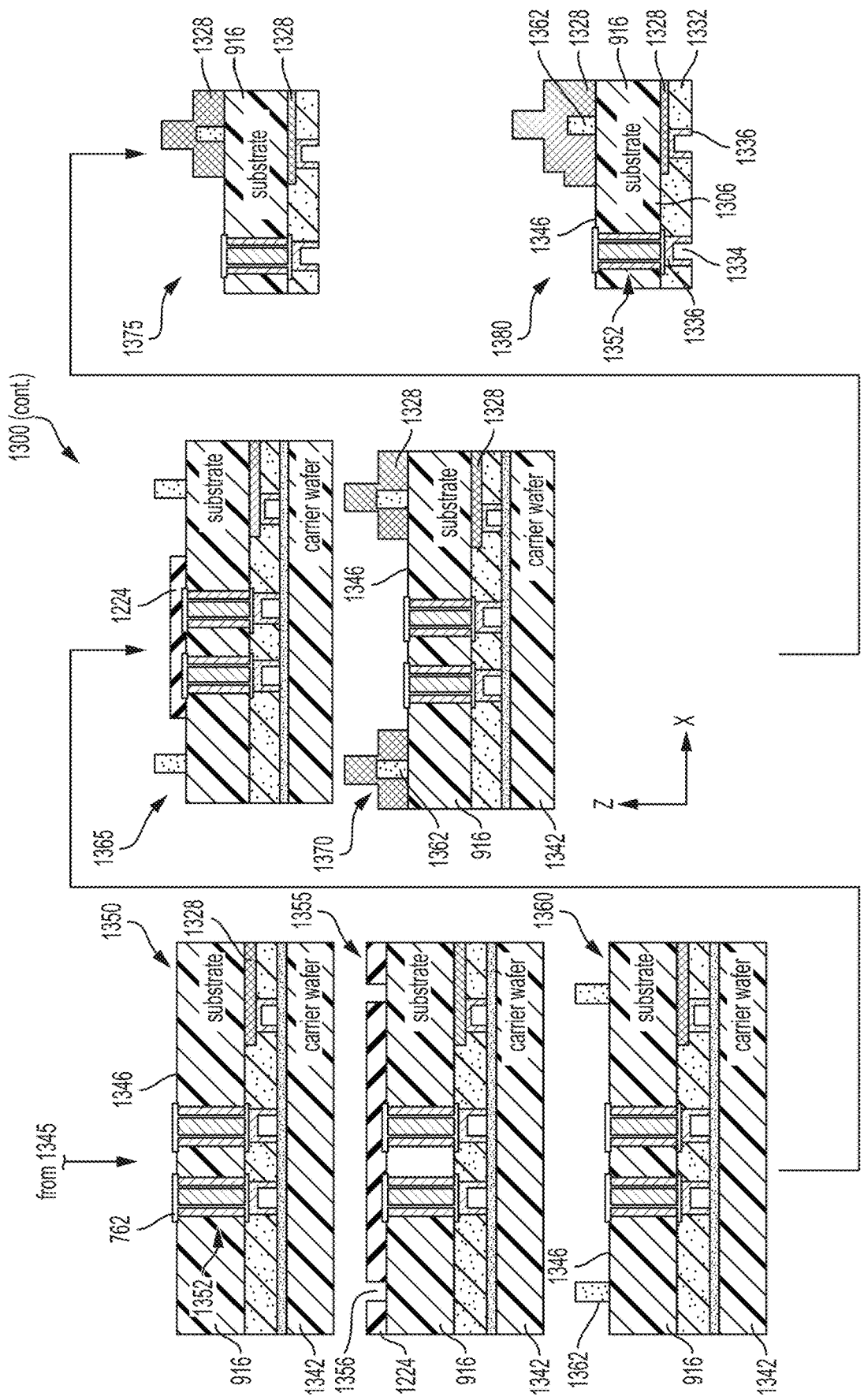

As described above in connection with FIG. 5 and FIG. 6, electrically conducting vias 560, 660, 662 have an important role in isolating quantum circuit devices 240 from each other and from spurious substrate modes, in reducing thermal noise in microwave integrated quantum circuits, in transferring control signals and readout signals between different quantum circuit devices and/or between the quantum circuit devices and the signal delivery system 106. FIGS. 13A-13B show an example of a process 1200 for fabricating any of the electrically conducting vias 560, 660, 662 extending through any of the cap wafers or circuit wafers described herein.

At 1305, a Si wafer 916 is etched using DRIE to form via holes 330 (or openings having a high aspect ratio of 20:1 or more, i.e., openings that are deep and narrow, with steep sidewalls). Operation 1305 includes sub-operations that can be performed in a manner similar to the way the operations 860-890 of process 800 are performed, or to the way the operations of process 1100 are performed.

At 1310, a metal layer 1312, that is superconducting at an operating temperature of the quantum processor cell 102, is deposited. Here, a barrier layer 1311, made from Si2N4, is formed using low pressure chemical vapor deposition (LP-CVD). In this manner, the barrier layer 1311 is formed on the Si wafer 916 to coat the via holes 330. Ti is a superconductor with a critical temperature of 300 mK, and, hence, Ti is a metal that is superconducting at the operating temperature (Top<300 mK) of the quantum processor cell 102. In this manner, the metal layer 1312, made from Ti using LPCVD, is formed on the barrier layer 1311, to coat the via holes 330. As the via holes 330, that are lined with the Si2N4 layer 1311 and the Ti layer 1312, will be filled with Cu as part of an upcoming operation of process 1300, a Cu seed layer 1313 is formed next on the Ti layer. Here, the Cu seed layer 1313 is formed using metal organic chemical vapor phase deposition (MOCVD).

At 1315, a Cu layer 1314 is plated over the Cu seed layer 1313 and fills the inside of the via holes 330 to form blind vias 1316. Here, the plating recipe is adjusted to prevent void creation inside the via holes 330. Further here, the Si2N4 layer 1311 and Ti layer 1312 are used to prevent the diffusion of Cu from inside the blind via 1316 to the Si wafer 916.

At 1320, layers are removed from the top of the Si wafer 916. First, the overburden Cu layer 1314 is removed using chemical mechanical polishing (CMP). The first CMP is stopped on the Ti layer 1312. A post CMP cleaning is performed next, followed by annealing at 400° C. for 1 h or 300° C. for 2 h (to release wafer tension). Second, the Ti layer 1312 and then the Si2N4 layer 1311 are removed using CMP. Here, an additional layer of thickness 0.5 µm from the Si wafer 916 is CMP-ed to remove the contamination diffused on the surface of the Si wafer. A surface 1306 of the Si wafer 916 is formed in this manner.

At 1325, the blind vias 1316 are capped with Ti caps 762 to form single-capped vias 1326. First, a layer of Ti is formed on the surface 1306 of the Si wafer 916 over the blind vias 1316; photoresist spun on the layer of Ti is patterned to define the size of the caps 762; then the layer of Ti is wet etched to form the Ti caps 762; also, Ti oxide is cleaned from the Ti caps 762 using reverse sputtering (here, reverse sputtering is a process where Ar plasma is run with no target, therefore, instead of deposition of the target, etching from the substrate happens and the oxide layers on the Ti caps are etched away). Second, an Al layer 1328 is formed on the surface 1306 of the Si wafer 916 over the single-capped vias 1326; photoresist spun on the Al layer 1328 is patterned to define desired Al features (e.g., coupling line, signal lines, etc.); then the Al layer 1328 is wet etched to form the desired Al features.

At 1330, a passivation layer 1332 is formed on the surface 1306 of the Si wafer 916. The passivation layer 1332 is chosen to be resistant to the developing and etching chemistries which happen at later stages and to be robust at cryogenic temperatures. For instance, the passivation layer 1332 can be a polyimide, e.g., PBO (Polybenzoxazoles) or BCB (Benzocyclobutene). The passivation layer 1332 is patterned to define openings 1334 over at least some of the single-capped vias 1326 and the features of the Al layer 1328.

At 1335, an under-bump metal layer 1336 inside the openings 1334 of the passivation layer 1332 is formed. In this manner, the under-bump metal layer 1336 is formed on the Ti caps 762 of the single-capped vias 1326 and on the features of the Al layer 1328. The under-bump metal layer 1336 can be formed from Ti/Pd or Ti/Pt using sputter deposition. The goal of operation 1335 is to deposit a metal which is solderable on surfaces of metals that are not solderable. For example, Al is not solderable, so bonding to the features of the Al layer 1328 would be challenging if the under-bump metal layer 1336 were not deposited.

At 1340, a temporary carrier 1342 is bonded to the passivation layer 1332. As the Si wafer 916 will be thinned down during an upcoming operation of process 1300, the carrier wafer 1342 will ease future handling of the Si wafer.

At 1345, the Si wafer 916 is thinned down until ends of the single-capped vias 1326 are revealed and a surface 1346 is formed. As the thinning down is performed using CMP, the resulting surface 1346 of the Si wafer 916 can be smooth.

At 1350, the single-capped vias 1326 are capped at their respective revealed ends with Ti caps 762 to form double-capped vias 1352, referred to simply as capped vias 1352. First, CuO is removed from the revealed ends of the single-capped vias 1326 using reverse sputtering. Second, another layer of Ti is formed on the surface 1346 of the Si wafer 916 over the capped vias 1352; photoresist spun on the other layer of Ti is patterned to define the size of the caps 762; then the other layer of Ti is wet etched to form the Ti caps 762 on the surface 1346 of the Si wafer 916. Here, the surface 1346 is cleaned with Acetone (ultrasonic bath), IPA (ultrasonic bath), Dehydration (vacuum or N2 for 1 hr), O2 plasma. In this manner, the capped vias 1352 include bulk Cu (which is an electrical conductor but is non-superconducting at operating temperatures) capped with surrounded by Ti (which is superconducting at operating temperatures).

In this manner, the non-superconducting material inside the capped vias 1352 will not be exposed to electromagnetic fields in the Si wafer 916.

At 1355, a negative photoresist layer 1224 is formed on the surface 1346 of the Si wafer 916. The negative photoresist layer 1224 is then patterned to define openings 1356 to the surface 1346.

At 1360, a layer of Ti/Pd is deposited over the patterned negative photoresist layer 1224. The patterned negative photoresist layer 1224 is then lifted-off to form alignment marks 1362 for e-beam writing on the surface 1346 of the Si wafer 916. Here, the surface 1346 of the Si wafer 916 is cleaned.

At 1365, a negative photoresist layer 1224 is formed on the surface 1346 of the Si wafer 916. The negative photoresist layer 1224 is then patterned to define size and location of Al features to be formed on the surface 1346. Ti oxide is removed from the alignment marks 1362 using reverse sputtering.

At 1370, another Al layer 1328 is formed over the patterned negative photoresist layer 1224 to cover alignment marks 1362. The patterned negative photoresist layer 1224 is then lifted-off to form features of the Al layer 1328 that cover the alignment marks 1362.

At 1375, the carrier wafer 1342 is de-bonded from the passivation layer 1332. In addition, the Si wafer 916 is diced into smaller pieces.

At 1380, the features of the Al layer 1328 that cover the alignment marks 1362 are modified. First, the surface 1346 of the Si wafer 916 is cleaned, then $Al_2O_3$ is removed, then negative photoresist is spun and patterned. Second, a double-angle Al evaporation is performed, followed by lift-off to obtained modified features of the Al layer 1328 that cover the alignment marks 1362.

In this manner, process 1300 can be used to form pieces of Si wafer 916 and capped vias 1352 extending through the Si wafer from a surface 1306 to the opposing surface 1346. Features of an Al layers 1328 cover alignment marks 1362 formed on the 1346 surface. Another Al layer 1328 has different features on the surface 1306. A passivation layer 1332 is attached to the surface 1306 of the Si wafer 916. An under-bump metal layer 1336 is disposed inside openings of the passivation layer 1332 on Ti caps of at least some of the capped vias 1352 and on at least some of the features of the Al layer 1328 on the surface 1306 of the Si wafer 916.

As described above, the various types of cap wafers (e.g., 310, 410, 430, 260) are bonded together with various types of circuit wafers (e.g., 210, 260) to form 2D microwave integrated quantum circuits (e.g., 300, 400, 500, 600A, 600B) or 3D microwave integrated quantum circuits (e.g., 400M, 600AM, 600BM). The bonding methods described below, that are used to fabricate such microwave integrated quantum circuits, satisfy one or more of the following features. Bonding elements (e.g., bumps, balls, etc.) used by the disclosed bonding processes are superconducting at cryogenic temperatures (~10 mK), so that the bonding elements do not induce additional loss mechanism to the quantum circuit devices 240 which operate at the cryogenic temperature. Temperature is maintained low (<100° C., preferably <80° C.) during some of the disclosed bonding processes due to the sensitivity to heat of Josephson junctions of some of the quantum circuit devices 240. For example, force-only bonding (at room temperature) is used in some cases. As another example, Al—Al bonding can be performed at low temperatures if the native grown oxide on the surface of Al pads is removed (by plasma surface treatment, for instance). As yet another example, ductile material, e.g., In, is preferable because its oxide can be broken by applying pressure and deforming it. Bonding interfaces are not hermetic because the disclosed microwave integrated quantum circuits will experience low pressure inside dilution refrigerators, and, therefore, trapped gases should be pumped out.

Figure 14A:
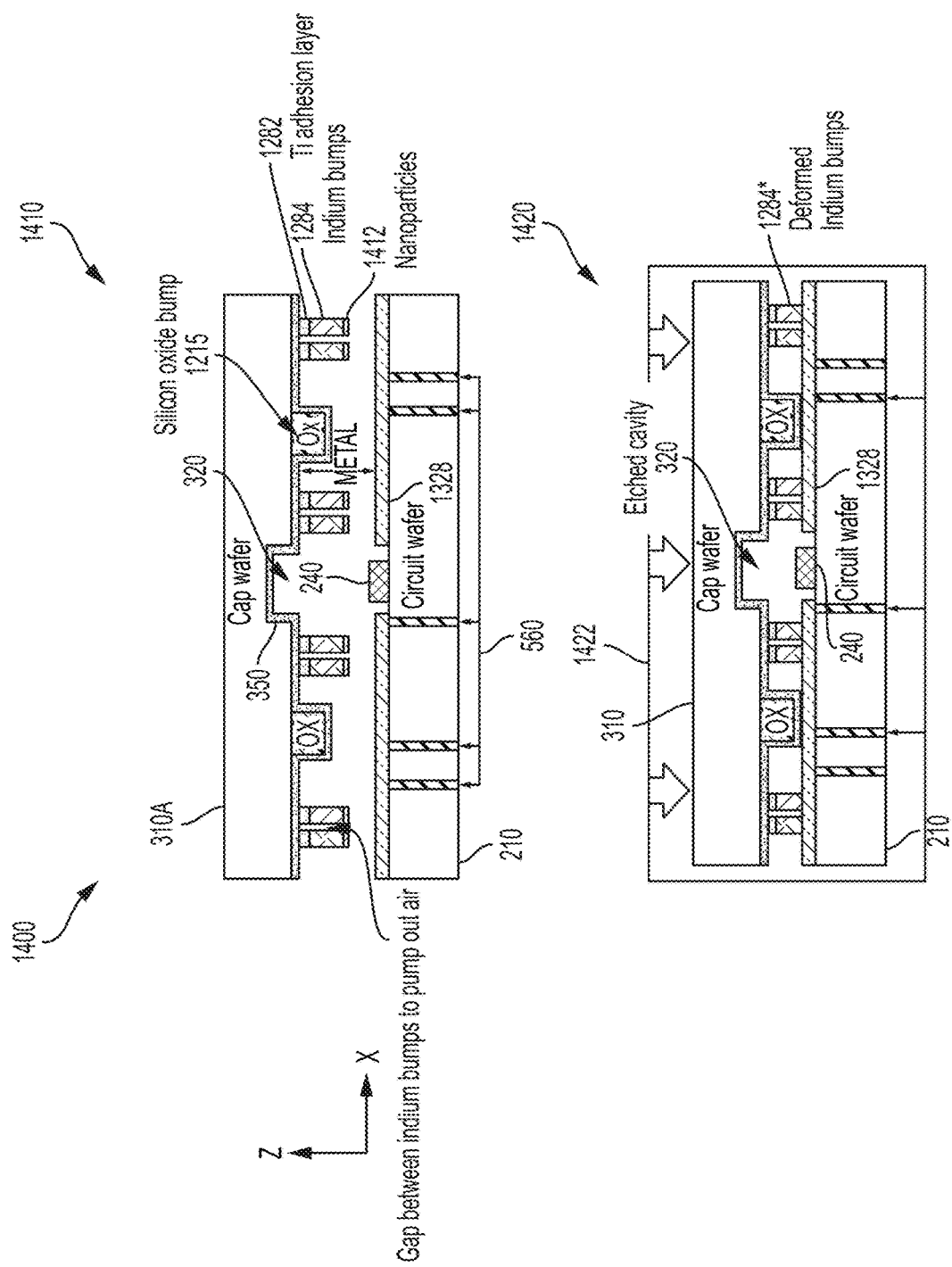
FIG. 14A shows an example of a process for bonding constitutive wafers of a 2D microwave integrated quantum circuit using In bumps at low temperature.

FIG. 14A shows an example of a process 1400 for fabricating a 2D microwave integrated quantum circuit, e.g., like the 2D microwave integrated quantum circuit 600A described above in connection with FIG. 6A.

At 1410, a circuit wafer 210 and a cap wafer 310A are received. Here, the circuit wafer 210 supports quantum circuit devices 240 (only one of which is shown in FIG. 14A). Note that process 1300 has been used to fabricate electrically conducting thru vias 560 and Al features 1284 of the circuit wafer 210. Moreover, process 1200 has been used to fabricate the cap wafer 310A that has recesses 320 (only one of which is shown in FIG. 14A) and standoff bumps 1215, is coated with an electrically conducting layer 350, and further has In bumps 1284 connected to the electrically conducting layer through a Ti adhesion layer 1282.

At 1420, the circuit wafer 210 is cold bonded to the cap wafer 310A. Here, the bonding is performed using a press 1422, in which circuit wafer 210 can be held fixed while applying pressure to the cap wafer 310A against the circuit wafer. The press 1422 can be part of a dedicated mechanical fixture, or part of an integrated bonding system, e.g., a flip-chip bonder. As described above in connection with FIG. 12, the height of the In bumps 1284 before bonding is larger than the total height of the standoff bumps 1215 coated with the electrically conducting layer 350. Therefore, a value of the pressure experienced by the In bumps 1284, as they deform when the press 1422 applies pressure to the cap wafer 310A, is controlled by the height of the coated standoff bumps 1215. In fact, the deforming pressure is maximum when an air gap is formed between the cap wafer 310A and the circuit wafer 210 that has a gap thickness equal to the height of the coated standoff bumps 1215. Additionally, the deformed In bumps 1284* are thicker and shorter (e.g., >35% shorter) than the In bumps 1284 before bonding.

In general, bonding two naturally oxidized metallic layers includes removing or breaking the oxides from both sides to create metal-metal bonds. As such, the pressure applied on the cap wafer 310 has to exceed a threshold pressure that allows breakage (i) of the naturally grown InO to expose barren In on the deformed In bumps 1284* and (ii) of the naturally grown $Al_2O_3$ to expose Al on the Al features 1328, in order to create metal-metal bonds necessary for bonding. To lower the threshold pressure, in some implementations, the receiving operation 1410 includes dispersing sharp edged diamond nanoparticles 1412 over the In bumps 1284 so that the InO layer on the deformed In bumps 1284* and the $Al_2O_3$ layer on the Al features 1328 can easily be broken when pressure is applied. Note that the bonding operation 1420 is performed at temperatures that do not exceed 100° C., e.g., at temperatures less than 80° C.

A process 1400M for fabricating a 3D microwave integrated quantum circuit, e.g., like the 3D microwave integrated quantum circuit 600A described above in connection with FIG. 6E is described next. The process 1400M includes performing operation 1410 of process 1400, and performing an appropriate number of iterations of operation 1420 of process 1400.

Figure 14B:
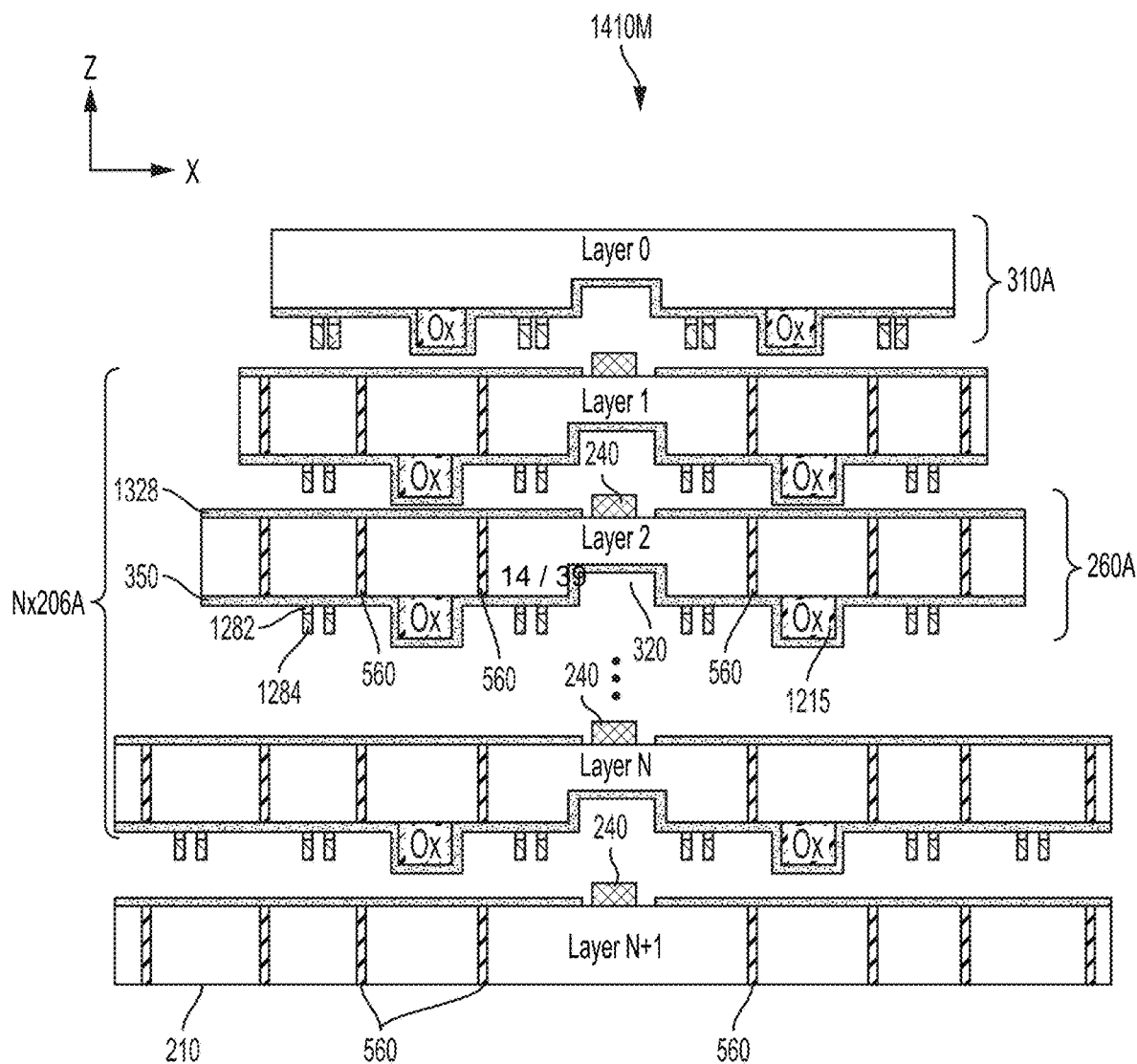
FIG. 14B shows aspects of a process for bonding constitutive wafers of a 3D microwave integrated quantum circuit using In bumps at low temperature.

At 1410M, a circuit wafer 210 and a cap wafer 310A are received as described in connection with operation 1410 of process 1400. In addition, at 1410M, N circuit/cap wafers 260A are received, as illustrated in FIG. 14B. Here, the circuit wafer 210 and the circuit/cap wafers 260A each supports quantum circuit devices 240 (only one of which is shown in FIG. 14B). Note that process 1300 has been used to fabricate electrically conducting thru vias 560 and Al features 1284 of the circuit wafer 210 and of the circuit/cap wafers 260A. Moreover, process 1200 has been used to fabricate the cap wafer 310A and at least portions of the circuit/cap wafers 260A, where each of the cap wafer and the circuit/cap wafers that has recesses 320 (only one of which is shown in FIG. 14B) and standoff bumps 1215, is coated with an electrically conducting layer 350, and further has In bumps 1284 connected to the electrically conducting layer through a Ti adhesion layer 1282. Note that the N circuit/cap wafers 260A are configured such that an area in the (x,y) plane, A(j), of the $j^{th}$ circuit/cap wafer 260A(j), where j=1 . . . N, increases from top to bottom: A(1)< A(2)< . . . <A(N). Moreover, area A(1) of the circuit/cap wafer 260A(1) adjacent to the cap wafer 310A is smaller than the area in the (x,y) plane of the cap wafer, and area A(N) of the circuit/cap wafer 260A(N) adjacent to the circuit wafer 210 equal to or larger than the area in the (x,y) plane of the circuit wafer.

The iteration of operations 1420 are performed bottom-to-top, in the following manner. As a first iteration of operation 1420, the circuit wafer 210 is cold bonded to the circuit/cap wafer 260A(N) by applying pressure P(N) to the circuit/cap wafer 260A(N) against the circuit wafer. Here, a value of the applied pressure is P(N)=F(N)/A(N), where F(N) is the force used to press on the circuit/cap wafer 260A(N) over its area A(N).

As a second iteration of operation 1420, the circuit/cap wafer 260A(N) is cold bonded to the circuit/cap wafer 260A(N−1) by applying pressure P(N−1) to the circuit/cap wafer 260A(N−1) against the circuit/cap wafer 260A(N). Here, a value of the applied pressure is P(N−1)=F(N−1)/A(N−1), where F(N−1) is the force used to press on the circuit/cap wafer 260A(N−1) over its area A(N−1). Because A(N−1)<A(N), a smaller force F(N−1)<F(N) is used to press on the circuit/cap wafer 260A(N−1) to obtain the same or slightly smaller bonding pressure P(N−1)<P(N). And so on, in each additional step, the utilized bonding force is smaller than the previous one F(j−1)<F(j), where j=N . . . 1, and thus the bonding of the previous pair is not compromised. In some implementations, the relative magnitude of the force applied for consecutive iterations can be controlled by the relative height of the coated standoff bumps 1215, in the following manner. To insure that the condition F(j−1)<F(j) holds, the height H(j−1) of the coated standoff bumps 1215 for an iteration (j−1) has to be larger than the height H(j) of the coated standoff bumps 1215 for the previous iteration (j), where j=N . . . 1. In other words, the height of the coated standoff bumps 1215 decreases top-to-bottom, with the tallest coated standoff bumps 1215 between the cap wafer 310A and the circuit/cap wafer 260A(1), and the shortest coated standoff bumps 1215 between the circuit/cap wafer 260A(N) and the circuit wafer 210.

As the before last iteration of operation 1420, the circuit/cap wafer 260A(1) is cold bonded to the circuit/cap wafer 260A(2) by applying pressure P(1) to the circuit/cap wafer 260A(1) against the circuit/cap wafer 260A(2). Here, a value of the applied pressure is P(1)=F(1)/A(1), where F(1) is the force used to press on the circuit/cap wafer 260A(1) over its area A(1). Because A(1)<A(2), a smaller force F(1)<F(2) is used to press on the circuit/cap wafer 260A(1) to obtain the same or slightly smaller bonding pressure P(1)<P(2).

As the last iteration of operation 1420, the cap wafer 310A is cold bonded to the circuit/cap wafer 260A(1) by applying pressure P(310A) to the cap wafer 310A against the circuit/cap wafer 260A(1). Here, a value of the applied pressure is P(310A)=F(310A)/A(310A), where F(310A) is the force used to press on the cap wafer 3100A over its area A(310A). Because A(310A)<A(1), a smaller force F(310A)<F(1) is used to press on the cap wafer 310A to obtain the same or slightly smaller bonding pressure P(310A)<P(1).

Here, the number of N circuit/cap wafers 260A included in a 3D microwave integrated quantum circuit obtained using process 1410M can be N=1, as in the 3D microwave integrated quantum circuit 600AM, N=2, 3, 7, 15, 31 or other numbers.

Figure 15:
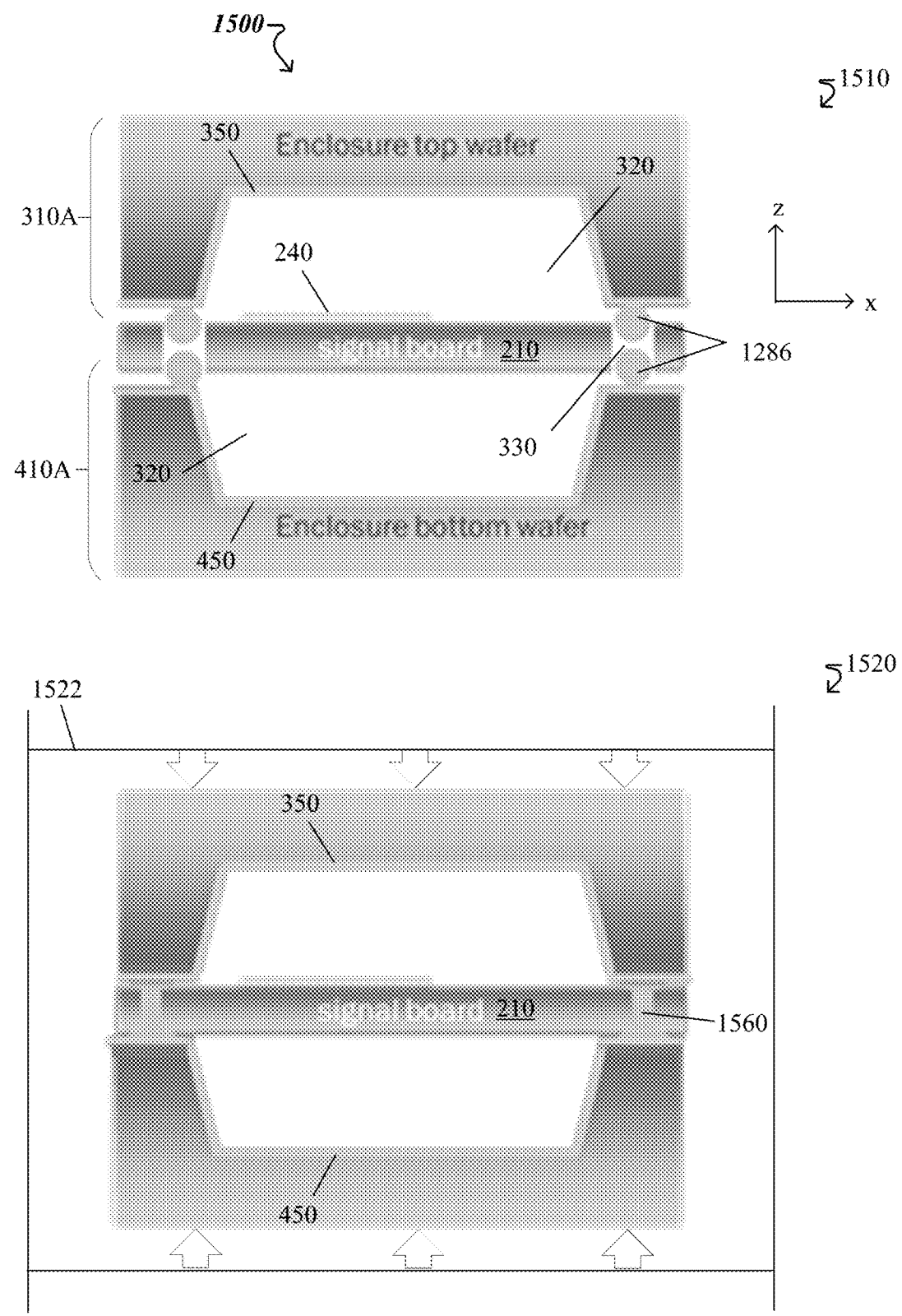
FIG. 15 shows an example of a process for bonding constitutive wafers of a 2D microwave integrated quantum circuit using In balls at low temperature.

FIG. 15 shows another example of a process 1500 for fabricating a 2D microwave integrated quantum circuit, e.g., like the 2D microwave integrated quantum circuit 600B described above in connection with FIG. 6B.

At 1510, a circuit wafer 210, a top cap wafer 310A and a bottom cap wafer 410A are received. Here, the circuit wafer 210 supports quantum circuit devices 240 (only one of which is shown in FIG. 15). Note that either of the processes 800 or 1300 can be used to fabricate via holes 330 in the circuit wafer 210. Moreover, a process similar to process 1200 has been used to fabricate the cap wafers 310A, 410A, each of which has recesses 320, 420 (only one of each is shown in FIG. 15), is coated with an electrically conducting layer 350, 450, and further has In balls 1286 connected to the electrically conducting layer.

As part of the receiving operation 1510, surfaces of the top cap wafer 310A and the bottom cap wafer 410A that are to be bonded can be cleaned using a plasma treatment. These surfaces include surfaces of the In balls 1286 and areas of the electrically conducting layers 350, 450 adjacent to the In balls.

After the plasma treatment, the following alignments are performed: (i) the top cap wafer 310A is aligned relative to the circuit wafer 210, such that the In balls 1286 connected to the top cap wafer register to the top end of the via holes 330 of the circuit wafer; and (ii) the bottom cap wafer 410A is aligned relative to the circuit wafer 210, such that the In balls 1286 connected to the bottom cap wafer register to the bottom end of the via holes 330 of the circuit wafer.

At 1520, the circuit wafer 210, the top cap wafer 310A and the bottom cap wafer 410A are cold bonded together. Here, the bonding is performed using a press 1522, in which the top cap wafer 310A is pressed against the top surface of the circuit wafer 210, and the bottom cap wafer 410A is pressed against the bottom surface of the circuit wafer. Ductility of In (Mohs scale: 1.2) enables the In balls 1286 to deform (and not break) and fill the via holes 330 when the pressure is applied by the press 1522. In this manner, the top cap wafer 310, the circuit wafer 210 and the bottom cap wafer 410 are bonded together by the In that filled the via holes 330 to form In vias 1560. Note that the bonding operation 1520 is performed at temperatures that do not exceed 100° C., e.g., at temperatures less than 80° C.

The In vias 1560 also provide an electrical connection between the electrically conducting layers 350, 450 of the cap wafers 310, 410. In this manner, it is sufficient to provide a single ground connection to one of the electrically conducting layers 350, 450, and the other one of the electrically conducting layers 450, 350 will also be grounded through the In vias 1560.

Figure 16:
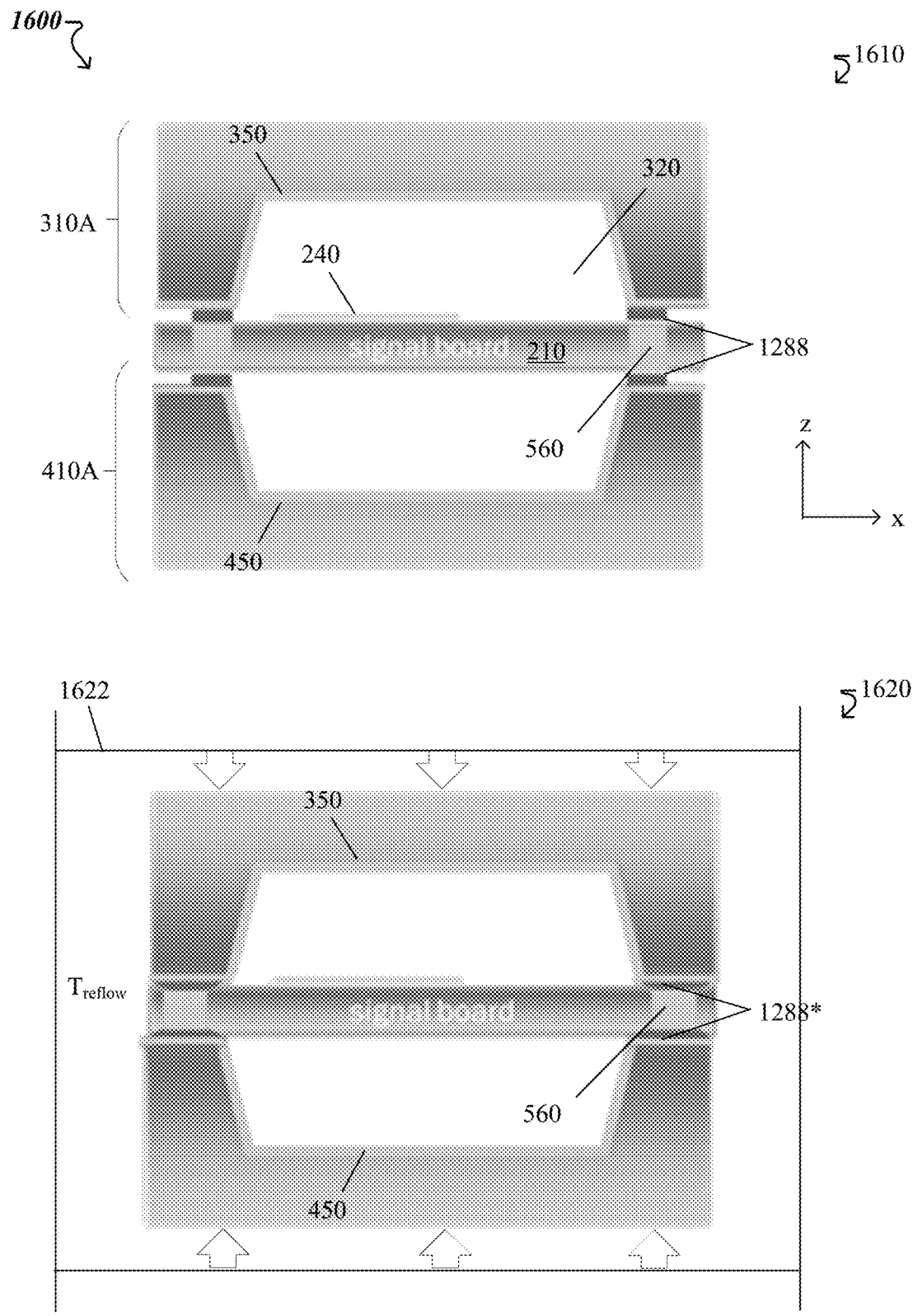
FIG. 16 shows an example of a process for bonding constitutive wafers of a 2D microwave integrated quantum circuit using solder reflow at low temperature.

FIG. 16 shows another example of a process 1600 for fabricating a 2D microwave integrated quantum circuit, e.g., like the 2D microwave integrated quantum circuit 600B described above in connection with FIG. 6B. Process 1600 includes the operations of process 1400 and an alignment step from process 1500.

At 1610, a circuit wafer 210, a top cap wafer 310A and a bottom cap wafer 410A are received. Here, the circuit wafer 210 supports quantum circuit devices 240 (only one of which is shown in FIG. 16). Note that process 1300 can be used to fabricate electrically conducting vias 560 in the circuit wafer 210. Moreover, a process similar to process 1200 has been used to fabricate the cap wafers 310A, 410A, each of which has recesses 320, 420 (only one of each is shown in FIG. 16), is coated with an electrically conducting layer 350, 450, and further has solder bumps 1288 connected to the electrically conducting layer. The solder bumps 1288 can include a solder alloy, e.g., an In-based solder alloy, such as In/Ga solder, that can be reflowed at low temperature. For example, In/Ga solder has meting temperature ~16° C.

As part of the receiving operation 1610, surfaces of the top cap wafer 310A and the bottom cap wafer 410A that are to be bonded can be cleaned using a plasma treatment. These surfaces include surfaces of the solder bumps 1288 and areas of the electrically conducting layers 350, 450 adjacent to the solder bumps.

After the plasma treatment, the following alignments are performed: (i) the top cap wafer 310A is aligned relative to the circuit wafer 210, such that the solder bumps 1288 connected to the top cap wafer register to the top end of the electrically conducting vias 560 of the circuit wafer; and (ii) the bottom cap wafer 410A is aligned relative to the circuit wafer 210, such that the solder bumps 1288 connected to the bottom cap wafer register to the bottom end of the electrically conducting vias of the circuit wafer.

At 1620, the circuit wafer 210, the top cap wafer 310A and the bottom cap wafer 410A are bonded together by reflowing the solder bumps 1288. Here, the bonding is performed using a reflow apparatus 1622, to apply pressure and temperature for solder reflow. In this manner, the top cap wafer 310, the circuit wafer 210 and the bottom cap wafer 410 are bonded together by metal-metal bonds formed between caps of the electrically conducting vias 560 and the reflowed bumps 1288*. Note that the solder reflow operation 1520 is performed at temperatures that do not exceed 100° C., e.g., at temperatures less than 80° C.

The solder-capped vias (**1288\*-560-1288\*) provide an electrical connection between the electrically conducting layers 350, 450 of the cap wafers 310, 410. In this manner, it is sufficient to provide a single ground connection to one of the electrically conducting layers 350, 450, and the other one of the electrically conducting layers 450, 350 will also be grounded through the solder-capped vias (1288\*-560-1288\***).

Figures 17A, 17B, 17C:
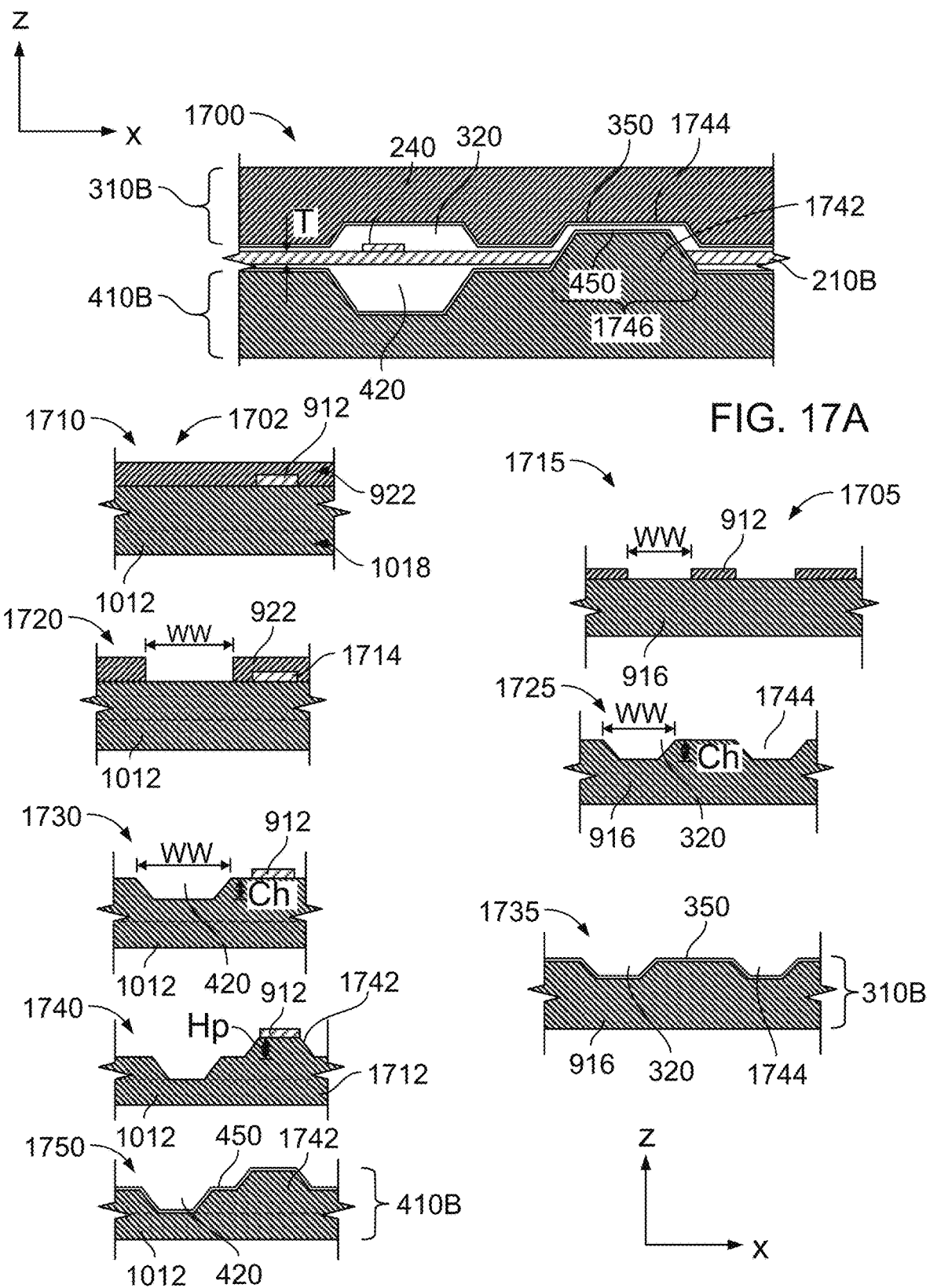
FIG. 17A shows a 2D microwave integrated quantum circuit that includes a circuit wafer and two cap wafers that have mating features that are distal to quantum circuit devices thereof.
FIGS. 17B-17C show an example of a process for fabricating the cap wafers with mating features.

In some implementations, a 2D microwave integrated quantum circuit can be fabricated using cap wafers with mating features, such that In or solder bumps, electrically conductive vias are not required for assembling the 2D microwave integrated quantum circuit. An example of such a 2D microwave integrated quantum circuit is shown in FIG. 17A. FIG. 17 is a side view of an example of a 2D microwave integrated quantum circuit 1700 including a circuit wafer 210B, a top cap wafer 310B and a bottom cap wafer 410B that are arranged and configured like the corresponding components of the 2D microwave integrated quantum circuit 400 described above in connection with FIGS. 4A-4B.

However, the top cap wafer 310B has, in addition to structural and functional characteristics of the top cap wafer 310, a plurality of mating recesses 1744 (although only one is shown in FIG. 17A) that form a top cap pattern. Further, the bottom cap wafer 410B has, in addition to structural and functional characteristics of the bottom cap wafer 410, a plurality of mating protrusions 1742 that form a bottom cap pattern that is a "negative image" of the top cap pattern. Furthermore, the circuit wafer 210B has, in addition to structural and functional characteristics of the top circuit wafer 210, a plurality of openings 1746 (although only one is shown in FIG. 17A) arranged based on the bottom cap pattern. As such, the circuit wafer 210B is disposed over the bottom cap wafer 410 such that the mating protrusions 1742 protrude through the openings 1746. In this manner, the circuit wafer 210B and the bottom cap wafer 410B are secured together in the (x,y) plane. Moreover, the top cap wafer 310B is disposed over the circuit wafer 210B such that the mating recesses 1744 rest on top of the mating protrusions 1742 of the bottom cap wafer 410B. In this manner, the top cap wafer 310B and the circuit wafer 210B are secured together in the (x,y) plane.

Note that the mating protrusions 1742 and mating recesses 1744 form large contact surface areas which ensure, when compression along the z-axis is maintained on the 2D microwave integrated quantum circuit 1700, reliable DC (e.g., ground) and RF (e.g., signal) connections between at least portions of the electrically conducting layer 350 that coats the top cap wafer 310B and of the electrically conducting layer 450 that coats the bottom cap wafer 410B, without the use of solder bumps, In bumps, In vias, etc. In some implementations, cold welding may occur upon compressing the 2D microwave integrated quantum circuit 1700, for example, between when surfaces of the electrically conducting layers 350, 450 are covered with In.

FIG. 17B shows a process 1702 for fabricating the bottom cap wafers 410B using wet etching. In some implementations, wafers 1012 used for this process include an etch stopping layer 1018 for enhanced control of recess depth.

At 1710, a hard mask 912 (e.g., SiOx, SiN, etc.) is patterned on the wafer 1012 to define locations in the (x,y) plane of mating protrusions 1742 and their respective lateral sizes. Then, a soft mask 922 (e.g., a photoresist layer) is spin-coated on the patterned hard mask 912.

At 1720, the soft mask 922 is patterned to define locations in the (x,y) plane of the enclosure-forming recesses 420 and their width WW.

At 1730, the wafer 1012 is subjected to a first wet etch to form the enclosure-forming recesses 420. In other implementations, the first etch used to form the recesses enclosure-forming 420 can be DRIE. The depth of the first wet etch corresponds to the depth $C_h$ of the recesses enclosure-forming 420. Then, the patterned soft mask 922 is removed.

At 1740, the wafer 1012 is subjected to a second wet etch to form the mating protrusions 1742. In other implementations, the second etch used to form the mating protrusions 1742 can be DRIE. The depth of the second wet etch, which may be controlled using the etch stopping layer 1018, corresponds to a height $H_P$ of the mating protrusions 1742. The height $H_P$ of the mating protrusions 1742 is the sum of the depth $C_h$ of the mating recesses 1744 and the thickness T of the circuit wafer 210, $H_P = C_h + T$. Then, the patterned hard mask 912 is removed.

At 1750, an electrically conducting layer 450 is coated on the wafer 1012 over the enclosure-forming recesses 420 and the mating protrusions 1742. Note that the bottom cap wafer 410B formed by using process 1702 has enclosure-forming recesses 420 of width WW and depth $C_h$, has mating protrusions 1742 of height $H_P$, and is coated with an electrically conducting layer 450. Moreover, the enclosure-forming recesses 420 are arranged in accordance with a pattern of the quantum circuit devices 240 supported on the circuit wafer 210B, and the mating protrusions 1742 are arranged in accordance with a predefined bottom cap pattern.

FIG. 17C shows a process 1705 for fabricating the top cap wafers 310A using wet etching. Process 1705 can be based on process 900 described above in connection with FIG. 9. Accordingly, Si wafers 916 can be used for process 1705.

At 1715, a single hard mask 912 (e.g., $SiO_x$, SiN, etc.) is patterned on the Si wafer 916 to define locations in the (x,y) plane of the enclosure-forming recesses 320 and their width WW, and locations in the (x,y) plane of mating recesses 1744 and their respective lateral dimensions. Note that the locations in the (x,y) plane of mating recesses 1744 and their respective lateral dimensions matches the locations in the (x,y) plane of mating protrusions 1742 and their respective lateral dimensions defined at 1710 of process 1702.

At 1725, the Si wafer 916 is subjected to a wet etch to form the enclosure-forming recesses 320 and the mating recesses 1744. In other implementations, the etch used to form the enclosure-forming recesses 320 and the mating recesses 1744 can be DRIE. The depth of the wet etch corresponds to the depth $C_h$ of the enclosure-forming recesses 320 and of the mating recesses 1744. Then, the patterned hard mask 912 is removed.

At 1735, an electrically conducting layer 350 is coated on the Si wafer 916 over the enclosure-forming recesses 320 and the mating recesses 1744. Note that the top cap wafer 310B formed by using process 1705 has enclosure-forming recesses 320 of width WW and depth $C_h$, has mating protrusions 1742 of depth $C_h$, and is coated with an electrically conducting layer 350. Moreover, the enclosure-forming recesses 320 are arranged in accordance with the pattern of the quantum circuit devices 240 supported on the circuit wafer 210B, and the mating recesses 1744 are arranged in accordance with a predefined top cap pattern that matches the bottom cap pattern.

Figure 18:
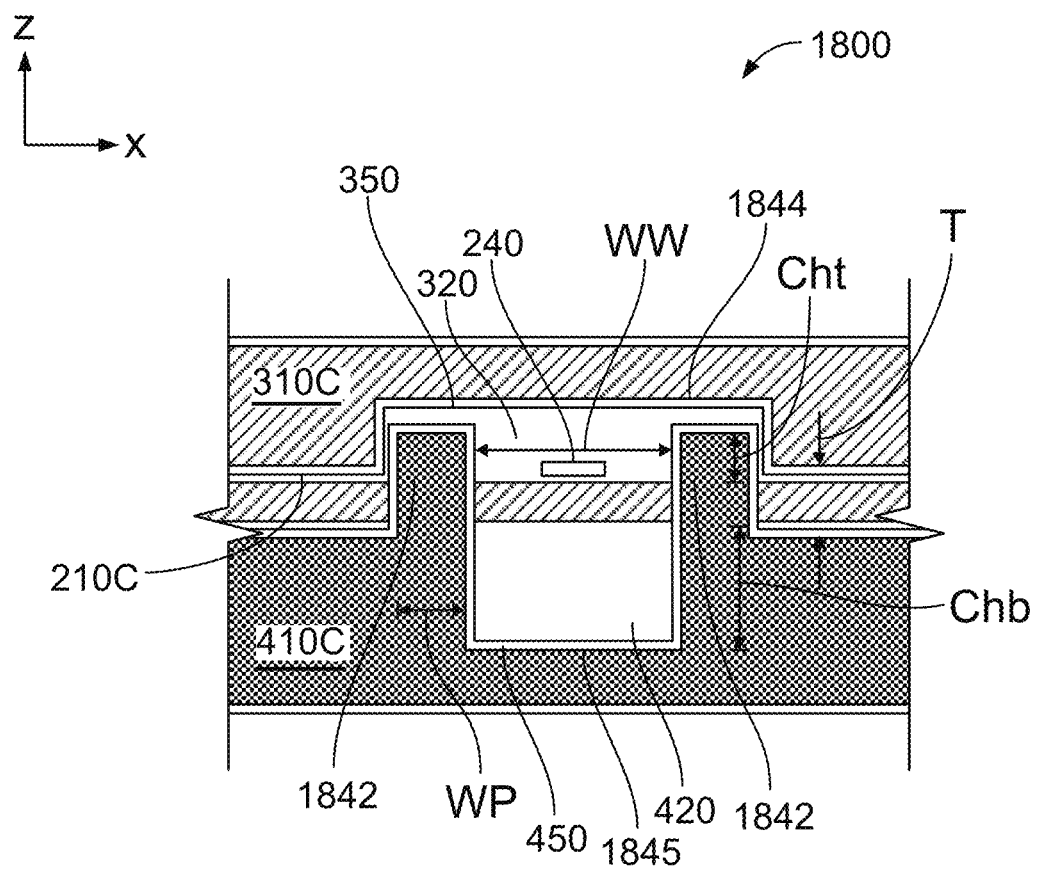
FIG. 18 shows a 2D microwave integrated quantum circuit that includes a circuit wafer and two cap wafers that have mating features that are adjacent to quantum circuit devices thereof.

FIG. 18 is a side view of another example of a 2D microwave integrated quantum circuit 1800 including a circuit wafer 210C, a top cap wafer 310C and a bottom cap wafer 410C that are arranged and similar to the corresponding components of the 2D microwave integrated quantum circuit 400 described above in connection with FIGS. 4A-4B.

However, although the height Cht of recesses 1844 of the top cap wafer 310C is the same as the height of the recesses of the top cap wafer 310, a width of the recesses 1844 is (WW+2WP). Further, bottom cap wafer 410C has a plurality of pairs of mating protrusions 1842, each pair corresponding to a quantum circuit device 240 and defining a recess 1845. Each mating protrusion 1842 has a width WP. Additionally, the recess 1845 has a depth equal to the sum (Cht+T+Chb), where T is the thickness of the circuit wafer 210C and Chb equals the height of the recesses of the bottom cap wafer 410. Here, the recesses 1844 of the top cap wafer 310C and the recesses 1845 of the bottom cap wafer 410C correspond to the quantum circuit device 240 supported on the circuit wafer 210C. Furthermore, the circuit wafer 210C has, in addition to structural and functional characteristics of the circuit wafer 210, a plurality of openings of width WP through which the mating protrusions 1842 penetrate as the circuit wafer rests on the bottom cap wafer 410C. In this manner, the circuit wafer 210C and the bottom cap wafer 410C are secured together in the (x,y) plane. Moreover, the top cap wafer 310C is disposed over the circuit wafer 210C such that the recesses 1844 rest on top of the mating protrusions 1842 of the bottom cap wafer 410C. In this manner, the top cap wafer 310C and the circuit wafer 210C are secured together in the (x,y) plane.

Note that the mating protrusions 1842 and mating recesses 1844 form large contact surface areas to ensure, when compression along the z-axis is maintained on the 2D microwave integrated quantum circuit 1800, reliable DC (e.g., ground) and RF (e.g., signal) connections between at least portions of the electrically conducting layer 350 that coats the top cap wafer 310C and of the electrically conducting layer 450 that coats the bottom cap wafer 410C, without the use of solder bumps, In bumps, In vias, etc. In some implementations, cold welding may occur upon compressing the 2D microwave integrated quantum circuit 1800, for example, between when surfaces of the electrically conducting layers 350, 450 are covered with In.

A main distinction between the cap wafers 310B, 410B of the 2D microwave integrated quantum circuit 1700 the cap wafers 310C, 410C of the 2D microwave integrated quantum circuit 1800 is that the former have mating recesses 1744 and protrusions 1742 that are spaced apart from the enclosure-forming recesses 320, 420, while the latter have mating recesses 1844 and protrusions 1842 that help define the enclosure-forming recesses 320, 420.

The cap wafers 310C, 410C can be fabricated using any of the processes 900, 1000, 1100 and 1150 described above in connection with FIGS. 9, 10, 11A and 11B, respectively.

Figure 19:
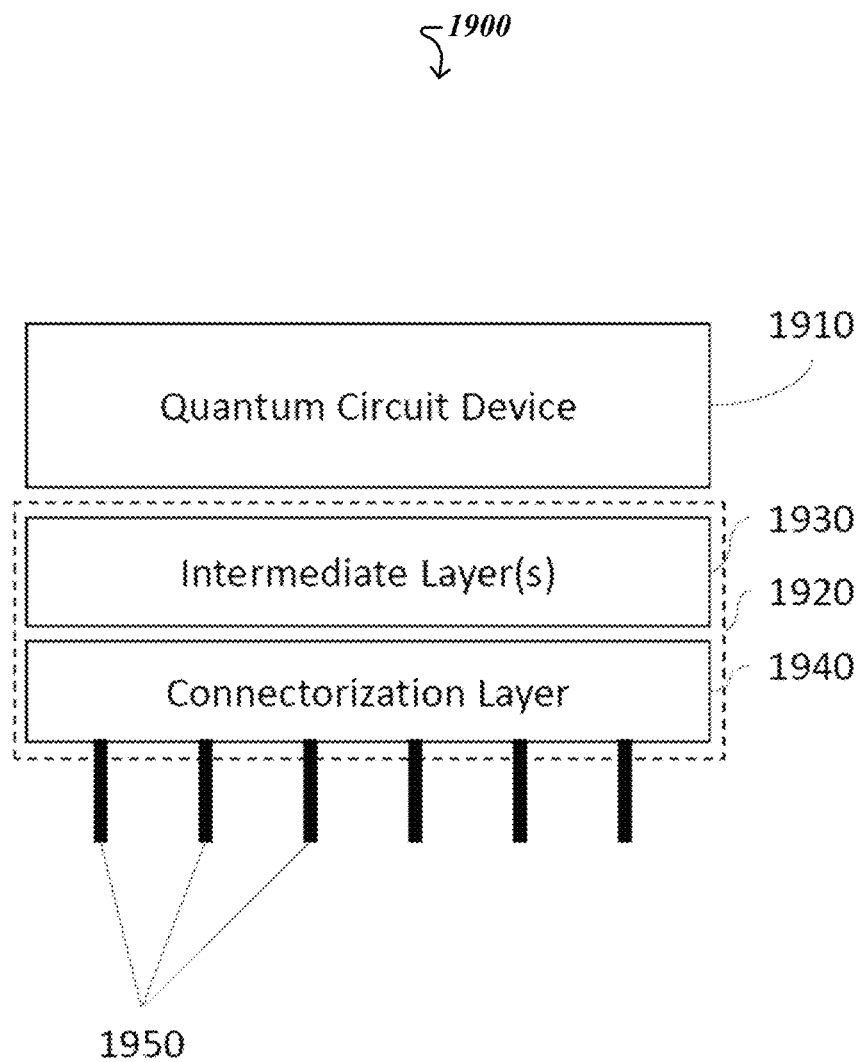
FIG. 19 shows a quantum computing apparatus that includes a quantum computing device and an interposer.

As discussed previously, in general, quantum computing systems 100 can include a signal delivery system 106 to deliver signals between a control system 110 and a quantum processor cell 102. In many implementations, the signal delivery system 106 includes an interposer for electrically routing signal pads on an exterior surface of a circuit wafer 210 to cable connectors. For example, referring to FIG. 19, a quantum computing apparatus 1900 includes a quantum circuit device 1910 attached to an interposer 1920. Interposer 1920 connects quantum circuit device 1910 to a series of cables 1950, which connect the quantum computing apparatus 1900 to a control system (not shown).

Generally, an interposer is a multi-layer device that includes electrical contacts on one surface that are connected to signal lines that fan out, through the layers, to the electrical connectors, e.g., on the opposing side of the interposer. The electrical contacts on the interposer have the same layout as the contact electrodes on the circuit wafer to that, when attached to the circuit wafer, the interposer provides electrical conduction paths from the cable connectors to the quantum circuit device. By fanning the signal lines out, the interposer facilitates connection of conventional cabling (e.g., RF coaxial cables) to the micro circuitry of the quantum computing device. Generally, the interposer includes at least one electrically insulating substrate layer with through holes (e.g., laser drilled or etched, such as DRIE etched) for the signal lines. Common materials for the substrate layer include silicon, BeO, $Al_2O_3$, AlN, quartz, sapphire, and PCB. The signal lines can be formed by coating the via holes with a conductive film (e.g., a normal conductor or superconductor).

Typically, the interposer also includes a conductive film (e.g., a normal conductor or superconductor), often metal (e.g., indium, aluminum, tin), deposited on a surface of the substrate layer. These films can be formed on the substrate layer in a variety of ways, such as by sputtering, evaporation, or electroplating. Typically, the conductive layer is patterned using a conventional patterning technique (e.g., wet etching, dry etching, lift off, laser writing, milling, screen printing, etc.).

In many cases, the interposer includes more than one substrate layers bonded together. For example, the interposer 1920 depicted in FIG. 19 includes intermediate layers 1930 (e.g., one or more layers) and a connectorization layer 1940. Intermediate layers 1930 includes signal lines connecting electrical contacts on the surface of quantum circuit device 1910 facing interposer 1920 with connectorization layer 1940 in addition to circuitry (e.g., integrated circuitry) for performing one or more of a variety of functions, such as amplifying signals, multiplexing or de-multiplexing signals, routing signals, etc.

Connectorization layer 1940 provides mechanical support for the intermediate layers of interposer 1920 and includes connectors for cables 1950, along with signal lines connecting the cable connectors to the signal lines of intermediate layers 1930.

Before turning to exemplary embodiments of interposers, it is noted that a variety of circuit wafer structures may be used to reliably attach the circuit wafer to the interposer. For example, in some embodiments a pattern layer of aluminum can be provided on the lower surface of a circuit wafer for attachment to an interposer. Specifically, referring to FIG. 20A, a quantum computing apparatus 2000 includes a quantum circuit device 2010 and an interposer 2020. The quantum circuit device 2010 includes a circuit wafer 2014, which supports a quantum circuit 2012 on one surface, and a patterned aluminum layer—depicted as portions 2016 and 2018—on the opposing surface. The patterned aluminum layer provides electrical contacts to signal lines (e.g., through vias) in circuit wafer 2014. The patterned aluminum layer can be formed by natively growing a layer of aluminum on the surface of circuit wafer 2014 and then patterning the layer using conventional lithographic techniques. The interposer 2020 may then be bonded to the patterned aluminum layer using conventional bonding techniques, such as wire bonding, ball bonding, etc.

Figure 20A:
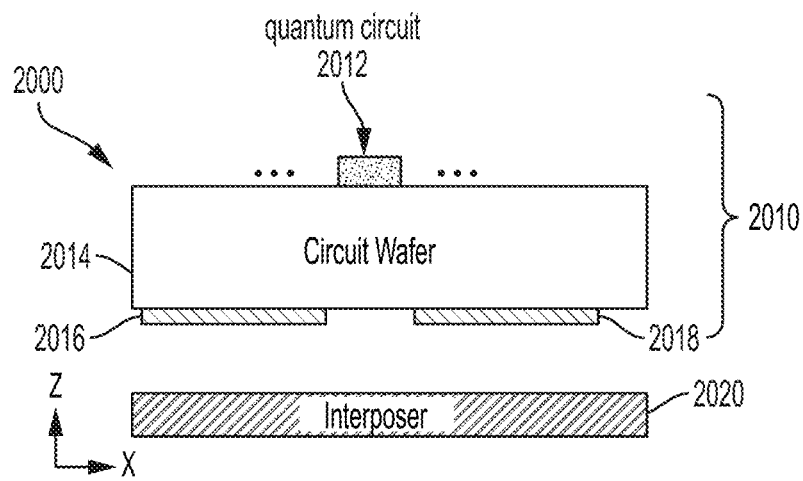
FIGS. 20A and 20B show examples of quantum computing devices with patterned metal layers on their back surfaces for bonding to an interposer.

Of course, while FIG. 20A depicts only a single quantum circuit and a pair of aluminum portions, in general the circuit wafer can support numerous quantum circuits and aluminum portions. Moreover, while quantum circuit device 2010 is depicted with minimal structure, it will be understood that any of the microwave integrated quantum circuits described above can be used.

Figure 20B:
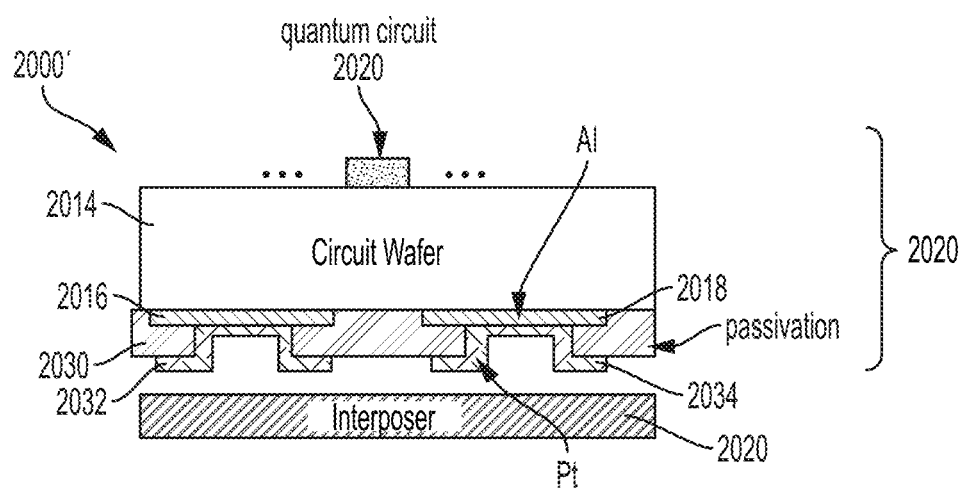

Other circuit wafer structures for interposer attachment may also be used. For example, referring to FIG. 20B, a quantum computing apparatus 2000' includes a quantum circuit device 2010' and interposer 2020. Quantum circuit device 2010' includes quantum circuit 2012, circuit wafer 2014, and portions 2016 and 2018 of a patterned aluminum layer. This surface also includes a passivation layer 2030 and a patterned layer of a solderable metal (e.g., Pt, Au, or Pd) including portions 2032 and 2034. Portion 2032 is registered and in contact with Al portion 2016, providing an electrical contact to signal lines in circuit wafer 2014. Similarly, Portion 2034 is registered and in contact with Al portion 2018, providing another electrical contact.

In general, at least one of the layers of the interposer provides a substrate for supporting other layers and/or connectors. The interposer substrate material can be silicon, sapphire, ceramic, printed circuit board (PCB) or other material that is sufficiently mechanically robust and compatible with the other layers, manufacturing techniques, and operational conditions of the quantum computing apparatus.

In general, interposers suitable for a quantum circuit device should include some (e.g., all) of the following attributes. First, the interposer should be compatible with the operational temperature of the quantum computing device, i.e., cryogenic temperatures, such as liquid helium temperature. The interposer should also be sufficiently robust to endure the same thermal cycling as the quantum computing device (e.g., cycling between room temperature and cryogenic temperatures). Thermal robustness may be achieved by forming the interposer from a material that has a similar (e.g., the same) coefficient of thermal expansion as the circuit wafer (e.g., silicon) so that any expansion or contraction of the circuit wafer is matched by the interposer during thermal cycling.

The interposer materials should also have relatively low microwave loss, specifically at the operational frequencies of the quantum circuit device.

The layers forming the interposer should have relatively flat surfaces in order to facilitate accurate registration of features (e.g., electrical contacts) between different layers and/or to the quantum circuit device. Specifically, surfaces should have sufficiently smooth, planar surfaces so that reliable and robust connections can be made between contact electrodes on opposing surfaces. In some embodiments, surfaces can have a $R_a$ value of 5 μm or less (e.g., 2 μm or less, 1 μm or less, 500 nm or less, 200 nm or less).

Furthermore, the materials forming the interposer should be compatible with the processes used to form and package the quantum circuit device. For instance, materials should be compatible with conventional integrated circuit forming and packaging techniques, including photolithography, deposition of metal and passivation layers, polishing (e.g., chemical mechanical polishing), and etching (e.g., reactive ion etching) techniques.

Example materials for use in the interposer include silicon, sapphire, ceramics (e.g., alumina, aluminum nitride), printed circuit boards (PCB), Kapton, polyimide, and deposited layers such as $SiO_2$ and $Si_3N_4$.

Moreover, in addition to forming the interposer from materials that are compatible with the quantum circuit device, compatible layer bonding techniques should also be used. In general, bonding should provide sufficiently robust attachment between layers to maintain good contact between contact electrodes on adjacent surfaces. Typically, bonding will depend on the materials (e.g., metals) being bonded. In many cases, wafer bonding techniques are applied. For example, in some embodiments, bonding can be achieved using indium bumps or indium balls. The indium can be patterned using lift off or screen printing techniques. Indium bonding can be achieved using force-only, low temperature or high temperature bonding.

In certain embodiments, bonding is achieved using solder bumps or solder balls, e.g., patterned using a screen printing process. Such bonding can also be achieved used high temperature or low temperature bonding. Aluminum bonding at high or low temperature can also be used. Alternatively, or additionally, connection of contact electrodes between adjacent surfaces can be enabled by mechanical connections, such as using pins (e.g., pogo pins), fuzz buttons, and/or with tips covered with diamond nanoparticles.

Wire-bonding can also be used. For example, the interposer substrate layer(s) can include one or more physical holes acting as pass-thrus for wire bonds from the interposer to the back surface of the quantum circuit device. In some embodiments, the chip stack of the quantum circuit device is assembled onto a carrier, e.g., a substrate formed from aluminum, molybdenum, copper, etc. The chip stack can be glued onto the carrier using an adhesive material, such as an epoxy, eccosorb, etc. The carrier can provide pressure relief by use of compressible or spring-like material, such as fuzz buttons, copper wool, brass wool, gold wool, etc. The carrier can be mounted on a PCB using, e.g., alignment pins and registration marks. In some embodiments, a back plate forms an electromagnetic closure on the opposite side of the PCB from the chip stack and carrier. For example, lossy microwave material can be integrated into the assembly formed by the chip stack, carrier, and PCB. In some implementations, oxygen-free high thermal conductivity (OFHC) copper can be used.

In general, the signal lines provide electrical connections for DC signals, RF signals, and/or ground connections. In various embodiments, the interposer is composed of PCB that includes multiple layers of metal (e.g., 3-30 metal layers). The PCB can include thru and blind vias between the metal layers. RF signals may be routed on a particular metal layer of the PCB, and wire bonds for RF signals make connections from that metal layer to the back plane of the chip stack. DC or low frequency signals may be routed on a different metal layer from the RF signals. Wire bonds from the DC/LF metal layer may also form connections from that layer to the back plane of the chip stack.

Figure 21:
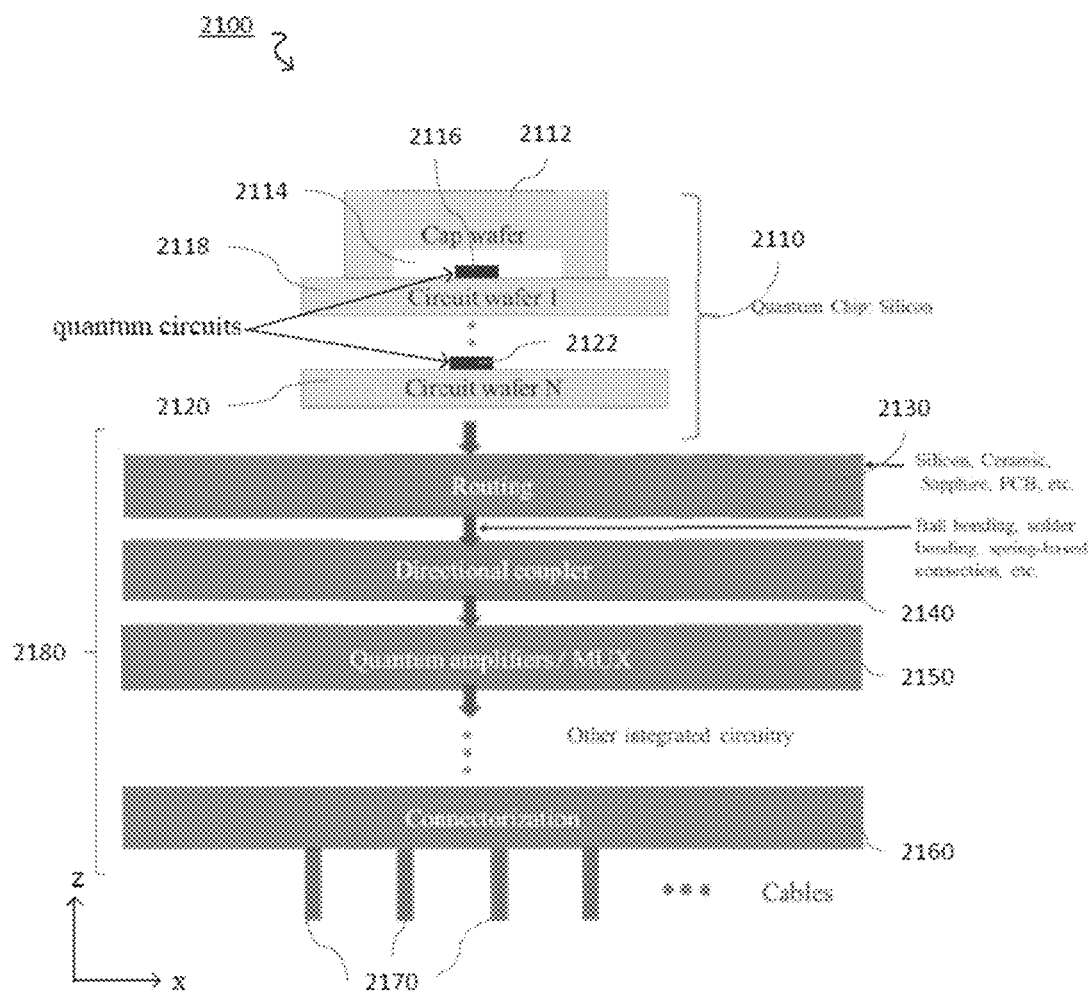
FIG. 21 shows an example of a quantum computing apparatus having a multilayer interposer including various integrated circuit layers and a connectorization layer.

Turning now to specific examples of interposers and referring to FIG. 21, a quantum computing apparatus 2100 includes a quantum circuit device 2110 and a multilayer interposer 2180 for connecting the quantum circuit device to cables 2170. Quantum circuit device 2110 is a 3D device composed of multiple, stacked circuit wafers including a first circuit wafer 2118 and an N-th circuit wafer 2120. Each circuit wafer supports a quantum circuit, including quantum circuit 2116 which is supported by circuit wafer 2118 and quantum circuit 2122 supported by circuit wafer 2120. A cap wafer 2112 encloses quantum circuit 2116 in a cavity 2114. While quantum circuit device 2110 is depicted with minimal structure, it will be understood that any of the microwave quantum integrated circuits described above can be used.

Interposer 2180 is a multi-layer scalable interposer that includes a routing layer 2130, a directional coupling layer 2140, a layer 2150 that includes quantum amplifiers and multiplexers, and a connectorization layer 2160 having connectors for cables 2170. Routing layer 2130, directional coupling layer 2140, and a layer 2150 each include integrated circuits for performing the functions associated with that layer. Additional layers with integrated circuitry may be included between layer 2150 and connectorization layer 2160. Each layer may include its own substrate or may be mechanically supported on a substrate of another layer. Suitable substrate materials include silicon, ceramic, sapphire, and PCB.

The layers of interposer 2180 are bonded together using bonding materials and techniques suitable for the two layers being attached. For example, ball bonding, solder bonding, or spring loaded connections may be used.

Figure 22:
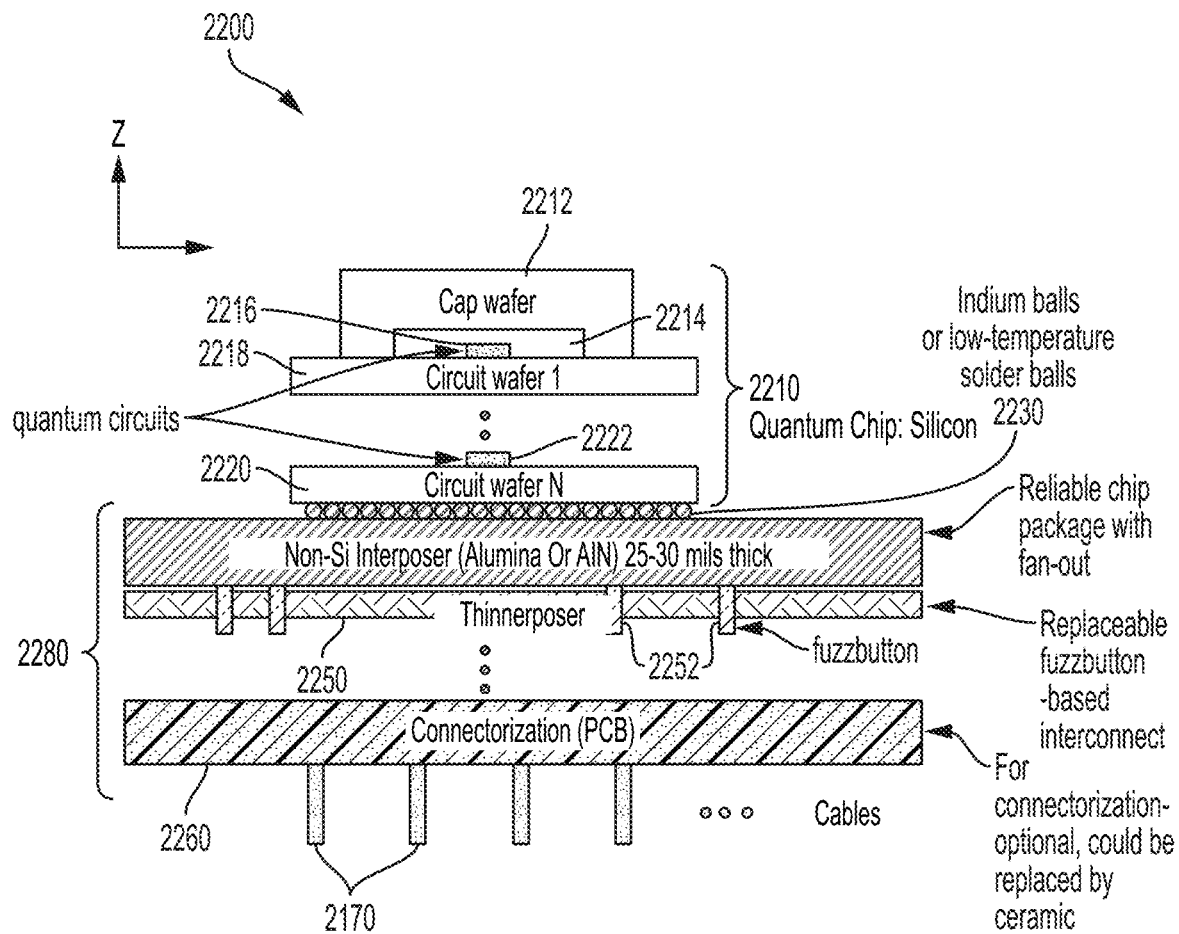
FIG. 22 shows an example of a quantum computing apparatus having an interposer that includes a ceramic layer attached to a circuit wafer by indium bonding.

In some embodiments, the interposer can include one or more ceramic layers (e.g., alumina or AlN). For example, referring to FIG. 22, a quantum computing apparatus 2200 includes a quantum circuit device 2210 and an interposer 2280 including a ceramic layer 2240 for connecting the quantum circuit device to cables 2270.

Quantum circuit device 2210 is a 3D device composed of multiple, stacked circuit wafers including a first circuit wafer 2218 and an N-th circuit wafer 2220. Each circuit wafer supports a quantum circuit, including quantum circuit 2216 which is supported by circuit wafer 2218 and quantum circuit 2222 supported by circuit wafer 2220. A cap wafer 2212 encloses quantum circuit 2216 in a cavity 2214. While quantum circuit device 2210 is depicted with minimal structure, it will be understood that any of the microwave integrated quantum circuits described above can be used.

Certain ceramics have CTE's which are close to the CTE of silicon over temperature ranges spanning from cryogenic temperatures (e.g., liquid Helium temperatures) to room temperature, and are therefore promising candidates for bonding to silicon circuit wafers. For instance, alumina has a CTE of 6-7 ppm/° C. and AlN has a CTW of 4 ppm/° C. while silicon has a CTE of 2.6 ppm/° C. Ceramics such as alumina and AlN have relatively low microwave attenuation. Moreover, ceramic layers can be formed with relatively flat surfaces, e.g., having a $R_a$ of about 1 μm or less.

Ceramic layer 2240 may be in the form of a thick film having a thickness in a range of about 25-30 mils, for instance.

A variety of methods can be used to form ceramic layer 2240. For example, in some implementations, ceramic layer 2240 is formed using a low temperature co-firing process to form a low temperature co-fired ceramic (LTCC) layer. Typically, LTCC technology involves the production of multilayer circuits from ceramic substrate tapes or sheets. Conductive, dielectric, and/or resistive pastes can be applied on each sheet or tape, and then the sheets/tapes are laminated together and fired in one step. The resulting layer is a hermetic, monolithic structure. A typical LTCC structure has multiple dielectric layers, screen-printed or photo-imaged low-loss conductors, and viaholes for interconnecting the multiple layers. Alternatively, thick film processes that involve applying conductive or dielectric pastes on top of a thick ceramic substrate and firing them together can be used. Similar to LTCC, conductors may be screen-printed or photo-imaged to achieve desired feature sizes.

Ceramic layer 2240 is ball-bonded to circuit wafer 2220 using solder balls of, e.g., low temperature indium or other low temperature solder alloys. For example, the layers can be bonded together by placing the balls on the top surface of ceramic layer 2240 and bonding the surface of circuit wafer 2220 to the balls using a low temperature indium or solder bonding process, forming a permanent bond between the circuit wafer and the ceramic layer.

In addition to ceramic layer 2240, interposer 2280 includes a thinnerposer 2250 and connectorization layer 2260, providing connection to cables 2270. Thinnerposer 2250 includes electrically conducting fuzzbutton interconnects 2252 embedded in a dielectric substrate. Thinnerposers offer low signal distortion, robustness, and consistency and are commercially available from Custom Interconnects (Centennial, Colo.).

Figure 23:
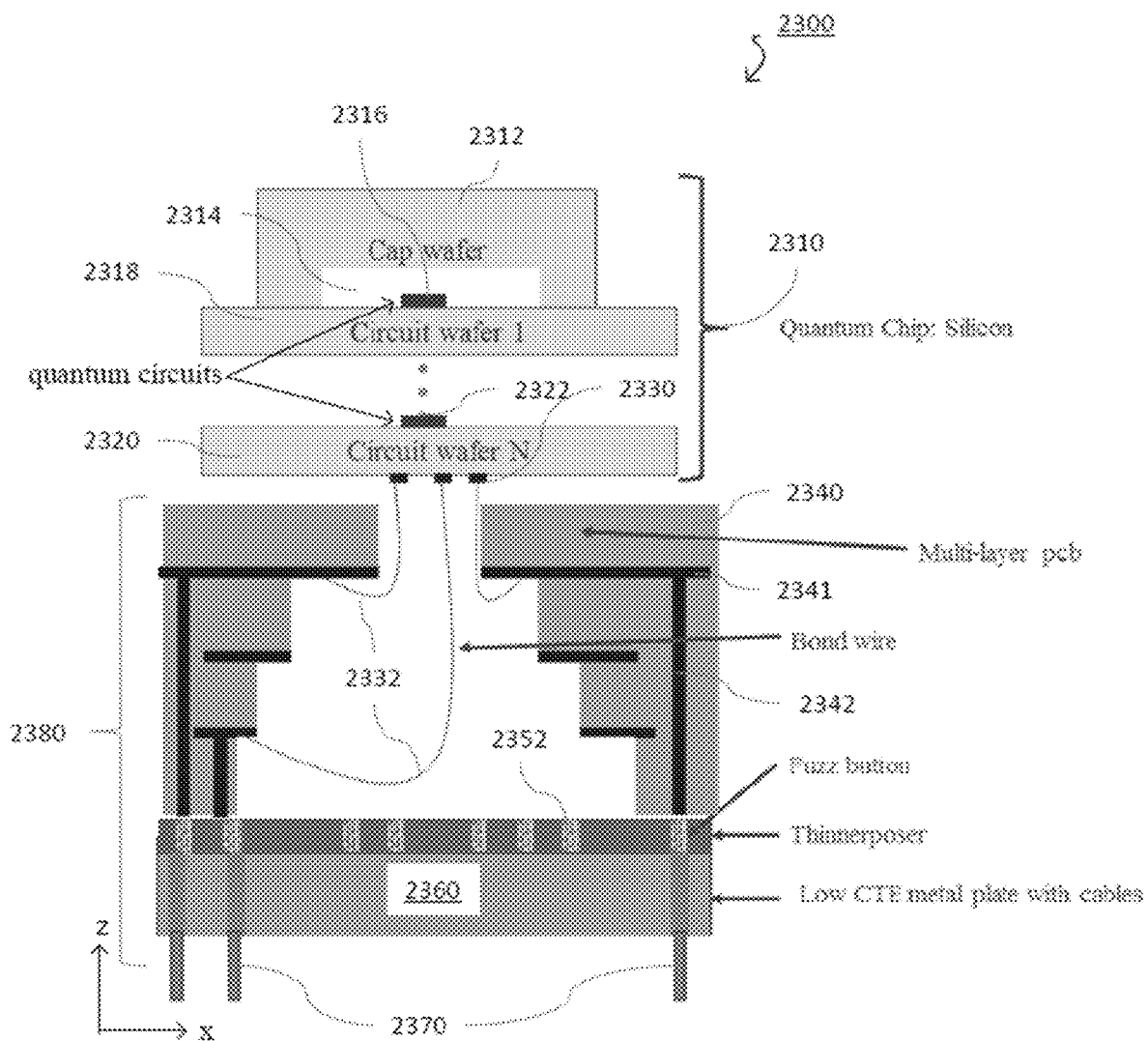
FIG. 23 shows an example of a quantum computing apparatus having a multilayer interposer attached to a circuit wafer by wire bonding.

In some implementations, interposers can use wire bonding to connect to a circuit wafer. For example, referring to FIG. 23, a quantum computing apparatus 2300 includes a quantum circuit device 2310 and an interposer 2380 for connecting, using wire bonds, the quantum circuit device to cables 2370. Quantum circuit device 2310 is a 3D device composed of multiple, stacked circuit wafers including a first circuit wafer 2318 and an N-th circuit wafer 2320. Each circuit wafer supports a quantum circuit, including quantum circuit 2316 which is supported by circuit wafer 2318 and quantum circuit 2322 supported by circuit wafer 2320. A cap wafer 2312 encloses quantum circuit 2316 in a cavity 2314. While quantum circuit device 2310 is depicted with minimal structure, it will be understood that any of the microwave integrated quantum circuits described above can be used.

Interposer 2380 is a multi-layer interposer formed from four PCB layers 2340, a thinnerposer 2350, and a connectorization layer 2360 for connecting the quantum circuit device to cables 2370.

Each PCB layer includes metalized surfaces (e.g., 2341) for bonding and forming signal lines. Vertical metallic interconnects (e.g., via 2342) run through the PCB layers in the z-direction, connecting the signal lines through to the lower surface of PCB layers 2340. Wires 2332 bonded at one end to a conducting metal layer on a PCB layer and to an electrode 2330 on circuit wafer 2320 connect the signal lines to the quantum computing device 2310. Each PCB layer includes an aperture registered with apertures on the other layers and thus providing a through hole for threading the wires and providing access to circuit wafer 2320.

Thinnerposer 2350 includes fuzz buttons registered with electrical contacts on the underside of the PCB layers 2340 on one side, and registered with electrical contacts connected to cables 2370 on the other side.

Figure 24:
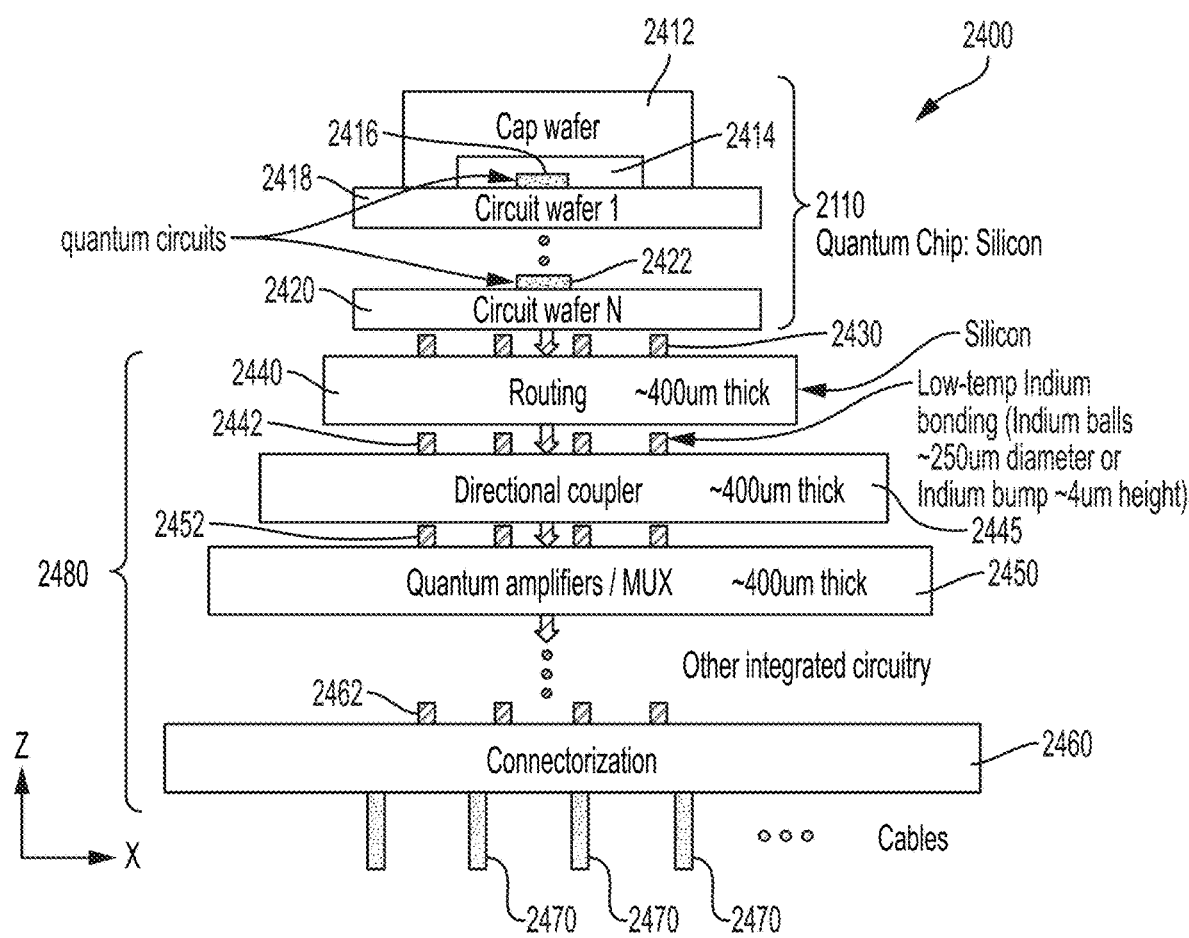
FIG. 24 shows an example of a quantum computing apparatus having a multilayer silicon interposer attached to a circuit wafer by indium bonding.

In some implementations, the interposer can include multiple substrate layers of silicon. For example, referring to FIG. 24, a quantum computing apparatus 2400 includes a quantum circuit device 2410 and an all-silicon interposer 2480 for connecting, using wire bonds, the quantum circuit device to cables 2470. Quantum circuit device 2410 is a 3D device composed of multiple, stacked circuit wafers including a first circuit wafer 2418 and an N-th circuit wafer 2420. Each circuit wafer supports a quantum circuit, including quantum circuit 2416 which is supported by circuit wafer 2418 and quantum circuit 2422 supported by circuit wafer 2420. A cap wafer 2412 encloses quantum circuit 2416 in a cavity 2414. While quantum circuit device 2410 is depicted with minimal structure, it will be understood that any of the microwave integrated quantum circuits described above can be used.

Interposer 2480 includes three stacked silicon layers 2440, 2445, and 2450 and a silicon connectorization layer 2460. Layer 2440 includes routing circuitry, layer 2445 includes directional coupling circuitry, and layer 2450 includes quantum amplification circuitry and multiplexing circuitry. Additional silicon layers can also be included, e.g., between layer 2450 and connectorization layer 2460. The silicon substrates can be fabricated with standard silicon microfabrication techniques, such as silicon DRIE for vias, metal sputtering, photolithography, etc. Generally, metallization can be any non-magnetic metal, preferably superconducting at the operational temperature of quantum computing apparatus 2400.

The silicon layers are bonded together using low temperature wafer bonding using indium bumps or indium balls, discussed above. In order to bond more than two silicon layers using low temperature indium bonding, the bonding may be performed bottom to top, the bottom being connectorization layer 2460, and the top being cap wafer 2412 of quantum circuit device 2510. In order to fan out the signal lines, the area of the layers of interposer 2480 increase as they proceed to connectorization layer 2460. By bonding the largest layers first (i.e., those at the bottom of the structure), the bonding utilizing the largest bonding force occurs earlier in the process. Sequentially bonding subsequent smaller layers uses less bonding force, meaning there is less chance that the structure will be comprised during formation as the number of layers increase. This can improve yields. Other advantages of indium bonding multiple silicon layers for form an interposer include CTE match to the quantum circuit device, low microwave loss of the structure, and planarity of the surfaces.

Figure 25:
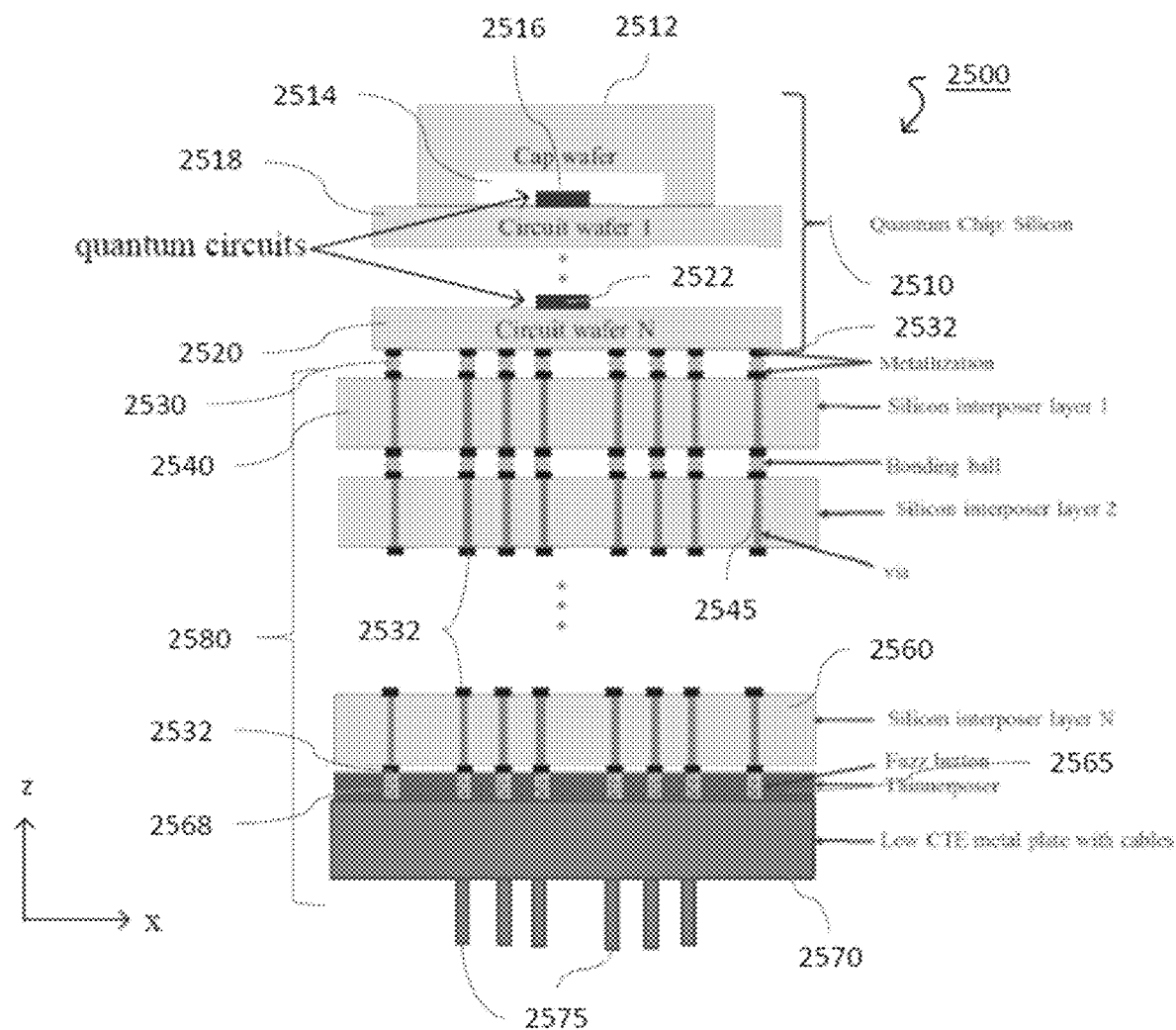
FIG. 25 shows an example of a quantum computing apparatus having a multilayer interposer that includes a thinnerposer.

Alternatively, or additionally, indium bonding can also be used to bond silicon layers in the interposer. For example, referring to FIG. 25, a quantum computing apparatus 2500 includes a quantum circuit device 2510 and an interposer 2580 having silicon layers bonded using indium for connecting the quantum circuit device to cables 2570. Quantum circuit device 2510 is a 3D device composed of multiple, stacked circuit wafers including a first circuit wafer 2518 and an N-th circuit wafer 2520. Each circuit wafer supports a quantum circuit, including quantum circuit 2516 which is supported by circuit wafer 2518 and quantum circuit 2522 supported by circuit wafer 2520. A cap wafer 2512 encloses quantum circuit 2516 in a cavity 2514. While quantum circuit device 2510 is depicted with minimal structure, it will be understood that any of the microwave integrated quantum circuits described above can be used.

Interposer 2580 includes three stacked silicon layers 2540, 2550, and 2560. Additional silicon layers can also be included, e.g., between layers 2550 and 2560. Vias 2545 are also shown for each of silicon layers 2540, 2550, and 2560. These layers are bonded using aluminum bonding. This involves metallization of each surface of silicon layers 2540, 2550, and 2560 with aluminum, patterning the aluminum layer to provide contacts 2532, and bonding the contacts of adjacent layers with bonding balls 2530.

Interposer 2580 also includes a thinnerposer 2565 and a connectorization layer 2570, connected to cables 2575. Thinnerposer 2565 includes fuzz buttons registered with corresponding aluminum contacts on silicon layer 2560 and with cable connectors on connectorization layer 2570.

Figure 26:
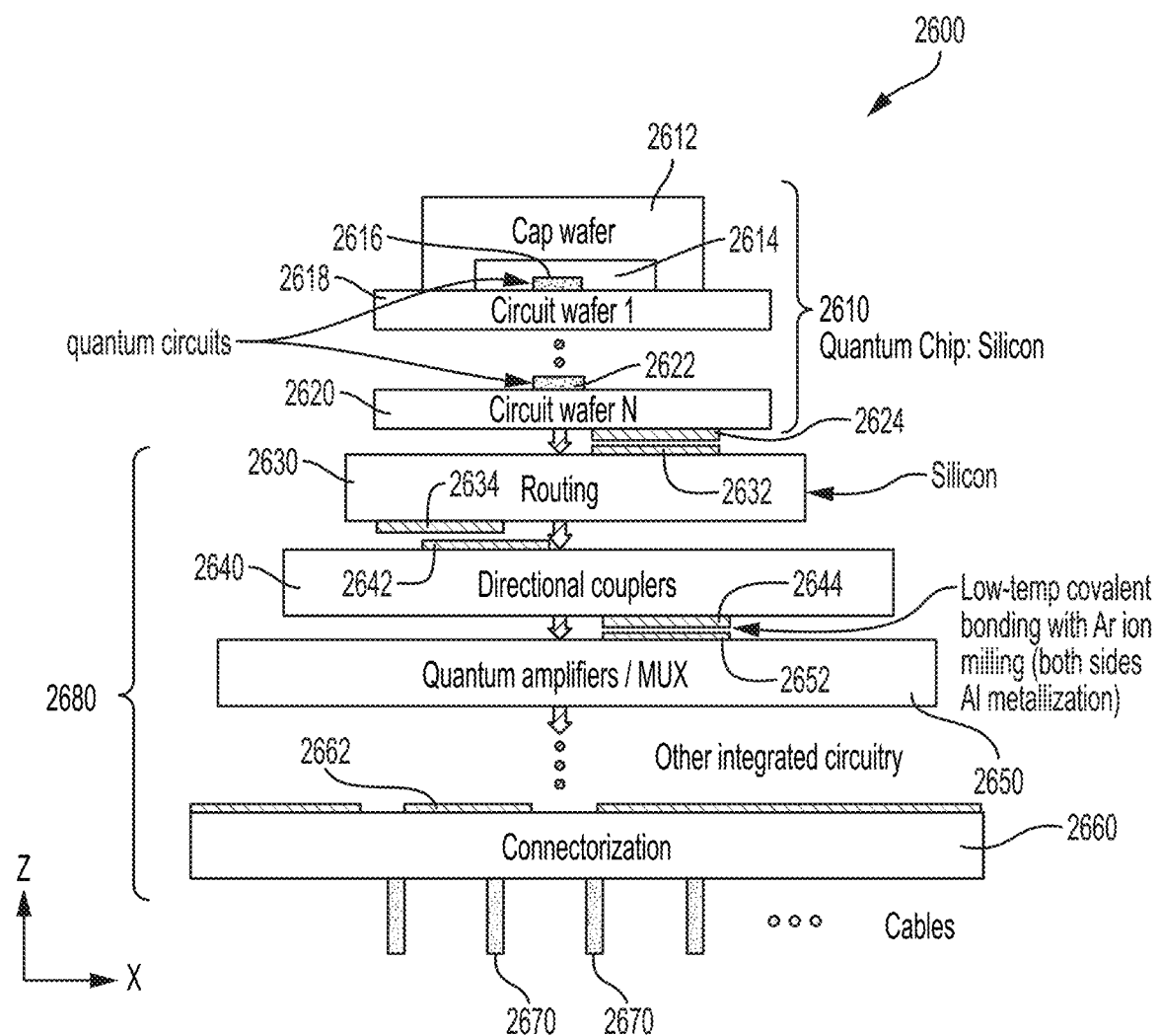
FIG. 26 shows an example of a quantum computing apparatus having a multilayer interposer including silicon layers attached by aluminum bonding.

Aluminum metallization can also be used for bonding silicon layers together. For example, referring to FIG. 26, a quantum computing apparatus 2600 includes a quantum circuit device 2610 and an interposer 2680 for connecting the quantum circuit device to cables 2670. Quantum circuit device 2610 is a 3D device composed of multiple, stacked circuit wafers including a first circuit wafer 2618 and an N-th circuit wafer 2620. Each circuit wafer supports a quantum circuit, including quantum circuit 2616 which is supported by circuit wafer 2618 and quantum circuit 2622 supported by circuit wafer 2620. A cap wafer 2612 encloses quantum circuit 2616 in a cavity 2614. While quantum circuit device 2610 is depicted with minimal structure, it will be understood that any of the microwave integrated quantum circuits described above can be used.

Interposer 2680 includes three stacked silicon layers 2640, 2640, and 2650 and a silicon connectorization layer 2460. Additional silicon layers can also be included, e.g., between layer 2450 and connectorization layer 2460. Layer 2640 includes routing circuitry, layer 2640 includes directional coupling circuitry, and layer 2650 includes quantum amplification circuitry and multiplexing circuitry. Additional silicon layers may be included, e.g., between layer 2650 and connectorization layer 2660, which connects to cables 2670.

Each of the silicon layers includes aluminum metallization on its opposing surfaces, patterned to form electrodes. Aluminum electrodes 2632 on the top surface of layer 2630 are registered and bonded with aluminum electrodes 2624 on the bottom surface of circuit wafer 2620. Aluminum electrodes 2642 on the top surface of layer 2640 are registered and bonded with aluminum electrodes 2634 on the bottom surface of layer 2630. Similarly, aluminum electrodes 2652 on the top surface of layer 2650 are registered and bonded with aluminum electrodes 2644 on the bottom surface of layer 2430. Electrodes 2662 on the top surface of connectorization layer 2660 are also shown. These are registered and bonded with corresponding electrodes on the bottom surface of the adjacent silicon layer. In each case, low temperature covalent bonding with ion milling can be used to ensure robust bonding between the aluminum electrodes.

Figure 27:
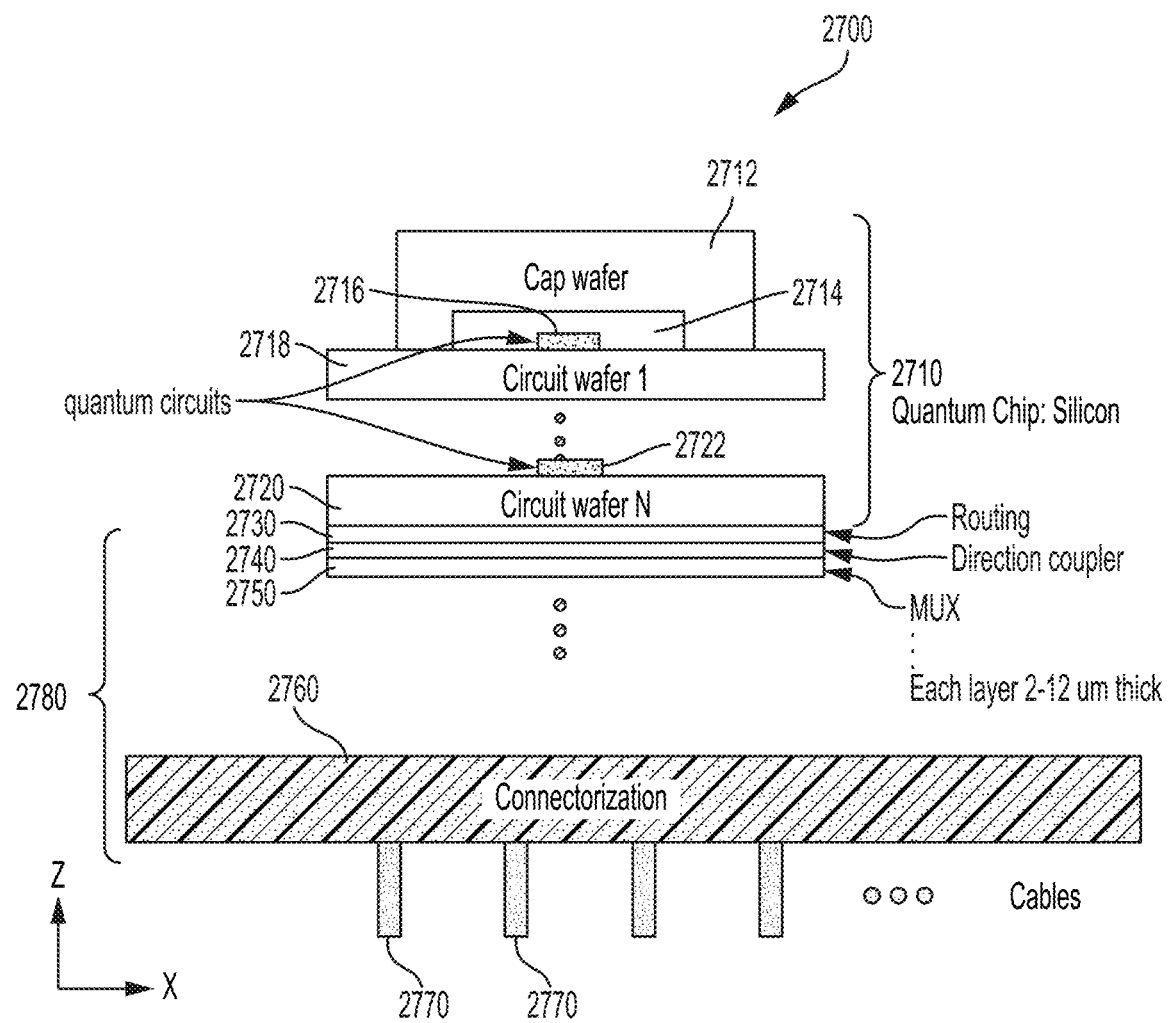
FIG. 27 shows an example of a quantum computing apparatus including integrated circuit layers formed on the back surface of a circuit wafer.

In some embodiments, integrated circuit layers of the interposer can be integrated directly onto a circuit wafer of the quantum computing device. For example, referring to FIG. 27, a quantum computing apparatus 2700 includes a quantum circuit device 2710 and an interposer 2780 for connecting the quantum circuit device to cables 2770. Quantum circuit device 2710 is a 3D device composed of multiple, stacked circuit wafers including a first circuit wafer 2718 and an N-th circuit wafer 2720. Each circuit wafer supports a quantum circuit, including quantum circuit 2716 which is supported by circuit wafer 2718 and quantum circuit 2722 supported by circuit wafer 2720. A cap wafer 2712 encloses quantum circuit 2716 in a cavity 2714. While quantum circuit device 2710 is depicted with minimal structure, it will be understood that any of the microwave integrated quantum circuits described above can be used.

Interposer 2780 includes a routing circuit layer 2730 formed on the surface of the lowest (Nth) circuit wafer 2720. A direction coupling layer 2740 is formed on the routing circuit layer 2730, and a multiplexing circuit layer 2750 is formed on the direction coupling layer 2740. Passivation layers may be provided between circuit wafer 2720 and routing circuit layer 2730, between routing circuit layer 2730 and direction coupling layer 2740, and/or between direction coupling layer 2740 and multiplexing circuit layer 2750. Suitable materials for passivation layers include silicon oxide, which may be deposited, or organic materials like polyimides, which may be spin coated. Such structures may be formed by sequentially depositing, patterning, and planarizing each layer using conventional semiconductor manufacturing methods. In the above description, numerous specific details have been set forth in order to provide a thorough understanding of the disclosed technologies. In other instances, well known structures, interfaces, and processes have not been shown in detail in order to avoid unnecessarily obscuring the disclosed technologies. However, it will be apparent to one of ordinary skill in the art that those specific details disclosed herein need not be used to practice the disclosed technologies and do not represent a limitation on the scope of the disclosed technologies, except as recited in the claims. It is intended that no part of this specification be construed to effect a disavowal of any part of the full scope of the disclosed technologies. Although certain embodiments of the present disclosure have been described, these embodiments likewise are not intended to limit the full scope of the disclosed technologies.

While specific embodiments and applications of the disclosed technologies have been illustrated and described, it is to be understood that the disclosed technologies are not limited to the precise configuration and components disclosed herein. The terms, descriptions and figures used herein are set forth by way of illustration only and are not meant as limitations. Various modifications, changes, and variations which will be apparent to those skilled in the art may be made in the arrangement, operation, and details of the apparatuses, methods and systems of the disclosed technologies disclosed herein without departing from the spirit and scope of the disclosed technologies. By way of non-limiting example, it will be understood that the block diagrams included herein are intended to show a selected subset of the components of each apparatus and system, and each pictured apparatus and system may include other components which are not shown on the drawings. Additionally, those with ordinary skill in the art will recognize that certain steps and functionalities described herein may be omitted or re-ordered without detracting from the scope or performance of the embodiments described herein.

The methods disclosed herein comprise one or more steps or actions for achieving the described method. The method steps and/or actions may be interchanged with one another without departing from the scope of the disclosed technologies. In other words, unless a specific order of steps or actions is required for proper operation of the embodiment, the order and/or use of specific steps and/or actions may be modified without departing from the scope of the disclosed technologies.

What is claimed is:

1. A quantum computing system comprising:
   a first substrate having on a first surface one or more recesses, standoff bumps, an electrically conducting layer that conforms to the one or more recesses and the standoff bumps, and bonding elements coupled with the electrically conducting layer, the bonding elements being disposed outside the one or more recesses;
   a second substrate having a first surface; and
   one or more quantum circuit devices disposed on the first surface of the second substrate;
   wherein the first substrate and the second substrate are bonded such that the one or more recesses form enclosures that respectively house the one or more quantum circuit devices.

2. The quantum computing system of claim 1, wherein each of the one or more quantum circuit devices is one of a qubit, a tunable quantum coupler, a readout circuit including one or more linear resonators or one or more non-linear resonators, a filter, a quantum amplifier, or a circulator.

3. The quantum computing system of claim 1,
   wherein the bonding elements form an electromagnetic contact between the electrically conducting layer and structures of the second substrate that are grounded during operation of the quantum computing system.

4. The quantum computing system of claim 3, wherein the one or more recesses of the first substrate isolate quantum circuit devices from interacting with spurious modes and surface loss to improve coherence times of the quantum circuit devices.

5. The quantum computing system of claim 3, wherein the one or more recesses of the first substrate provide controlled coupling between neighboring quantum circuit devices.

6. The quantum computing system of claim 3, wherein the one or more recesses of the first substrate reduce cross couplings between quantum circuit devices.

7. The quantum computing system of claim 1, wherein the second substrate comprises one of silicon, sapphire, silicon oxide, silicon nitride, quartz, lithographically defined thick photoresists (SU8) or an electrical conducting material that is a superconducting material when the quantum computing system is operated.

8. The quantum computing system of claim 1, wherein the bonding elements form an electromagnetic contact between the bonded first and second substrates through which the one or more quantum circuit devices disposed on the second substrate receive DC signals or MW signals from signal lines of the first substrate.

9. The quantum computing system of claim 1, wherein the bonding elements comprise bumps that include an electrically conducting material that is a superconducting material when the quantum computing system is operated.

10. The quantum computing system of claim 9, wherein the electrically conducting material is selected from the group consisting of indium, aluminum, and palladium.

11. The quantum computing system of claim 9, wherein the bumps are arranged to form channels that allow for gas trapped between the bumps to be pumped out.

12. The quantum computing system of claim 9, further comprising:
bond pads disposed on the first surface of the second substrate opposing the bumps.

13. The quantum computing system of claim 12, wherein the bond pads comprise one of aluminum, indium, or titanium.

14. The quantum computing system of claim 12, wherein the bond pads comprise a cap layer of one of aluminum, indium, or titanium.

15. The quantum computing system of claim 1, wherein the standoff bumps include one of silicon oxide or silicon nitride.

16. The quantum computing system of claim 1, wherein the standoff bumps form a non-hermetic connection between the first and second substrates that allows for gas trapped inside the one or more recesses of the first substrate to be pumped out.

17. A method of fabricating a quantum computing system, the method comprising:
forming standoff bumps on a surface of a substrate;
etching one or more recesses in the surface of the substrate;
forming an electrically conducting layer that conforms to the standoff bumps and the one or more recesses;
forming bonding elements coupled with the electrically conducting layer, the bonding elements being formed outside the one or more recesses;
forming one or more quantum circuit devices on a first surface of a second substrate; and
bonding the substrate and the second substrate such that the one or more recesses form respective enclosures that house the one or more quantum circuit devices.

18. The method of claim 17, wherein the etching of the recesses of the substrate is performed using either Deep Reactive Ion Etch process or a wet etch process with lithographic mask or machining.

19. The method of claim 17, wherein the etching of the recesses of the substrate is performed to at least one specified depth using at least one lithographic mask and at least one etch stop layer.

20. The method of claim 19, wherein the at least one etch stop layer comprises one of Silicon Oxide, Silicon Nitride, or Aluminum oxide.

21. The method of claim 17, wherein one or more of the forming operations are performed using a lithographic mask comprising one of photoresist, silicon oxide, or silicon nitride.

22. The method of claim 17, wherein the forming of the electrically conducting layer is performed by sputtering, e beam evaporation, atomic layer deposition (ALD), Metal Organic Chemical Vapor Deposition (MOCVD) or electroplating.

23. The method of claim 17, wherein the standoff bumps are thermally grown or deposited using one of low-pressure chemical vapor deposition (LPCVD) or plasma-enhanced chemical vapor deposition (PECVD).

24. The method of claim 17, further comprising:
depositing an adhesion layer on the electrically conducting layer,
wherein the bonding elements are formed on the adhesion layer.

25. The method of claim 24, wherein the adhesion layer comprises an electrically conducting material that is a superconducting material when the quantum computing system is operated.

26. The method of claim 25, wherein the electrically conducting material of the adhesion layer comprises one of titanium, or tantalum.

27. The method of claim 24, wherein the adhesion layer is deposited by one of sputtering, evaporation, or electroplating.

28. The method of claim 17, wherein the bonding elements are formed via one of sputtering, evaporation, or electroplating.

29. The method of claim 17, wherein the bonding elements are formed to be longer than the standoff bumps.

30. The method of claim 29, wherein the bonding elements are formed using one of lift-off resist, spray on resist, wet or dry etching.

31. The method of claim 17, wherein the bonding of the substrate and the second substrate is performed by applying pressure on one or both of the substrates to be bonded.

32. The method of claim 31, wherein the standoff bumps form a gap between the substrates to be bonded to control a bonding force.

33. The method of claim 31, wherein a die bonder or a wafer bonder is used to align and bond the substrates to be bonded.

34. The method of claim 31, further comprising:
dispersing nanoparticles over the bonding elements to break the oxide layers from the substrates.

35. The method of claim 34, wherein the nanoparticles comprise diamond.

36. The method of claim 34, wherein the nanoparticles have sharp edges to break oxide layers of the bonding elements.

37. The method of claim 34, wherein the dispersing of the nanoparticles is performed by submersing the bonding elements in a solution containing the nanoparticles.

38. The method of claim 17, wherein the bonding results in a low DC-resistance contact between the bonded substrates.

* * * * *